(12) United States Patent
Nagasawa et al.

(10) Patent No.: US 7,505,310 B2
(45) Date of Patent: Mar. 17, 2009

(54) METHOD OF CONFIGURING SUPERCONDUCTING RANDOM ACCESS MEMORY, DEVICE STRUCTURE OF THE SAME, AND SUPERCONDUCTING DRIVE CIRCUIT

(75) Inventors: Shuuichi Nagasawa, Tokyo (JP); Mutsuo Hidaka, Tokyo (JP); Keiichi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 299 days.

(21) Appl. No.: 11/374,028

(22) Filed: Mar. 14, 2006

(65) Prior Publication Data

US 2006/0255987 A1  Nov. 16, 2006

(30) Foreign Application Priority Data

| Mar. 14, 2005 | (JP) | 2005-070401 |
| Mar. 23, 2005 | (JP) | 2005-082917 |
| Mar. 23, 2005 | (JP) | 2005-082939 |
| Mar. 28, 2005 | (JP) | 2005-090689 |

(51) Int. Cl.
*G11C 11/44* (2006.01)
(52) U.S. Cl. .............. 365/160; 365/63; 365/230.03
(58) Field of Classification Search ........... 365/63, 365/160, 161, 162, 230.03; 505/170
See application file for complete search history.

(56) References Cited

U.S. PATENT DOCUMENTS 3,241,124 A * 3/1966 Newhouse ............ 340/146.2
6,331,805 B1 * 12/2001 Gupta et al. ........... 331/107 S

FOREIGN PATENT DOCUMENTS

| JP | 3-35757 B2 | 5/1991 |
| JP | 5-191253 A | 7/1993 |
| JP | 2000-260187 A | 9/2000 |
| JP | 2004-72141 A | 3/2004 |
| JP | 2005-39244 A | 2/2005 |

OTHER PUBLICATIONS

Suzuki et al. "Characteristics of Driver and Receiver Circuits with a Passive Transmission Line in RSFQ Circuits," Sep. 2000. IEEE Transactions on Applied Superconductivity, vol. 10, No. 3. pp. 1637-1641.*

(Continued)

*Primary Examiner*—Van Thu Nguyen
*Assistant Examiner*—Alexander Sofocleous
(74) *Attorney, Agent, or Firm*—Sughrue Mion, PLLC

(57) ABSTRACT

In a superconducting random access memory according to this invention, drive lines such as a word line and a bit line, and a sense line for accessing a memory cell array are each divided into a plurality of blocks and an in-block signal propagation circuit having a level-logic drive circuit and sense circuit each with high load drive capability is used for signal propagation in each of the blocks. Further, for long-distance signal propagation between the blocks, superconducting passive transmission lines formed by single flux quantum (SFQ) devices and capable of high-speed operation are used. As a result, the high-speed operation as a whole is enabled. It is possible to additionally use splitters or confluence buffers and latch circuits and, further, a binary tree structure may be adopted.

38 Claims, 37 Drawing Sheets

OTHER PUBLICATIONS

Hashimoto et al. "A Design Approach to Passive Interconnects for Single Flux Quantum Logic Circuits," Jun. 2003. IEEE Transactions on Applied Superconductivity, vol. 13, No. 2. pp. 535-538.*

Hashimoto et al. "Design and Investigation of Gate-to-Gate Passive Interconnects for SFQ Logic Circuits," Sep. 2005. IEEE Transactions on Applied Superconductivity, vol. 15, No. 3. pp. 3814-3820.*

"Ultra-High Speed Josephson Device", p. 38, published by Baifukan.

S. M. Faris, et al.: "Basic Design of a Josephson Technology Cache Memory"; IBM J. Res Develop., vol. 24, No. 2, pp. 143-154, Mar. 1980.

S. Nagasawa, et al.: "570-ps 13-mW Josephson 1-kbit NDRO RAM"; IEEE Journal of Solid-State Circuits, vol. 24, No. 5, pp. 1363-1371, Oct. 1989.

S. Nagasawa, et al.: "A 380 ps, 9.5 mW Josephson 4-Kbit RAM Operated at a High Bit Yield"; IEEE Transactions on Applied Superconductivity, vol. 5, No. 2, pp. 2447-2452, Jun. 1995.

D. Zinoviev, et al.: "Passive Interconnects: a Revolutionary Approach to RSFQ System Design"; Extended Abstracts of ISEC '01, pp. 175-176.

K. K. Likharev, et al.: "RSFQ Logic/Memory Family: A New Josephson-Junction Technology for Sub-Terahertz-Clock-Frequency Digital Systems"; IEEE Transactions on Applied Superconductivity, vol. 1, No. 1, p. 7, Mar. 1991.

S. V. Polonsky, et al.: "New RSFQ Circuits"; IEEE Transactions on Applied Superconductivity, vol. 3, No. 1, pp. 2566-2577, Mar. 1993.

* cited by examiner

Prior Art

Prior Art

METHOD OF CONFIGURING SUPERCONDUCTING RANDOM ACCESS MEMORY, DEVICE STRUCTURE OF THE SAME, AND SUPERCONDUCTING DRIVE CIRCUIT

This application claims priority to prior Japanese patent applications JP 2005-70401, JP 2005-82917, JP 2005-82939, and JP 2005-90689, the disclosures of which are incorporated herein by references.

TECHNICAL FIELD

This invention relates to a random access memory (hereinafter abbreviated as an "RAM") for use in a superconducting integrated circuit that operates at very low temperature. In particular, this invention relates to a method of configuring a superconducting RAM using single flux quantum (SFQ) devices that are operable at ultra-low power consumption and at ultra-high speed, and further relates to a device structure thereof.

BACKGROUND ART

Superconducting integrated circuits are roughly classified into two types. One type utilizes strong nonlinearity that appears in the current-voltage characteristic of a Josephson junction and is called a voltage-type logic. The voltage-type logic is the same in logic form as a logic used in semiconductor integrated circuits. The other type utilizes nonlinearity of the current-phase characteristic in a Josephson junction and is called a fluxoid logic.

The voltage-type logic superconducting integrated circuit is a circuit having a feature to output a predetermined voltage (normally, state "0" is set to a zero voltage level and state "1" to a desired output voltage level) for a fixed time (e.g. during a clock period) and carries out logical operation according to the voltage level. An operation signal of the voltage-type logic superconducting integrated circuit is also called a level signal because it takes a constant value during the operation period (clock period) of the circuit. Normally, in the voltage-type logic superconducting integrated circuit, Josephson junctions in an underdamped state with a McCumber coefficient of "50" or more are biased by alternating current so as to be used.

The McCumber coefficient is a constant showing the characteristic of a Josephson junction and is given by "$2\pi I_0 C R_D^2/\Phi_0$", where "$I_0$" represents a critical current value of the Josephson junction, "C" a capacitance, "$R_D$" a resistance value, and "$\Phi_0$" a single flux quantum (SFQ) (Non-Patent Document 1: "Ultra-High Speed Josephson Device", p. 38, published by Baifukan). The Josephson junction with the McCumber coefficient of "50" or more is, once switching to the voltage state, does not return to the superconducting state unless the power supply current (bias current) is set to zero, and hence is used with an AC power supply. In terms of such a characteristic, the voltage-type logic Josephson junction is also sometimes called a latching device.

On the other hand, the fluxoid logic superconducting integrated circuit is a circuit having a feature to output pulses caused by flux quantum and, particularly, a circuit using a single flux quantum (SFQ) as an information carrier is called an SFQ circuit. The SFQ circuit is a circuit that carries out logical operation according to propagation of single flux quantum (SFQ) pulses and the quantum state of the circuit, and its logic is also called a pulse logic because operation signals of the SFQ circuit are in the form of SFQ pulses.

Normally, in the SFQ circuit, Josephson junctions in an overdamped state with a McCumber coefficient of approximately "1" are biased by direct current so as to be used. Such an SFQ circuit has a merit that it operates with a DC power supply and is operable at ultra-low power consumption and at ultra-high speed.

The Josephson junction largely changes in operation characteristic according to a value of the McCumber coefficient. The Josephson junction with the McCumber coefficient of approximately "1" used in the SFQ circuit is characterized in that when the Josephson junction switches by an input of one SFQ pulse, it produces one SFQ pulse and automatically returns to the superconducting state. Therefore, it can be operated by the use of the DC power supply. On the other hand, the Josephson junction (latching device) with the McCumber coefficient of "50" or more used in the voltage-type logic circuit is characterized in that it maintains a constant voltage level (this is the state where SFQ pulses are continuously produced) once switching to the voltage state and does not return to the superconducting state unless the power supply current is set to zero. Note that the McCumber coefficient depends on several junction parameters in an actual Josephson junction. Although the McCumber coefficient is as large as approximately several hundreds to several tens of thousands in a Nb/AlO$_x$/Nb junction with a critical current density of approximately 2.5 kA/cm$^2$ to 10 kA/cm$^2$, the Josephson junction with the McCumber coefficient of "1" or that of "50" or more can be easily realized by connecting a resistance of a required value in parallel to the Josephson junction.

A superconducting RAM is, like a semiconductor RAM, formed by decoder circuits, drive circuits, sense circuits, and a memory cell array. The memory cell array is in the form of memory cells arranged in a two-dimensional matrix array shape. In the RAM, information is written into a memory cell designated by an address signal such that two decoder circuits for lateral and vertical directions select a row and a column of the matrix array based on the address signal and, in response thereto, a drive circuit propagates a data signal (information) to the memory cell array. Likewise, a sense circuit reads a data signal (information) stored in a memory cell selected by a signal indicative of a row and a column of the matrix array corresponding to an address.

The conventional superconducting RAM structure has a problem that when the scale (storage capacity) of an RAM increases, a matrix array of memory cells also increases in scale and hence the number of memory cells driven by one drive circuit or sense circuit (the number of memory cells in one row or column) increases, leading to an increase in operating time.

In order to solve this problem, for example, Japanese Unexamined Patent Publication (JP-A) No. 2000-260187 (Patent Document 1) proposes a method of dividing a RAM into small blocks.

This proposal will be described with reference to FIGS. 31 and 32.

FIG. 31 shows one example of a block configuration diagram of a conventional superconducting RAM (random access memory) proposed in Patent Document 1. FIG. 32 shows one example of a 256-RAM block 51.

The superconducting RAM shown in FIG. 31 is one example of a 16 kbit RAM structure formed by 64 256-RAM blocks 51. The illustrated superconducting RAM comprises the 256-RAM blocks 51, block decoder circuits 52, block sense circuits 53, voltage-type logic drive circuits (alternating current bias) 54 that carry out signal propagation between the blocks, impedance matching lines 55 that connect the foregoing respective circuits, and LC resonant circuits 56 that supply high-frequency alternating current (AC).

Each 256-RAM block 51 comprises a 16-row 16-column memory cell array, a voltage-type logic drive circuit 61 and sense circuit 62 each formed by superconducting latching devices biased by alternating current, and a decoder circuit 63 formed by superconducting single flux quantum (SFQ) devices biased by direct current.

In this circuit, in order to enable 10 GHz clock operation, the capacity of the memory cell array driven by the single voltage-type logic drive circuit 61 is limited to 16-row 16-column 256 bits. Therefore, the multidrive system is employed which transfers in parallel signals to many RAM blocks. In this manner, in the conventional superconducting random access memory, the RAM is divided into the small RAM blocks each being the 256-RAM block, thereby limiting the capacity of the memory cell array driven by each drive circuit to enable the high-speed operation. Further, the voltage-type logic drive circuits adapted to operate with an AC power supply and the impedance matching lines are used for the signal propagation between the blocks, thereby enabling the high-speed operation of the RAM as a whole.

In a random access memory, a specific memory cell is selected according to a consistency logic of signals from two directions, i.e. a row direction (lateral) and a column direction (vertical) of a matrix array, and information is written into or read from the selected memory cell. In order to perform this consistency logic in a two-dimensional matrix array of memory cells, it is desirable that the output of a drive circuit for driving the memory cell array be a level-logic signal (rectangular wave signal). It is difficult to achieve the two-direction consistency logic with SFQ pulses having a pulse width of several picoseconds or less.

Accordingly, in a conventional superconducting RAM, a drive circuit formed by voltage logic type (level logic type) latching devices is used (e.g. Patent Document 2: Japanese Unexamined Patent Publication (JP-A) No. H05-191253). However, since the voltage logic type latching device should be operated by an AC power supply, there is a large problem in terms of the power consumption and high-speed operation. In view of this, several proposals have been made for superconducting drive circuits adapted to operate with a DC power supply and, as a typical one among them, there is a circuit as shown in FIG. 33 (Non-Patent Document 2: IBM J. RES. DEVELOP., vol. 24, no. 2, pp. 143-154, March 1980).

In FIG. 33, this circuit comprises a drive gate (G1), a reset gate (G2), superconducting striplines (SL1) and (SL2), damping resistances ($R_{d1}$) and ($R_{d2}$), and a bias resistance ($R_{b1}$). The drive gate (G1) and the damping resistance ($R_{d1}$) are connected between a signal output end (D) and a bias current output end (E). The reset gate (G2) and the damping resistance ($R_{d2}$) are connected between a connection end (F) and a connection end (G). The superconducting stripline (SL1) is connected between the signal output end (D) and the connection end (F), and the superconducting stripline (SL2) is connected between the bias current output end (E) and the connection end (G). The bias current output end (E) is grounded and supplied with a DC bias current of a predetermined value through the bias resistance ($R_{b1}$) connected to a bias current input end (A). The superconducting stripline (SL1), the reset gate (G2), and the superconducting stripline (SL2) constitute a loop circuit that serves as a driven line.

The drive gate (G1) and the reset gate (G2) are gates each having a function of switching to the voltage state when an input signal (rectangular wave signal) of a predetermined value is input, and each formed by a magnetic field coupling quantum interference device having a superconducting loop including two Josephson junctions and a control wire disposed so as to magnetically coupled to the superconducting loop (Non-Patent Document 3: IBM J. RES. DEVELOP., FIG. 2, vol. 24, no. 2, pp. 143-154, March 1980).

FIG. 34 shows operation waveforms of the foregoing conventional superconducting drive circuit. Referring to FIG. 34, the operation of this conventional drive circuit will be described.

In FIG. 34, the axis of ordinates represents a current value, while the axis of abscissas represents a time. The waveform indicated by a thick solid line is an output current ($W_C$) that flows in the superconducting stripline (SL1), while the rectangular waveforms indicated by broken lines are a data signal ($W_A$) and a reset signal ($W_B$).

At first, the bias current supplied through the bias resistance ($R_{b1}$) is flowing to ground through the drive gate (G1) in the superconducting state. In this state, when the rectangular-wave data signal ($W_A$) is input into the drive gate (G1), the drive gate (G1) switches to the voltage state and causes the bias current flowing to the drive gate (G1) to be injected into the superconducting stripline (SL1). Therefore, the output current ($W_C$) flowing in the superconducting stripline (SL1) starts to increase and, after the lapse of a fixed time, reaches a predetermined current value. In this event, the drive gate (G1) returns to the superconducting state when the bias current is injected into the superconducting stripline and further the input signal drops to zero, but the constant output current continues to flow in the superconducting stripline. Then, when the rectangular-wave reset signal ($W_B$) is input into the reset gate (G2), the reset gate (G2) switches to the voltage state and hence the output current flowing in the superconducting stripline starts to decrease and reaches zero after the lapse of a fixed time. In this event, the bias current flows through the drive gate (G1), thereby returning to the initial state.

Through the foregoing operation, it is possible to realize the superconducting drive circuit operable with the DC power supply, which can deliver the output current to the superconducting stripline being the driven line when the data signal is input, while, can cause the output current to be zero by the reset signal.

On the other hand, a circuit for reading information "1" or "0" stored in a memory cell selected from a two-dimensional matrix array of memory cells is a sense circuit.

Conventionally, there have been proposed roughly two types of such sense circuits. One is a sense circuit formed by voltage logic type (level logic type) latching devices, which is disclosed, for example, in Japanese Patent Publication No. H03-35757 (Patent Document 3). However, since the voltage logic type latching device should be operated by an AC power supply, there is a large problem in terms of the power consumption and high-speed operation.

The other is a sense circuit adapted to operate with a DC power supply and there is, for example, a sense-bus superconducting sense circuit reported in Non-Patent Document 4 (IBM J. RES. DEVELOP., vol. 24, no. 2, pp. 143-154, March 1980).

Next, the conventional technique will be described with reference to FIGS. 35 and 36.

FIG. 35 is an equivalent circuit diagram of the conventional DC power supply driven superconducting sense circuit. The circuit comprises sense lines (hereinafter referred to as "S lines") $71_{-x}$ being part of a memory cell array, gates (GB) $72_{-x}$ including Josephson junctions and disposed so as to be magnetically coupled to the S lines $71_{-x}$, respectively, and a sense bus loop 73 connecting in series the gates (GB) $72_{-x}$.

FIG. 36 is a schematic diagram of operation waveforms in this conventional sense-bus superconducting sense circuit. In FIG. 36, the axis of ordinates represents a current value, while the axis of abscissas represents a time. FIG. 36 shows, from top to bottom, a waveform of a current $I_{SB}$ that flows in the sense bus loop 73, a waveform of a current $I_S$ that flows in the S line $71_{-X}$, a waveform of a current ($I_i$) that flows in an inductance ($L_i$) of the gate GB $72_{-X}$, and a waveform of a current ($I_D$) that flows in a control wire of an output gate ($G_C$) 74.

Based on these operation waveforms, the operation of the conventional circuit will be described.

At first, the operation of this circuit will be briefly explained. When a selected memory cell of the memory cell array holds data "1", a sense gate of the selected memory cell in the S line $71_{-X}$ switches to the voltage state by a read operation of the memory cell array, so that the current $I_S$ flowing in the S line $71_{-X}$ drops to zero. This causes the current $I_i$ to temporarily flow in the gate $G_B$ $71_{-X}$ magnetically coupled to the S line $71_{-X}$. As a result, the gate $G_B$ $72_{-X}$ switches to the voltage state to drop the current $I_{SB}$ flowing in the sense bus loop 73 to zero. This results in that the current of the sense bus loop 73 flows through the control wire of the output gate $G_C$ 74 and a gate $G_A$ 75 and hence the output gate $G_C$ 74 switches to the voltage state to output information "1".

As described above, this sense circuit is a circuit adapted to detect the fall of the current $I_S$ in the S line (sense line) $71_{-X}$. However, although the current $I_S$ in the S line $71_{-X}$ does not drop by a read operation of the memory cell array when information of a memory cell is "0", it is necessary to drop a waveform of the current $I_S$ as indicated by a dotted line in the figure at the end of an operation period (clock). Also in this event, the gate $G_B$ $71_{-X}$ is temporarily set to the voltage state so that the current is input into the control wire of the output gate $G_C$ 74. However, in this event, it is necessary that a bias current for the output gate $G_C$ 74 be prevented from flowing.

Through the foregoing operation, it is possible to realize the superconducting sense circuit operable with the DC power supply, which can read information of a selected memory cell of the memory cell array.

On the other hand, as a device structure of a conventional superconducting RAM, the device structure is reported which is composed of two or three superconducting layers formed on a superconducting ground layer and one resistance layer (Non-Patent Document 5: IEEE Journal of Solid-State Circuits, vol. 24, no. 5, pp. 1363-1371, 1989; Non-Patent Document 6: IEEE Trans. Applied Superconductivity, vol. 5, no. 2, pp. 2447-2452, 1995).

FIG. 37 is a schematic sectional view of a conventional device structure of this type. This device structure comprises an Nb superconducting ground layer (M1) formed on an oxidized silicon substrate, two Nb superconducting wiring layers (M2 and M3), an Mo resistor layer (RES1), an Nb/AlO$_X$/Nb Josephson junction portion (JJ), and an SiO$_2$ interlayer insulating layer. The lower Nb layer (M2) under the Nb/AlO$_X$/Nb Josephson junction portion is used as a wiring layer.

A device structure of a superconducting RAM is characterized by its memory cell structure. Various memory cell circuits have hitherto been proposed, but basically, it comprises a superconducting loop adapted to store a single flux quantum and a Josephson junction or a gate formed by a Josephson junction which is used for introducing/removing a flux quantum into/from the superconducting loop, and further comprises at least one control wire for controlling introduction/removal of a flux quantum through the Josephson junction. Normally, this control wire is disposed so as to be magnetically coupled to the superconducting loop or the gate formed by the Josephson junction.

According to the foregoing conventional device structure, it is possible to configure a superconducting loop including a Josephson junction, serving as a basic device of a memory cell, and a control wire disposed so as to be magnetically coupled to the superconducting loop. Actually, using this device structure, there has been developed a 4 kbit superconducting RAM (see the foregoing Non-Patent Document 6).

On the other hand, following the increase in RAM capacity, in the normal structure, the number of elements in each of a decoder circuit, a drive circuit, and a sense circuit only increases in proportion to the square root of the capacity of memory cells.

However, the conventional superconducting RAM is divided into the small blocks each having the complete RAM structure including the decoder circuit, the drive circuit, the sense circuit, and the memory cell array. Since the number of blocks increases in direct proportion to the increase in RAM capacity, the numbers of decoder circuits, drive circuits, and sense circuits also increase in direct proportion thereto. Therefore, there has been a problem that the layout area and the power consumption increase in direct proportion to the increase in memory capacity.

Further, in the conventional superconducting RAM, there has been a large problem that since the drive circuit and the sense circuit are formed by the voltage logic type latching devices adapted to operate with the AC power supply, the high-frequency AC power supply is required and hence the power consumption further increases.

In addition, there has been a problem that the conventional superconducting drive circuit requires rectangular-wave signals (level signals) as a data signal and a reset signal and does not operate with single flux quantum (SFQ) pulses. In the conventional sense-bus superconducting sense circuit operable with the DC power supply, it is necessary to detect the fall of a signal in the sense line and, further, it is necessary to adjust switching of the current to the output gate at the proper timing with the clock signal. Therefore, there has been a problem that since the operation margin of the circuit is narrow and further it is necessary to set the sufficient timing margin, it is difficult to operate the circuit at high speed.

Further, following the increase in capacity of the superconducting RAM, it is necessary to carry out signal propagation among many memory cell arrays at high speed. However, in the conventional device structure, since the number of superconducting wiring layers is three or less, a special wiring layer cannot be provided for this signal propagation and hence the speed-up of signal propagation is impeded. Further, when seeking the speed-up of signal propagation with such limited layers, the number of wires arranged two-dimensionally increases and, in this case, the integration scale of the device is lowered.

Further, since one superconducting wiring layer is used for two purposes, i.e. power supply and signal propagation, there has also been a problem that the influence of a magnetic field due to the power supply current tends to occur and hence the operation margin of the circuit is reduced. In addition, there has also been a problem that when the inductance is formed in the power supply line, the layout area increases.

Further, since, in general, the Nb/AlO$_X$/Nb junction is subjected to deterioration in characteristic at a temperature of 200° C. or more, a higher-temperature process cannot be employed in device fabrication. For example, the SiO$_2$ interlayer insulating layer should be formed by sputtering being a low-temperature process when it is formed after forming the Josephson junction. In this case, there are instances where covering of a stepped portion by the $SiO_2$ film is not sufficient so that excellent insulating properties cannot be obtained.

SUMMARY OF THE INVENTION

It is a first object of this invention to provide the structure of a superconducting RAM that is operable at ultra-high speed even when the capacity is large, and further is operable by the use of a DC power supply with small power consumption.

It is a second object of this invention to provide a superconducting drive circuit operable with a DC power supply, which is adapted to operate by input of single flux quantum (SFQ) pulses as a data signal and a reset signal, thereby outputting a predetermined level signal, and further provide a drive method thereof.

It is a third object of this invention to provide a superconducting sense circuit operable with a DC power supply, which requires no complicated timing sequence, has a large bias-current operation margin, and can obtain a single flux quantum (SFQ) pulse output.

It is a fourth object of this invention to provide a device structure of an ultra-high speed, large-capacity, superconducting random access memory that enables miniaturization of memory cells, can efficiently form an inductance in a DC bias current supply line, and further, is not affected by the influence of a magnetic field caused by a bias current.

In order to accomplish the foregoing objects, a superconducting RAM according to this invention has the following features.

Firstly, the structure of a word line or a bit line adapted to drive a memory cell array is divided into a plurality of blocks. Each block of the word line or the bit line includes a superconducting drive circuit having a level logic with high drive capability and used for signal propagation in the block (in-block signal propagation) that directly drives a memory cell, and a superconducting passive transmission line (hereinafter abbreviated as a "PTL") capable of high-speed signal propagation using a single flux quantum (SFQ) and disposed for signal propagation between the plurality of blocks (interblock signal propagation).

The signal propagation between the plurality of blocks may be configured such that the superconducting PTLs are connected in series through a splitter (S) formed by a single flux quantum (SFQ) device. Alternatively, the signal propagation between the plurality of blocks may be configured such that the superconducting PTLs are arranged in a binary tree structure through a splitter (S) formed by a single flux quantum (SFQ) device.

Alternatively, the signal propagation between the plurality of blocks may be configured such that at least one latch circuit (DL) is included midway in the superconducting PTL and, by holding information by this latch circuit (DL), the signal propagation between the plurality of blocks is carried out in a pipeline of at least two stages, thereby enabling high-speed operation.

Secondly, the structure of a sense line adapted to detect information from a memory cell array is also divided into a plurality of blocks. Each block of the sense line includes a superconducting sense circuit having a level logic with high drive capability and used for signal propagation in the block that directly drives a memory cell, and a superconducting PTL capable of high-speed signal propagation using a single flux quantum (SFQ) and disposed for signal propagation between the plurality of blocks.

The signal propagation between the plurality of blocks may be configured such that the superconducting PTLs are connected in series through a confluence buffer (C) formed by a single flux quantum (SFQ) device. Alternatively, the signal propagation between the plurality of blocks may be configured such that the superconducting PTLs are arranged in a binary tree structure through a confluence buffer (C) formed by a single flux quantum (SFQ) device.

Alternatively, the signal propagation between the plurality of blocks may be configured such that at least one latch circuit (DL) is included midway in the superconducting PTL and, by holding information by this latch circuit (DL), the signal propagation between the plurality of blocks is carried out in a pipeline of at least two stages, thereby enabling high-speed operation.

Thirdly, a superconducting RAM according to this invention may be configured by a memory cell array comprising the foregoing word line, bit line, and sense line according to this invention and a decoder circuit comprising a single flux quantum (SFQ) device.

Fourthly, a superconducting drive circuit used in a superconducting RAM of this invention has the following structure.

By the use of a drive gate comprising an amplifying gate (AMP) that produces a plurality of single flux quantum (SFQ) pulses in response to input of a single flux quantum (SFQ) pulse, a buffer gate (BUF) that prevents the plurality of single flux quantum (SFQ) pulses produced by the amplifying gate (AMP) from flowing back to the input side, and a magnetic coupling quantum interference gate (SQUID) that temporarily switches to the voltage state by the plurality of single flux quantum (SFQ) pulses produced by the amplifying gate (AMP), and a reset gate having the same structure as that of the drive gate, it is possible to realize a superconducting drive circuit that operates by the input of the single flux quantum (SFQ) pulse and is operable with a DC power supply.

A Josephson junction having a McCumber coefficient of approximately 5 to 10, which is used in the amplifying gate (AMP) of this invention, can produce a plurality of SFQ pulses in response to a single SFQ pulse. Since it automatically returns to the superconducting state after producing the plurality of SFQ pulses, it can be operated by the DC power supply. The McCumber coefficient depends on several junction parameters in an actual Josephson junction. Although the McCumber coefficient is as large as approximately several tens of thousands to several hundreds in an $Nb/AlO_x/Nb$ junction with a critical current density of approximately 2.5 $kA/cm^2$ to 10 $kA/cm^2$, a Josephson junction with a McCumber coefficient of approximately 1 or approximately 5 to 10 can be easily realized by connecting a resistance of a required value in parallel to the Josephson junction.

In the magnetic coupling quantum interference gate (SQUID) of this invention, in order to perform input/output separation between a level signal to be output and an SFQ signal on the input side, an input control wire is magnetically coupled to a superconducting loop including a Josephson junction. In such a magnetic coupling input system, it is, in general, difficult to couple the energy of an input signal, by 100%, to a superconducting loop including a Josephson junction (normally, there is a loss of approximately several tens of percent) and hence it is difficult to cause the magnetic coupling quantum interference gate (SQUID) to switch by input of a single SFQ pulse. Therefore, in this invention, the amplifying gate (AMP) that produces a plurality of SFQ pulses by input of a single SFQ pulse is used. The buffer gate (BUF) is a gate that prevents the plurality of SFQ pulses produced by the amplifying gate (AMP) from flowing back to the input side (SFQ circuit side). Accordingly, if an SFQ circuit in the preceding stage of the superconducting drive circuit according to this invention has a structure that allows a backflow of SFQ pulses, it is not necessary to add the buffer gate (BUF).

The magnetic coupling quantum interference gate (SQUID) formed by a Josephson junction having a McCumber coefficient of 50 or more is adapted to maintain the voltage state once having switched to the voltage state. However, when a load (driven line) of the magnetic coupling quantum interference gate (SQUID) is formed only by a superconducting line, no voltage is generated in the load finally and hence the magnetic coupling quantum interference gate (SQUID) is automatically reset to the superconducting state after feeding the current to the driven line. Therefore, the magnetic coupling quantum interference gate (SQUID) can be operated by a DC power supply. Even after the magnetic coupling quantum interference gate (SQUID) is reset to the superconducting state, a constant output current continues to flow in the driven line because it is in the superconducting state. Therefore, in order to reset the output current that continues to flow in the driven line, it is necessary to insert a reset gate in the driven line to thereby temporarily set the driven line to a resistance state (voltage state). The reset gate of the superconducting drive circuit of this invention is inserted for this purpose.

The value of the output current that flows in the driven line largely depends on a value of a characteristic impedance of the driven line and a value of an internal resistance when the drive gate and the reset gate temporarily switch to the voltage state. Therefore, in this invention, damping resistances $R_{d1}$ and $R_{d2}$ having a value corresponding to the characteristic impedance of the driven line are connected in parallel to the drive gate and the reset gate, respectively, thereby adjusting the internal impedance of the gates. Given that the characteristic impedance of the driven line is $Z_0$ and the internal resistance when the drive gate and the reset gate switch to the voltage state is $R_j$, a value $R_d$ of the damping resistance can be approximately derived by the following equation:

$$R_d = Z_0/(1 - Z_0/R_j)$$

As understood from this equation, when the internal impedance $R_j$ of the drive gate and the reset gate is smaller than the characteristic impedance $Z_0$ of the driven line, a solution of the equation becomes negative and hence it is not possible to match the characteristic impedance of the driven line. In this case, in this invention, adjustment is carried out by connecting a plurality of magnetic coupling quantum interference gates (SQUID) in series to multiply the internal resistance by the number of serially connected gates.

Further, a small value resistance $R_L$ inserted in a superconducting stripline being the driven line serves to automatically remove magnetic flux trapped in the driven line forming the superconducting loop. Given that the total inductance of the driven line formed by the superconducting stripline is L, a reduction in output current can be almost prevented by setting a value of $R_L$ to be small so that a time constant $L/R_L$ becomes sufficiently greater than an operation period T of the superconducting drive circuit.

It is possible to arrange a plurality of superconducting drive circuits according to this invention by connecting in series or in parallel bias current lines of the superconducting drive circuits with respect to a DC power supply. In this event, in the case of the serial connection, by inserting an inductance of a proper value in the DC bias line between the adjacent superconducting drive circuits, it is possible to reduce an influence exerted on the adjacent superconducting drive circuit when one superconducting drive circuit switches to the voltage state. On the other hand, in the case of the parallel connection, by inserting an inductance of a proper value between each of bias current input ends of the superconducting drive circuits and the DC power supply, it is possible to reduce an influence exerted on the adjacent superconducting drive circuit when one superconducting drive circuit switches to the voltage state. Consequently, it is possible to configure a superconducting drive circuit in which the operation margin of the entire circuit is large.

Fifthly, a superconducting sense circuit used in a superconducting RAM of this invention has the following structure.

The superconducting sense circuit used in the superconducting RAM of this invention comprises at least one sense line information detecting portion and an SFQ circuit which bases its operation on a single flux quantum (SFQ). The sense line information detecting portion comprises a sense line of the superconducting RAM, a bias resistance, a load resistance, and a load inductance. One end of the sense line is ground and its other end is connected to a first connection point, and one end of the bias resistance is connected to a direct current supply terminal and its other end is connected to the first connection point. The load resistance and the load inductance are connected in series between the first connection point and an output end of the sense line information detecting portion. Further, it is one of main features that the output ends of the plurality of sense line information detecting portions are connected to a data signal input end of the SFQ circuit.

The SFQ circuit may have a data signal input end, a clock signal input end, and a signal output end and may have a function of holding information in response to input of a data signal to the data signal input end and, in response to input of a clock signal to the clock signal input end thereafter, outputting a single flux quantum (SFQ) pulse to the signal output end depending on a value of the data signal.

The sense line may have a structure in which a read gate of at least one of memory cells in the RAM is connected in series.

It is preferable that all the Josephson junctions of the sense line be set to operate in an underdamped state with a McCumber coefficient of "50" or more and all the Josephson junctions of the SFQ circuit be set to operate in an overdamped state with a McCumber coefficient of approximately "1". Further, all the Josephson junctions including those of the sense line may be set to operate in an overdamped state with a McCumber coefficient of approximately "1".

As described above, according to this invention, it is possible to configure the superconducting sense circuit operable with a DC power supply, which can read information from the sense line and obtain a single flux quantum (SFQ) pulse output without requiring the complicated timing sequence.

The superconducting sense circuit of this invention reads information from the sense line (hereinafter, the S line) being part of the memory cell array and once holds the read information in the SFQ circuit. Then, in response to the next clock signal, the information held in the SFQ circuit is read. Therefore, the information of the memory cell is delivered to a circuit subsequent to this sense circuit in two-stage clock periods by this sense circuit and hence this sense circuit is characterized by operating in a two-stage pipeline. That is, there is also an advantage that high-speed operation of the circuit is enabled by this pipeline.

Depending on a value of the average characteristic impedance of the S line of the RAM, the following two circuit structures can be employed. One is that the average characteristic impedance of the S line is "larger" as compared with an internal resistance value of a Josephson junction when the Josephson junction having a McCumber coefficient of "1" switches to the voltage state, and the other is that it is "approximately equal or smaller" as compared with the internal resistance value. The internal resistance of the Josephson junction having the McCumber coefficient of "1" largely depends on the kind of junction, its critical current density, and its critical current value. For example, the internal resistance of an "Nb/AlO$_X$/Nb" Josephson junction with a McCumber coefficient of "1", a critical current density of 10 kA/cm$^2$, and a critical current value of 0.1 mA is approximately 7 Ω. In this case, for example, when the average characteristic impedance of the S line is 20 Ω or more, it is "larger", while, when it is 10 Ω or less, it is "approximately equal or smaller".

At first, when the average characteristic impedance of the S line of the RAM is "larger", all the Josephson junctions of the S line are set to operate in an underdamped state with a McCumber coefficient of "50" or more. In this case, although the junction has a latching device-like characteristic, by properly setting the values of the load resistance $R_{L1}$ and the load inductance $L_R$ serving as loads of the S line, the Josephson junction of the S line automatically returns to the superconducting state even if once having switched to the voltage state. This is an operating state called a self-reset mode of a latching device. In this event, a signal flowing into the SFQ circuit through the load inductance $L_R$ becomes a plurality of SFQ pulses. Even if the plurality of SFQ pulses are input, the SFQ circuit operates without any problem. After information "1" is held in the SFQ circuit in response to the first input SFQ pulse, the second or subsequently input SFQ pulse is automatically excluded until the next clock pulse is input. When an SFQ pulse is input to the clock signal input end of the SFQ circuit in the state where information "1" is held in the SFQ circuit, an SFQ pulse is output to the signal output end of the SFQ circuit so that reading of information "1" is completed.

On the other hand, when the average characteristic impedance of the S line of the RAM is "approximately equal or smaller", all the Josephson junctions of the S line may be set to have a McCumber coefficient of approximately "1". In this case, since the internal resistance when the read gate of the S line temporarily switches to the voltage state and the characteristic impedance of the line substantially match each other, an SFQ pulse produced by switching of the read gate of the S line is propagated in the transmission line at ultra-high speed without attenuation of current amplitude. Therefore, although the current, which is an output from the S line and flows in the inductance $L_R$, becomes an SFQ pulse in this case, it is possible to realize a superconducting sense circuit having the same function and enabling higher-speed operation by properly adjusting the values of the load resistance $R_{L1}$ and the load inductance $L_R$.

The operation speed (clock frequency) of the superconducting sense circuit of this invention largely depends on a read time of a signal from the S line. Although this read time depends on several circuit constants such as the characteristic impedance of the S line as described above, it largely depends on the total inductance of the S line. The magnitude of this inductance is proportional to the number of serially connected read gates of memory cells. Therefore, in order to operate the circuit at a required clock frequency, it is necessary to limit the number of read gates of memory cells forming one sense line. For example, when the number of serially connected read gates is 32 and a circuit is operable at a clock frequency of 10 GHz, the number of serially connected read gates should be reduced to approximately 16, i.e. half, for operating the circuit at a clock frequency of 20 GHz.

Sixthly, a device structure of a superconducting RAM of this invention has the following structure.

In a superconducting RAM configuration method, there is provided a device structure, wherein a superconducting drive circuit and a superconducting sense circuit used for signal propagation in each block and a memory cell array are disposed over a first superconducting ground plane, and a superconducting passive transmission line (PTL) used for signal propagation between the blocks is disposed under the first superconducting ground plane, and wherein the memory cell array comprises a plurality of superconducting loops including Josephson junctions, a plurality of superconducting wiring layers, and a first resistance layer which are disposed over the first superconducting ground plane, and the superconducting passive transmission line (PTL) comprises a plurality of superconducting wiring layers, a plurality of superconducting ground planes, and a second resistance layer which are disposed under the first superconducting ground plane.

It may be configured that a plurality of superconducting passive transmission lines (PTL) of a stripline structure are formed in layers by a plurality of superconducting wiring layers and a plurality of superconducting ground planes which are disposed under the first superconducting ground plane.

It may be configured that a direct current is supplied to a circuit including a Josephson junction through a power supply line inductance forming layer formed by at least one of superconducting wiring layers and a second resistance layer which are disposed under the first superconducting ground plane.

It may be configured that a high permeability material such as Permalloy is included in an insulating layer between a plurality of superconducting wiring layers disposed over the first superconducting ground plane and in an insulating layer adjacent to a power supply line inductance forming layer disposed under the first superconducting ground plane.

It may be configured that a high permittivity material is included in an insulating layer between superconducting layers forming the superconducting passive transmission line (PTL).

It may be configured that an insulating layer adjacent to a superconducting layer forming the superconducting passive transmission line (PTL) is formed of a high permittivity material.

EFFECT OF THE INVENTION

In the structure of an RAM having superconductivity according to this invention, drive lines such as a word line and a bit line, and a sense line for accessing a memory cell array are each divided into a plurality of blocks. For signal propagation in each of the blocks, a level-logic drive circuit and sense circuit each with high load drive capability are used. Further, for long-distance signal propagation between the blocks, a superconducting passive transmission line (PTL) formed by single flux quantum (SFQ) devices and capable of high-speed operation is used. As a result, there is an effect of enabling the high-speed operation as a whole.

The reason is that the superconducting passive transmission line (PTL) is formed by a stripline or microstripline having a predetermined characteristic impedance, and a drive circuit and a receiver circuit composed of SFQ devices. That is, the superconducting PTL is an ideal transmission line and can propagate a signal at the speed of light corresponding to the permittivity of an insulating layer forming the stripline with almost no attenuation.

Further, since those components are formed by SFQ circuits with low power consumption, they are operable with a DC power supply and, further, there is an effect that the power consumption can be largely reduced. Moreover, there is an effect that, by pipelining the interblock signal propagation, ultra-high speed clock operation can be realized in the word line, bit line, and sense line structures of any large-scale superconducting RAM.

Further, there is an effect that it is possible to realize a large-scale superconducting RAM operable at ultra-high speed and ultra-low power consumption, by forming the superconducting RAM by a memory cell array comprising the foregoing word line, bit line, and sense line of this invention and a decoder circuit comprising single flux quantum (SFQ) devices.

According to this invention, there is an effect that it is possible to realize a superconducting drive circuit operable with a DC power supply, which operates by input of a single flux quantum (SFQ) pulse as a data signal and a reset signal to thereby output a predetermined level signal to a driven line having a predetermined characteristic impedance. Further, the same effect can be achieved by arranging a plurality of such superconducting drive circuits. Accordingly, there is an effect that it is possible to realize a superconducting drive circuit operable with a DC power supply, which drives a memory cell array of a superconducting RAM formed by single flux quantum (SFQ) devices.

According to this invention, it is possible to realize a superconducting sense circuit operable with a DC power supply, which has a function of reading information held by a selected memory cell of a memory cell array of an RAM into a sense line, temporarily holding this information in an SFQ circuit, such as an RS flip-flop, which bases its operation on a single flux quantum (SFQ), and, in response to input of the next clock signal, outputting an SFQ pulse corresponding to information "1" and outputting no SFQ pulse corresponding to information "0". In this manner, according to this invention, there is an effect that information can be easily read from the sense line and, further, by holding the read information in the SFQ circuit having a wide operation margin, it is possible to realize the sense circuit having a wide operation margin as a whole. Further, there is also an effect that the operation of this circuit does not require a complicated timing sequence and, in addition, since this circuit operates in a two-stage pipeline where information of the memory cell is read by the sense line and held by the SFQ circuit during the first clock period and the held information is output in the next clock period, high-speed operation is enabled.

Further, in the structure where a plurality of sense line information detecting portions share a single SFQ circuit, there is also an effect that since the number of elements can be reduced, it is possible to also reduce the layout area and the power consumption.

A feature of a device structure according to this invention resides in that a superconducting loop including a Josephson junction and a plurality of superconducting wiring layers are formed over a first superconducting ground layer being the uppermost superconducting ground layer, and a power supply (bias current) supply layer including a power supply line inductance forming layer and a plurality of stripline structures comprising a plurality of superconducting wiring layers and a plurality of superconducting ground layers are formed under the first superconducting ground layer.

In this invention, the superconducting passive transmission line (PTL) is formed by a stripline or microstripline having a predetermined characteristic impedance, and a drive circuit and a receiver circuit composed of SFQ devices. The superconducting passive transmission line is an ideal transmission line and can propagate a signal at the speed of light corresponding to the permittivity of an insulating layer being one of components of the stripline with almost no attenuation. The passive transmission line (PTL) is described in detail in Patent Document 4 (Japanese Unexamined Patent Publication (JP-A) No. 2004-72141) and Non-Patent Document 9 (Extended Abstracts of ISEC '01, 175-176).

Further, in this invention, the power supply line inductance forming layer serves to insert an inductance in the bias current supply line. In a circuit (SFQ circuit) formed by a single flux quantum (SFQ) device, in order to supply a predetermined DC bias current to a Josephson junction, distribution of current is carried out by inserting a bias resistance in the bias current supply line. Most of the power of the SFQ circuit is consumed by this bias resistance. Therefore, in order to reduce the power consumption of the SFQ circuit, it is necessary to reduce this bias resistance. However, if the bias resistance is reduced, an influence increases which is exerted on an adjacent Josephson junction through the bias current supply line when one Josephson junction switches. Therefore, an inductance of a proper magnitude is inserted in the bias current supply line to increase a high-frequency load of the bias current supply line when the Josephson junction switches, thereby preventing the influence from being exerted on the adjacent Josephson junction. The power supply line inductance forming layer of this invention serves to insert this inductance in the bias current supply line.

By forming a superconducting loop and a control wire forming a memory cell at the upper portion of the first superconducting ground layer, i.e. the uppermost portion of the RAM, magnetic coupling, i.e. mutual inductance, between the superconducting loop and the control wire is efficiently obtained. In order to reduce the layout size of memory cells, it is desirable that the inductance per unit length of the superconducting loop be as large as possible. Assuming, for example, that a superconducting ground layer is further disposed at the upper portion of the superconducting loop, the control wire, and so on forming the memory cell, the superconducting loop, the control wire, and so on are surrounded by the first superconducting ground layer and the upper superconducting ground layer, which leads to a reduction in inductance per unit length of the superconducting loop, the control wire, and so on. Accordingly, by forming the superconducting loop and the control wire forming the memory cell at the uppermost portion, it is possible to avoid the structure, where they are surrounded by the superconducting ground layers, which, as described above, leads to the reduction in inductance. Further, by inserting a high permeability material such as Permalloy in an insulating layer where the superconducting loop is formed and in an insulating layer adjacent to the power supply line inductance forming layer, the inductance per unit length further increases efficiently.

On the other hand, in order to miniaturize the superconducting passive transmission line (PTL), it is necessary to minimize the line width in the structure of a stripline or microstripline being a basic component thereof. The characteristic impedance of the stripline is set to a predetermined value by design. If the characteristic impedance is the same, the line width can be set smaller in the stripline structure where ground is provided on both upper and lower sides, as compared with the microstripline structure where ground is provided on either upper or lower side. In this invention, for example, a plurality of stripline structures comprising a plurality of superconducting wiring layers and a plurality of superconducting ground layers are formed under the first superconducting ground layer. Further, by inserting a high permittivity material in an insulating layer of the stripline structure, it is possible to increase the capacitance of the stripline. Therefore, using the stripline having the same characteristic impedance, it is possible to further reduce the line width to thereby achieve the miniaturization.

Further, by disposing the DC power supply layer under the first superconducting ground layer, a magnetic field produced by the DC power supply layer can be efficiently shielded. Therefore, the circuits such as the superconducting loop including the Josephson junction, and the superconducting passive transmission lines are hardly affected by the magnetic field produced by the DC power supply layer, and hence, a reduction in operation margin of the circuit otherwise caused by influence of the magnetic field can be prevented.

Further, in terms of the manufacturing process, forming the Josephson junction and the superconducting loop including the Josephson junction at the uppermost portion means that the layer including the Josephson junction is lastly formed after forming the lower superconducting layers, resistance layers, and insulating layers. Generally, since a Josephson junction is formed by a superconducting layer including a very thin barrier layer with a thickness of approximately 1 nm, it is easily degraded due to damage caused by temperature, film stress, static electricity, and so on in the manufacture. By forming, in the final process, the layer including such a Josephson junction that is susceptible to the influence of the process environment in the manufacture, it is possible to exclude all influence caused at the time of forming the lower superconducting layers, resistance layers, and insulating layers. Therefore, various process techniques can be used in the manufacturing process before the formation of the Josephson junction layer. For example, use can be made of an $SiO_2$ insulating film forming technique using plasma CVD which requires a high-temperature process at 200° C. or more, a CMP (chemical mechanical polishing) planarization technique susceptible to damage such as static electricity, an acid/alkali cleaning technique, and so on.

The multilayer structure of this invention can be effectively realized by a multilayer wiring forming method using a planarization technique as shown, for example, in Patent Document 5 (Japanese Unexamined Patent Publication (JP-A) No. 2005-39244).

According to this invention, there is provided the device structure of the ultra-high speed, large-scale superconducting RAM, wherein the high-temperature process can be employed in most of the manufacturing process, the miniaturization of the memory cells is enabled, the inductance can be efficiently formed in the DC bias current supply line, and the influence of the magnetic field produced by the bias current can be prevented.

DESCRIPTION OF THE PREFERRED EMBODIMENTS

Figure 1:
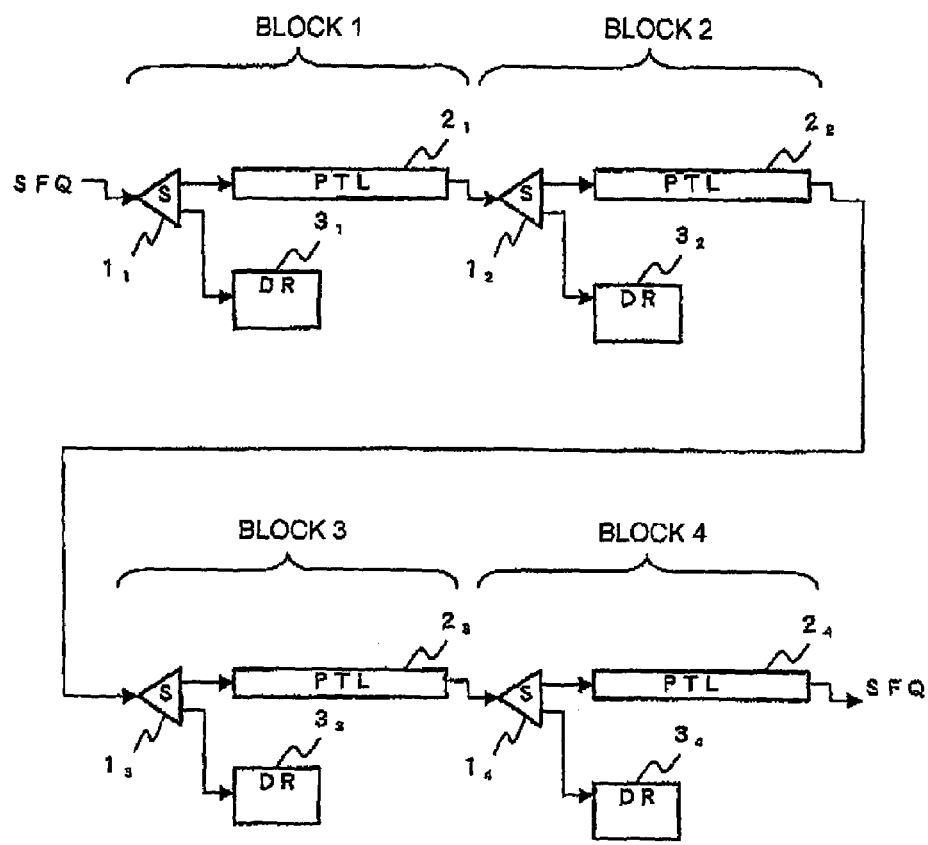
FIG. 1 is an equivalent circuit diagram for explaining the structure of a superconducting RAM according to a first embodiment of this invention and, more specifically, is an explanatory diagram showing the structure relating to a word line or a bit line included in the superconducting RAM.

This invention has accomplished the object of providing a large-capacity superconducting RAM operable, as a whole, with a DC power supply and at ultra-high speed and ultra-low power consumption, by forming the superconducting RAM by a memory cell array comprising the foregoing word line, bit line, and sense line and decoder circuits comprising single flux quantum (SFQ) devices.

The foregoing splitter, confluence buffer, and latch circuit formed by single flux quantum (SFQ) devices are described in detail, for example, in Non-Patent Document 7 (IEEE Transaction on Applied Superconductivity, vol. 1, no. 1, p. 7, 1991). As the splitter, a circuit shown in FIG. 4 of Non-Patent Document 7 can be used. As the confluence buffer, a circuit shown in FIG. 6 of Non-Patent Document 7 can be used. As a similar function, an OR circuit shown in FIG. 10 of Non-Patent Document 7 can be used. As the latch circuit, an RS flip-flop shown in FIG. 7 of Non-Patent Document 7 can be used.

On the other hand, the passive transmission line (PTL) is described in detail, for example, in the foregoing Non-Patent Document 9 and Patent Document 4. For the signal propagation in each block, the level-logic drive circuit and sense circuit each with high load drive capability are used. However, use can also be made of a drive circuit and a sense circuit operable with a DC power supply, which are described in the foregoing Non-Patent Document 3.

When the word line, bit line, or sense line is divided into in-block signal propagation circuits and an interblock signal propagation circuit as described above, the path structure thereof becomes complicated. However, even when a memory cell array increases in capacity, high-speed operation is enabled. Such a somewhat complicated path structure can be realized without increasing the layout area of memory cells by employing a niobium (Nb) multilayer wiring structure in a device structure.

When the scale of an RAM increases, i.e. a memory cell array increases in capacity, the number of memory cells to be driven by one drive circuit increases so that the operation speed is inevitably lowered. Accordingly, in this invention, the number of memory cells to be driven by one drive circuit and one sense circuit is limited by division, thereby enabling high-speed operation. Then, signal propagation is carried out at ultra-high speed to a plurality of divided drive circuits or sense circuits through a circuit and superconducting PTL formed by single flux quantum (SFQ) devices having characteristics of ultra-high speed and ultra-low power consumption. In this invention, by configuring the word line, bit line, and sense line composed of such interblock signal propagation and in-block signal propagation, the high-speed operation of the RAM as a whole is enabled.

When the scale of an RAM further increases, the number of divided blocks increases so that the time required for interblock signal propagation increases. However, by inserting latch circuits to increase the number of pipeline stages used for the interblock signal propagation, the required high-speed operation is ensured. In other words, in order to achieve the required clock frequency of the RAM, the memory cell array is divided into a plurality of blocks so that an operating time of one drive circuit or sense circuit is completed in the clock period, and signal propagation between the plurality of divided blocks is also pipelined. As a result, even in any large-scale RAM structure, the required high-speed clock operation is enabled.

On the other hand, in the large-scale superconducting RAM, such an increase in the number of division leads to a problem of an increase in power consumption. However, the interblock signal propagation circuit according to this invention is formed by single flux quantum (SFQ) devices such as superconducting PTLs, splitters or confluence buffers, and latch circuits and, hence, making the most of the characteristic of ultra-low power consumption of an SFQ circuit adapted to operate with a DC power supply, the operation at ultra-low power consumption is enabled even in the large-scale RAM structure.

First Embodiment

Referring to FIG. 1, description will be made about a first embodiment of this invention.

FIG. 1 is an equivalent circuit diagram showing the structure of a superconducting RAM according to the first embodiment of this invention. The first embodiment relates to the structure of a word line or a bit line included in the superconducting RAM.

At first, the structure and function of this circuit will be described.

According to the first embodiment, each of blocks of a word line or a bit line comprises an in-block signal propagation circuit (DR) 3 including a superconducting drive circuit, a superconducting passive transmission line (PTL) 2 adapted to carry out signal propagation between the blocks, and a splitter (S) 1 formed by a single flux quantum (SFQ) device and adapted to distribute a signal, received from the preceding superconducting passive transmission line (PTL) 2, to the superconducting passive transmission line (PTL) 2 and the in-block signal propagation circuit (DR) 3 in its own block. FIG. 1 shows the case where the foregoing components are disposed in the four blocks, respectively. The in-block signal propagation circuit (DR) $3_X$ comprises serially connected 32 memory cells and the single drive circuit adapted to drive these memory cells and has a function of producing a level signal in response to input of an SFQ pulse signal to directly drive the 32 memory cells.

Now, the circuit operation of the first embodiment will be described. In FIG. 1, when a single flux quantum (SFQ) pulse is input into the splitter (S) $1_1$ from the left end, the SFQ pulse alternately passes through the four splitters (S) $1_1$ to $1_4$ and the four superconducting passive transmission lines (PTL) $2_1$ to $2_4$, thereby carrying out, at ultra-high speed, signal propagation between the blocks from left to right. Simultaneously, SFQ pulses output from the other output ends of the respective splitters (S) $1_1$ to $1_4$ are propagated to the four in-block signal propagation circuits (DR) $3_1$ to $3_4$, respectively, so that the drive circuits in the in-block signal propagation circuits (DR) $3_1$ to $3_4$ switch and enable to directly propagate signals to the memory cells.

Since the signal propagation between the blocks is carried out at ultra-high speed (the speed of light corresponding to the permittivity) through the splitters (S) $1_X$ each formed by the SFQ device and the superconducting passive transmission lines (PTL) $2_X$, the SFQ pulse signal can be delivered to the four in-block signal propagation circuits (DR) with slight time differences.

Through the foregoing operation, it is possible to configure the word line or the bit line of the superconducting RAM operable at ultra-high speed.

In the circuit of the first embodiment, the in-block signal propagation circuit (DR) $3_X$ is formed by the serially connected 32 memory cells and the single drive circuit adapted to drive these memory cells. However, the number of serially connected memory cells can be set to an optional value according to a required operating frequency.

Second Embodiment

Figure 2:
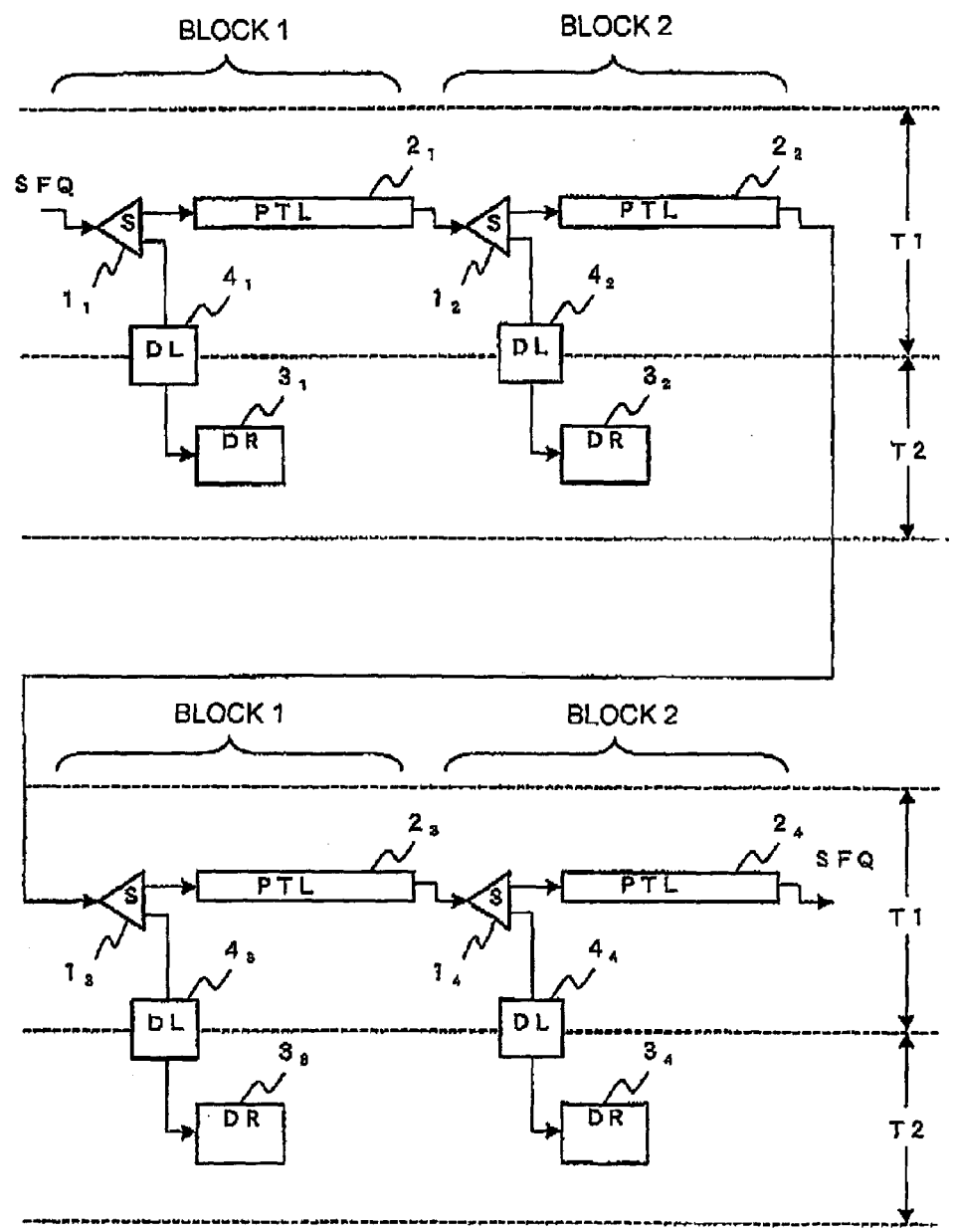
FIG. 2 is an equivalent circuit diagram for explaining the structure of a superconducting RAM according to a second embodiment of this invention and, more specifically, is an explanatory diagram showing the structure relating to a word line or a bit line included in the superconducting RAM.

Referring to FIG. 2, description will be made about a second embodiment of this invention.

FIG. 2 is an equivalent circuit diagram showing the structure of a superconducting RAM according to the second embodiment of this invention. The second embodiment relates to the structure of a word line or a bit line included in the superconducting RAM.

At first, the structure and function of this circuit will be described.

The second embodiment comprises in-block signal propagation circuits (DR) $3_1$ to $3_4$ each including a superconducting drive circuit, superconducting passive transmission lines (PTL) $2_1$ to $2_4$ adapted to carry out signal propagation between blocks, latch circuits (DL) $4_1$ to $4_4$ each formed by a single flux quantum (SFQ) device and each having a function of holding information, and splitters (S) $1_1$ to $1_4$ each formed by a single flux quantum (SFQ) device and each adapted to distribute a signal to a corresponding one of the superconducting passive transmission lines (PTL) $2_1$ to $2_4$ and a corresponding one of the latch circuits (DL) $4_1$ to $4_4$. The second embodiment describes the case where the foregoing components are disposed in the number of four, respectively. The in-block signal propagation circuit (DR) $3_X$ comprises serially connected 32 memory cells and the single drive circuit adapted to drive these memory cells and has a function of producing a level signal in response to input of an SFQ pulse signal to directly drive the 32 memory cells.

The circuit of the second embodiment operates in a two-stage pipeline. In the first clock period (T1), when a single flux quantum (SFQ) pulse is input into the splitter (S) $1_1$ from the left end in FIG. 2, the SFQ pulse passes through the alternately serially arranged four splitters (S) $1_1$ to $1_4$ and four superconducting passive transmission lines (PTL) $2_1$ to $2_4$, thereby carrying out, at ultra-high speed, signal propagation between the blocks from left to right. Simultaneously, SFQ pulses output from the other output ends of the respective splitters (S) $1_1$ to $1_4$ are input into the four latch circuits (DL) $4_1$ to $4_4$, respectively, so that information is held. In the next clock period (T2), when a clock signal is input into the four latch circuits (DL) $4_1$ to $4_4$, the information held in the latch circuits (DL) $4_1$ to $4_4$ is substantially simultaneously propagated to the in-block signal propagation circuits (DR) $3_1$ to $3_4$, respectively, so that the drive circuits in the in-block signal propagation circuits (DR) $3_1$ to $3_4$ switch and enable to directly propagate signals to the memory cells.

Through the foregoing operation, it is possible to configure the word line or the bit line of the superconducting RAM operable at ultra-high speed in the two-stage pipeline.

As described above, in the second embodiment, the SFQ pulse signal propagated in the interblock signal propagation path is once held by the four latch circuits (DL) $4_1$ to $4_4$ and, in the next clock period, is substantially simultaneously delivered to the four in-block signal propagation circuits (DR) $3_1$ and $3_4$. Therefore, as compared with the first embodiment, there is an effect of enabling higher-speed clock operation.

Third Embodiment

Figure 3:
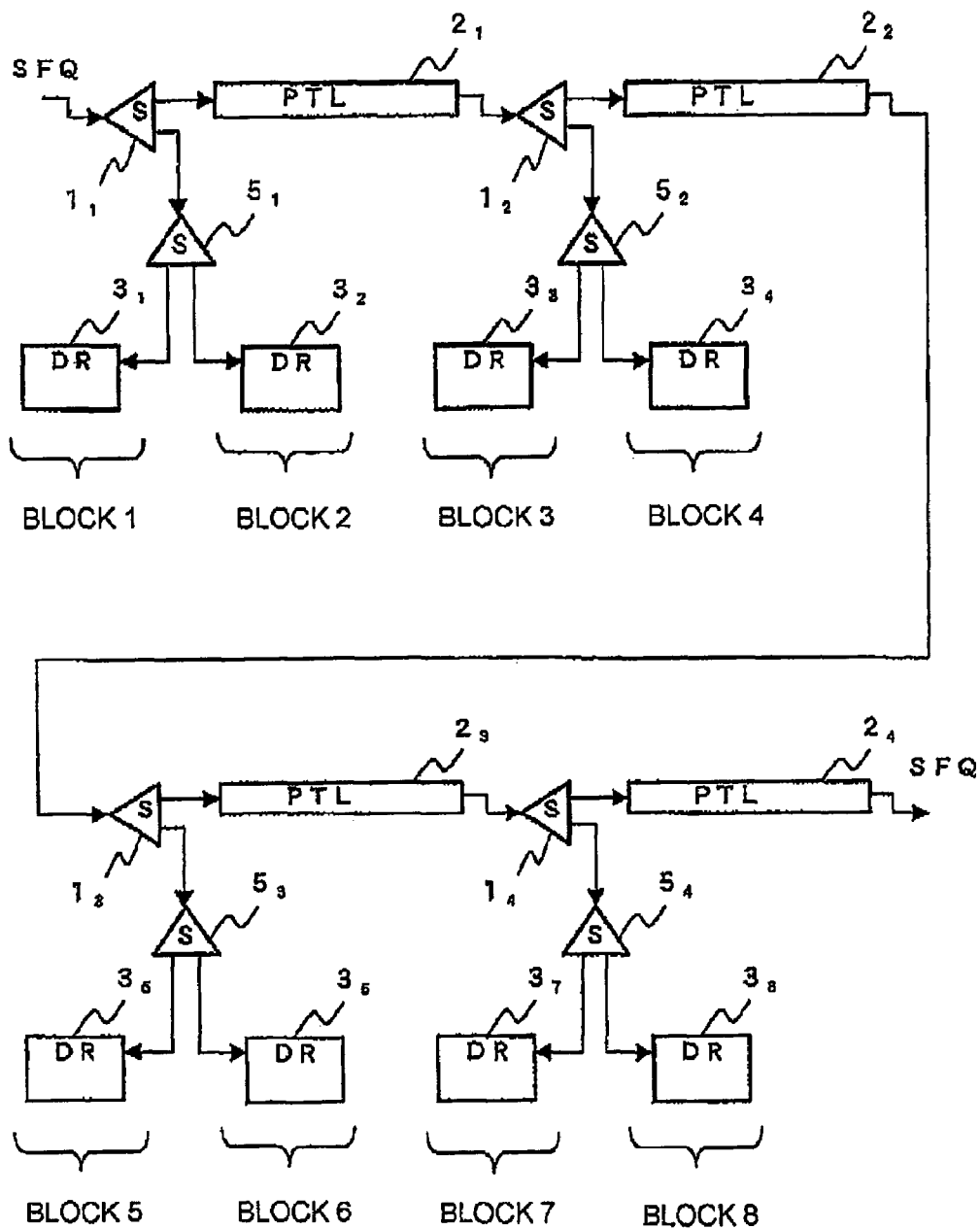
FIG. 3 is an equivalent circuit diagram for explaining the structure of a superconducting RAM according to a third embodiment of this invention and, more specifically, is an explanatory diagram showing the structure relating to a word line or a bit line included in the superconducting RAM.

Referring to FIG. 3, description will be made about a third embodiment of this invention.

FIG. 3 is an equivalent circuit diagram showing the structure of a superconducting RAM according to the third embodiment of this invention. The third embodiment relates to the structure of a word line or a bit line included in the superconducting RAM.

At first, the structure and function of this circuit will be described.

The third embodiment is configured such that splitters (S) $5_1$ to $5_4$ are inserted between the splitters (S) $1_1$ to $1_4$ and the in-block signal propagation circuits (DR) in the first embodiment, respectively, and two in-block signal propagation circuits (DR) are connected to each of outputs of the splitters (S) $5_1$ to $5_4$. With this configuration, it is possible to drive the eight in-block signal propagation circuits (DR) $3_1$ to $3_8$, which is twice as compared with the first embodiment. Herein, for example, the in-block signal propagation circuits (DR) $3_1$ and $3_2$ are connected to the splitter (S) $5_1$, thereby forming blocks 1 and 2, respectively. Likewise, blocks 3 to 8 are formed.

The operation of the circuit of the third embodiment is the same as that of the foregoing first embodiment and hence the same effect can be achieved as in the first embodiment. Further, in the third embodiment, as compared with the number of the in-block signal propagation circuits, the number of the splitters involved in the signal propagation between the blocks is relatively reduced. Therefore, since the signal propagation between the blocks can be carried out at higher speed, there is an effect that the signal propagation between the blocks can be carried out in a wider range in terms of the same clock period.

Fourth Embodiment

Figure 4:
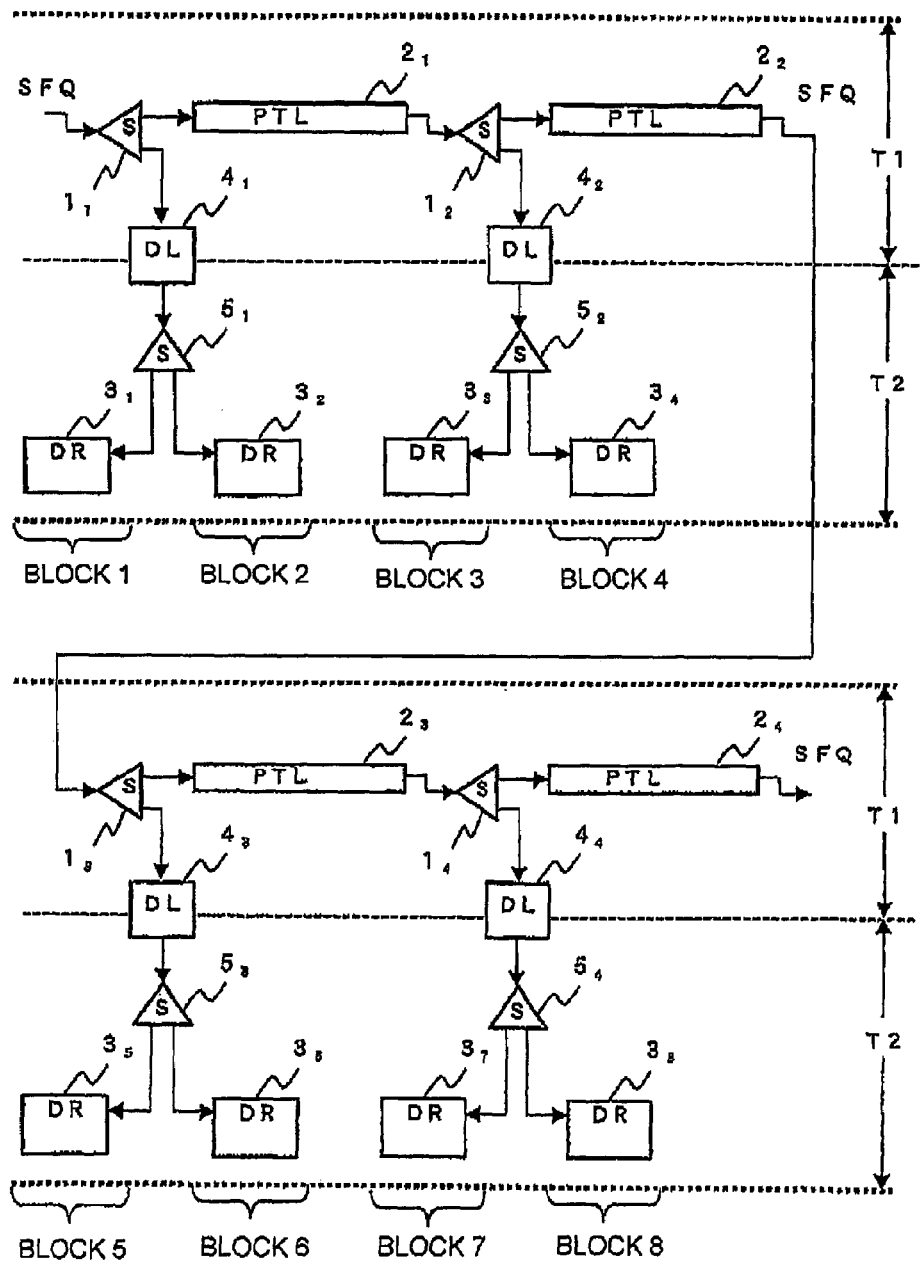
FIG. 4 is an equivalent circuit diagram for explaining the structure of a superconducting RAM according to a fourth embodiment of this invention and, more specifically, is an explanatory diagram showing the structure relating to a word line or a bit line included in the superconducting RAM.

Referring to FIG. 4, description will be made about a fourth embodiment of this invention.

FIG. 4 is an equivalent circuit diagram showing the structure of a superconducting RAM according to the fourth embodiment of this invention. The fourth embodiment relates to the structure of a word line or a bit line included in the superconducting RAM.

At first, the structure and function of this circuit will be described.

The fourth embodiment is configured such that splitters (S) $5_1$ to $5_4$ are inserted between the latch circuits (DL) $4_1$ to $4_4$ and the in-block signal propagation circuits (DR) in the second embodiment, respectively, and two in-block signal propagation circuits (DR) are connected to each of outputs of the splitters (S) $5_1$ to $5_4$. With this configuration, it is possible to drive the eight in-block signal propagation circuits (DR) $3_1$ to $3_8$, which is twice as compared with the second embodiment. Herein, for example, the in-block signal propagation circuits (DR) $3_1$ and $3_2$ are connected to the splitter (S) $5_1$, thereby forming blocks 1 and 2, respectively. Likewise, blocks 3 to 8 are formed.

The circuit of the fourth embodiment operates in a two-stage pipeline like that of the second embodiment. In a clock period (T1) of the first stage, when a single flux quantum (SFQ) pulse is input into the splitter (S) $1_1$ from the left end in FIG. 4, the SFQ pulse passes through the alternately serially arranged four splitters (S) $1_1$ to $1_4$ and four superconducting passive transmission lines (PTL) $2_1$ to $2_4$, thereby carrying out, at ultra-high speed, signal propagation between the blocks from left to right. Simultaneously, SFQ pulses output from the other output ends of the respective splitters (S) $1_1$ to $1_4$ are input into the four latch circuits (DL) $4_1$ to $4_4$, respectively, so that information is held.

In a clock period (T2) of the second stage, as different from the foregoing second embodiment, when a clock signal is input into the four latch circuits (DL) $4_1$ to $4_4$, the information held in the latch circuits (DL) $4_1$ to $4_4$ is substantially simultaneously propagated to the eight in-block signal propagation circuits (DR) $3_1$ to $3_8$ through the four splitters (S) $5_1$ to $5_4$, so that the drive circuits in the in-block signal propagation circuits (DR) $3_1$ to $3_8$ switch and enable to directly propagate signals to the memory cells.

The circuit operation of the fourth embodiment is almost the same as that of the foregoing second embodiment and hence almost the same effect can be achieved as in the second embodiment. Further, in the fourth embodiment, as compared with the number of the in-block signal propagation circuits, the number of the splitters involved in the signal propagation between the blocks is relatively reduced. Therefore, since the signal propagation between the blocks can be carried out at higher speed, there is an effect that the signal propagation between the blocks can be carried out in a wider range in terms of the same clock period.

Fifth Embodiment

Figure 5:
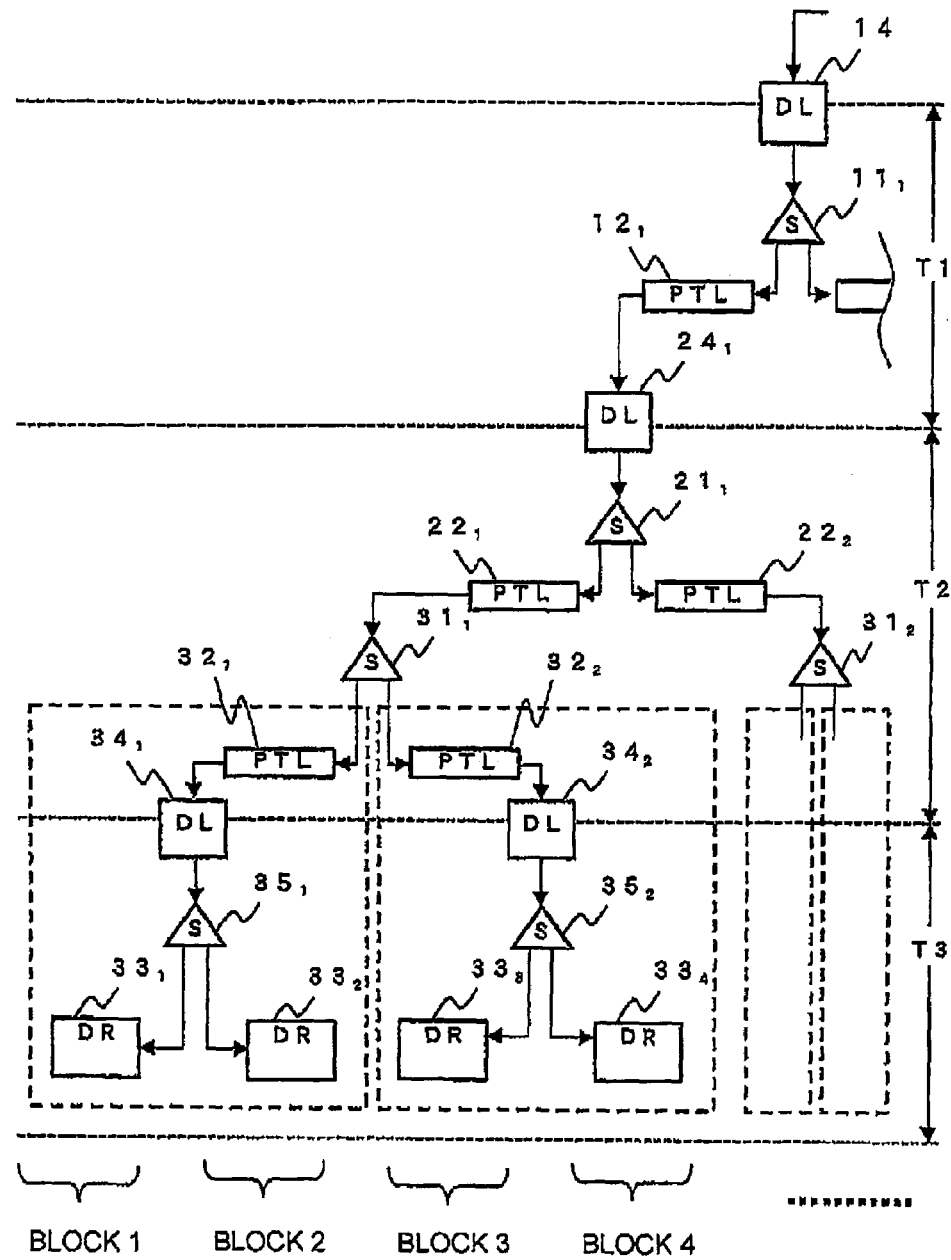
FIG. 5 is an equivalent circuit diagram for explaining the structure of a superconducting RAM according to a fifth embodiment of this invention and, more specifically, is an explanatory diagram showing the structure relating to a word line or a bit line included in the superconducting RAM.

Referring to FIG. 5, description will be made about a fifth embodiment of this invention.

FIG. 5 is an equivalent circuit diagram showing the structure of a superconducting RAM according to the fifth embodiment of this invention, wherein four blocks 1 to 4 in eight blocks are illustrated. The remaining blocks 5 to 8 have the same structure as the blocks 1 to 4. The fifth embodiment relates to the structure of a word line or a bit line included in the superconducting RAM.

At first, the structure and function of this circuit will be described.

The fifth embodiment is configured such that the interblock signal propagation circuit formed by the superconducting passive transmission lines (PTL) and the splitters (S) in the fourth embodiment is arranged in a binary tree. In addition, this embodiment is set to operate in a three-stage pipeline by inserting latch circuits (DL) at proper positions in the interblock signal propagation circuit of the binary tree structure.

Now, description will be made about the structure and operation of the fifth embodiment including a portion omitted in FIG. 5.

In a clock period (T1) of the first stage, a splitter (S) $11_1$ receives an SFQ pulse input through a latch circuit (DL) 14 and sends it to two superconducting passive transmission lines (PTL) $12_1$ and $12_2$.

In a clock period (T2) of the second stage, a latch circuit $24_1$ sends the SFQ pulse, received from the superconducting passive transmission line (PTL) $12_1$, to two superconducting passive transmission lines (PTL) $22_1$ and $22_2$ through a splitter (S) $21_1$. In this second stage, further, the SFQ pulse output from the superconducting passive transmission line (PTL) $22_1$ is sent to two superconducting passive transmission lines (PTL) $32_1$ and $32_2$ directly through a splitter (S) $31_1$. Non-illustrated splitter (S) $21_2$ and superconducting passive transmission lines (PTL) $22_3$, $22_4$, and $32_3$ to $32_8$ are also arranged in the same configuration.

In a clock period (T3) of the third stage, there is a circuit structure which is the same as and double the structure in the second stage of the foregoing fourth embodiment.

The circuit operation of the fifth embodiment is the same as that of the fourth embodiment and hence the same effect can be achieved as in the fourth embodiment. Further, in the fifth embodiment, since the interblock signal propagation circuit is configured in the binary tree, equilength wiring is provided for all the in-block signal propagation circuits. Therefore, there is an effect that an SFQ pulse input from the upper end of the interblock signal propagation circuit can be propagated to all the in-block signal propagation circuits at the same time instant. Consequently, there is also an effect that the high-speed pipeline operation is enabled even in a word line or a bit line with larger-scale block configuration.

In the fifth embodiment, the three-stage pipeline is configured by inserting the latch circuits at the proper positions in the interblock signal propagation circuit of the binary tree structure. However, a two-stage pipeline or a four or more stage pipeline may be configured if necessary. On the other hand, when the circuit size is small, it is possible to achieve normal operation with no pipeline, without inserting the latch circuits.

Sixth Embodiment

Figure 6:
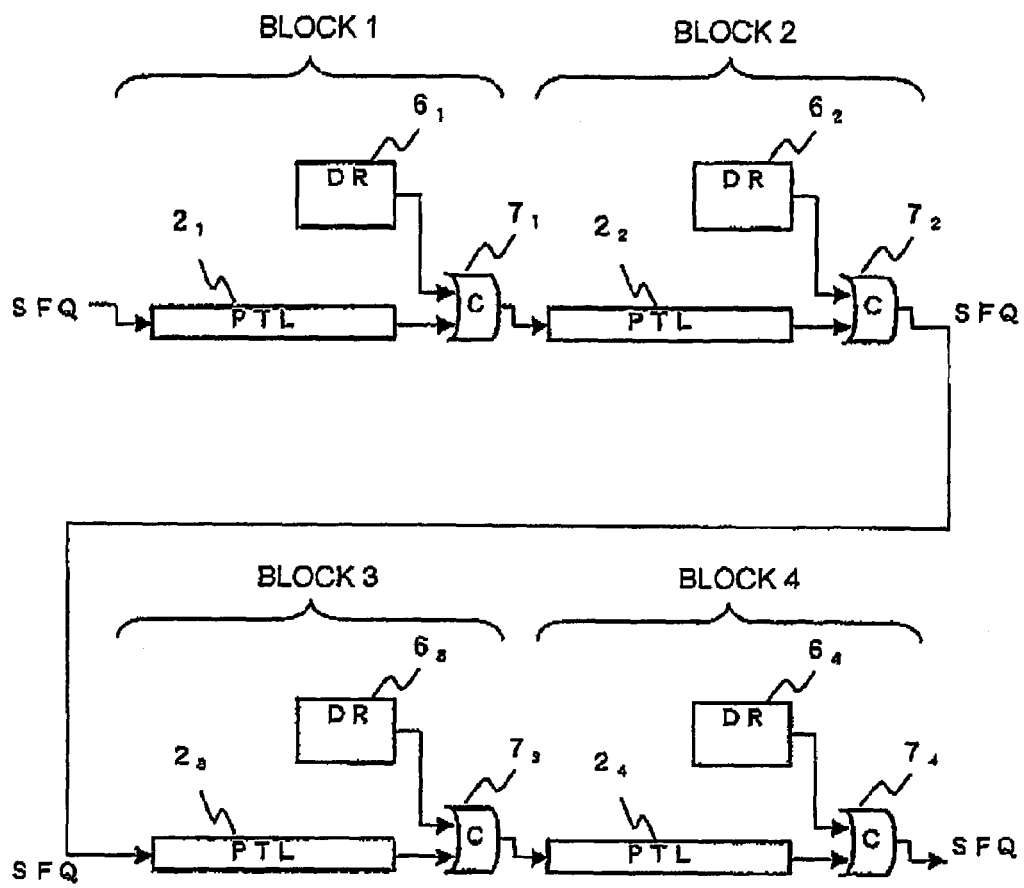
FIG. 6 is an equivalent circuit diagram for explaining the structure of a superconducting RAM according to a sixth embodiment of this invention and, more specifically, is an explanatory diagram showing the structure relating to a sense line configuration method.

Referring to FIG. 6, description will be made about a sixth embodiment of this invention.

FIG. 6 is an equivalent circuit diagram showing the structure of a superconducting RAM according to the sixth embodiment of this invention. The sixth embodiment is a first example relating to the structure of a sense line in the superconducting RAM.

At first, the structure and function of this circuit will be described.

The sixth embodiment comprises in-block signal propagation circuits (DR) $6_1$ to $6_4$, superconducting passive transmission lines (PTL) $2_1$ to $2_4$ adapted to carry out signal propagation between blocks, and confluence buffers (C) $7_1$ to $7_4$ each formed by a single flux quantum (SFQ) device and each adapted to receive a signal from a corresponding one of the superconducting passive transmission lines (PTL) $2_1$ to $2_4$ or a corresponding one of the in-block signal propagation circuits (DR) $6_1$ to $6_4$ and propagate it to the superconducting passive transmission line (PTL) of the next block. The sixth embodiment describes the case where the foregoing components are disposed in the number of four, respectively. The in-block signal propagation circuit (DR) $6_X$ comprises serially connected 32 memory cells and a sense circuit adapted to detect information from these memory cells and has a function of outputting an SFQ pulse corresponding to information held by the selected memory cell.

Now, the circuit operation of the sixth embodiment will be described.

At first, a memory cell designated by an address of a memory cell array is selected and information is read from the selected memory cell. In the sixth embodiment, description will be made about the case where the sense circuit of the in-block signal propagation circuit (DR) $6_2$ of the block 2 is selected and an SFQ pulse is output from this in-block signal propagation circuit (DR) $6_2$. The output SFQ pulse is input into the confluence buffer (C) $7_2$ and can be propagated at high speed to the right end in the figure through the superconducting passive transmission line (PTL) $2_3$, the confluence buffer (C) $7_3$, the superconducting passive transmission line (PTL) $2_4$, and the confluence buffer (C) $7_4$ serving as an interblock signal propagation circuit.

Also in this sixth embodiment, the interblock signal propagation circuit formed by the confluence buffers (C) each composed of the SFQ device and the superconducting passive transmission lines (PTL) carries out signal propagation at ultra-high speed (the speed of light corresponding to the permittivity) even when an SFQ pulse is output from any of the four in-block signal propagation circuits (DR), and hence the SFQ pulse signal can be delivered to an output end (the right end in the figure) with a slight time difference.

Through the foregoing operation, it is possible to configure the sense line of the superconducting RAM operable at ultra-high speed.

Seventh Embodiment

Figure 7:
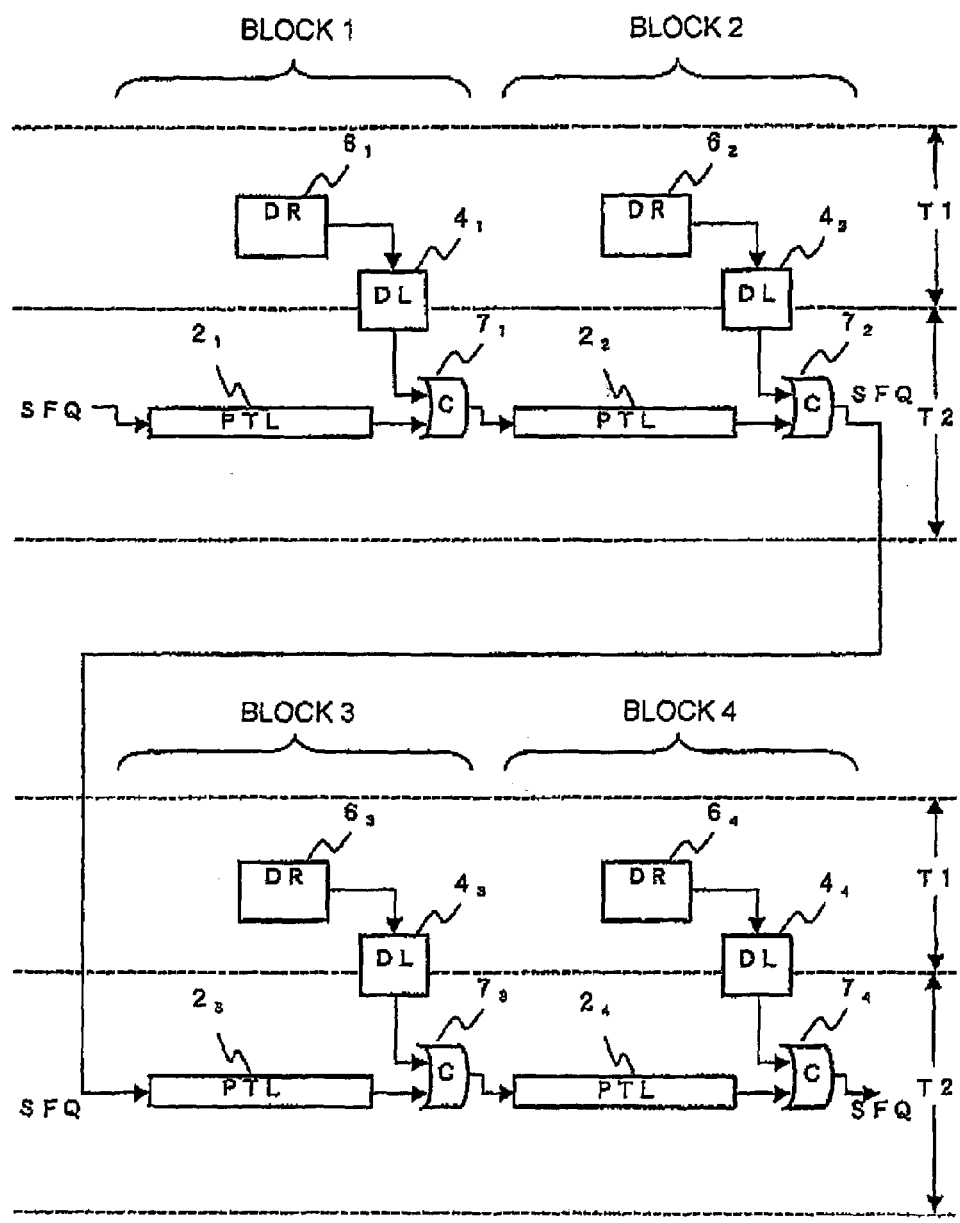
FIG. 7 is an equivalent circuit diagram for explaining the structure of a superconducting RAM according to a seventh embodiment of this invention and, more specifically, is an explanatory diagram showing the structure relating to a sense line configuration method.

Referring to FIG. 7, description will be made about a seventh embodiment of this invention.

FIG. 7 is an equivalent circuit diagram showing the structure of a superconducting RAM according to the seventh embodiment of this invention. The seventh embodiment is a second example relating to the structure of a sense line in the superconducting RAM.

At first, the structure and function of the circuit according to the seventh embodiment will be described.

The seventh embodiment comprises in-block signal propagation circuits (DR) $6_1$ to $6_4$, superconducting passive transmission lines (PTL) $2_1$ to $2_4$ adapted to carry out signal propagation between blocks, latch circuits (DL) $4_1$ to $4_4$ each formed by a single flux quantum (SFQ) device and each having a function of holding information, and confluence buffers (C) $7_1$ to $7_4$ each formed by a single flux quantum (SFQ) device and each adapted to receive a signal from a corresponding one of the superconducting passive transmission lines (PTL) $2_1$ to $2_4$ or a corresponding one of the latch circuits (DL) $4_1$ to $4_4$ and propagate it to the superconducting passive transmission line (PTL) of the next block.

The seventh embodiment describes the case where the foregoing components are disposed in the number of four, respectively. The in-block signal propagation circuit (DR) $6_X$ comprises serially connected 32 memory cells and a sense circuit adapted to detect information from these memory cells and has a function of outputting an SFQ pulse corresponding to information held by the selected memory cell.

The circuit of the seventh embodiment operates in a two-stage pipeline. In a clock period (T1) of the first stage, a memory cell designated by an address of a memory cell array is selected and information is read from the selected memory cell. In the seventh embodiment, description will be made about the case where the sense circuit of the in-block signal propagation circuit (DR) $6_2$ of the block 2 is selected and an SFQ pulse is output from this in-block signal propagation circuit (DR) $6_2$. The SFQ pulse output from the in-block signal propagation circuit (DR) $6_2$ is input into the latch circuit (DL) $4_2$ and held therein. In the next clock period (T2) of the second stage, when a clock signal is input into the four latch circuits (DL) $4_1$ to $4_4$, the latch circuit (DL) $4_2$ inputs the holding information into the confluence buffer (C) $7_2$. This information is propagated at high speed to the right end in the figure through the superconducting passive transmission line (PTL) $2_3$, the confluence buffer (C) $7_3$, the superconducting passive transmission line (PTL) $2_4$, and the confluence buffer (C) $7_4$, serving as an interblock signal propagation circuit, in the order named. In this manner, the information of the memory cell can be taken out at high speed.

It is possible to configure the sense line of the superconducting RAM operable at ultra-high speed in the two-stage pipeline, which has the foregoing function.

As described above, in the seventh embodiment, even when an SFQ pulse is output from any of the four in-block signal propagation circuits (DR), it is once held by the corresponding latch circuit (DL) and, from the beginning of the next clock period, the SFQ pulse signal can be propagated in the interblock signal propagation circuit formed by the confluence buffers (C) and the superconducting passive transmission lines (PTL). Therefore, in the seventh embodiment, there is an effect that higher-speed clock operation is enabled as compared with the sixth embodiment.

Eighth Embodiment

Figure 8:
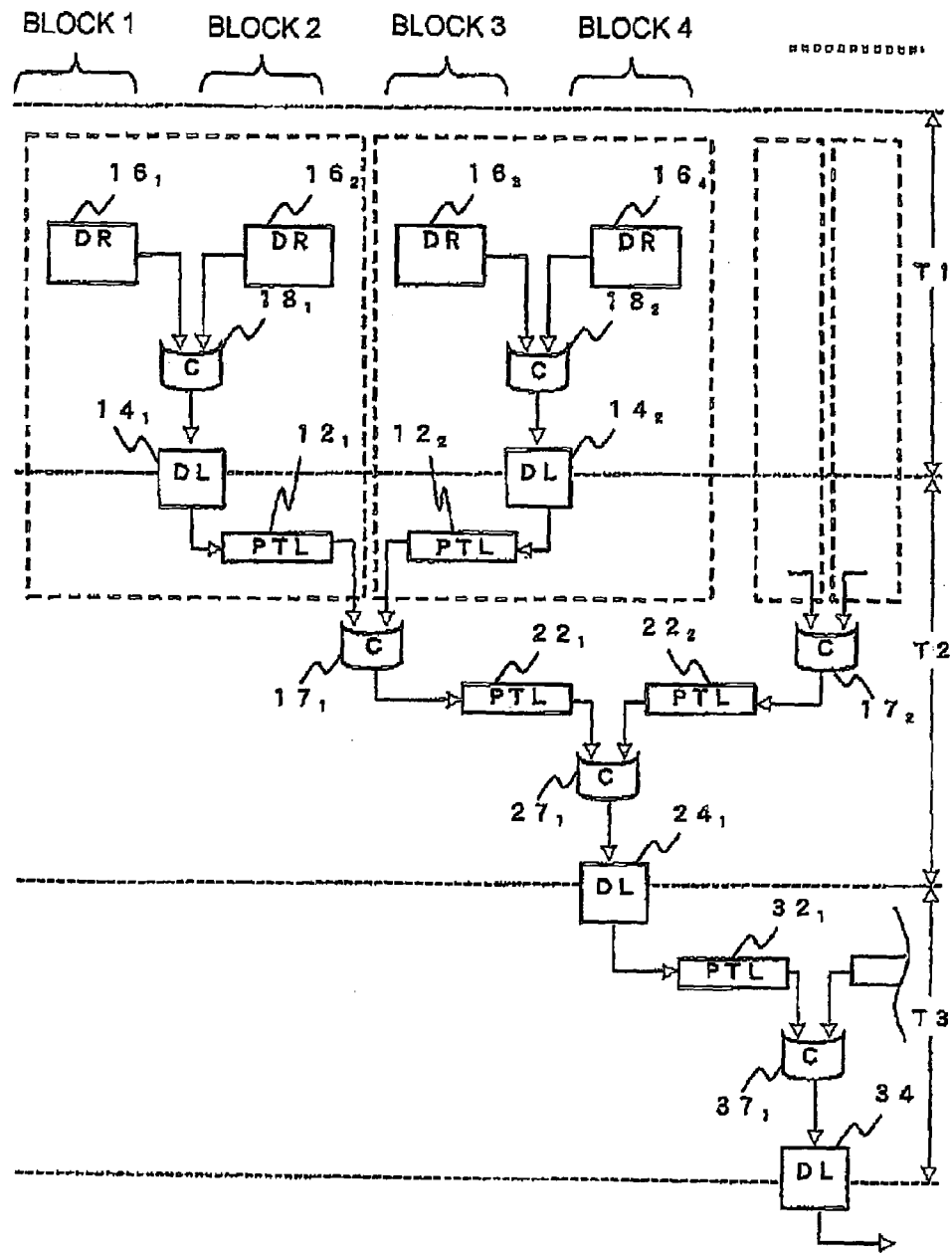
FIG. 8 is an equivalent circuit diagram for explaining the structure of a superconducting RAM according to an eighth embodiment of this invention and, more specifically, is an explanatory diagram showing the structure relating to a sense line configuration method.

Referring to FIG. 8, description will be made about an eighth embodiment of this invention.

FIG. 8 is an equivalent circuit diagram showing the structure of a superconducting RAM according to the eighth embodiment of this invention. The eighth embodiment is a third example relating to the structure of a sense line in the superconducting RAM.

At first, the structure and function of the circuit according to the eighth embodiment will be described.

The eighth embodiment is configured such that the interblock signal propagation circuit formed by the passive transmission lines (PTL) and the confluence buffers (C) in the seventh embodiment is arranged in a binary tree. In addition, this embodiment is set to operate in a three-stage pipeline by inserting latch circuits (DL) at proper positions in the interblock signal propagation circuit of the binary tree structure.

Now, description will be made about the structure of the eighth embodiment including a portion omitted in FIG. 8.

In a clock period (T1) of the first stage, in-block signal propagation circuits (DR) 16$_1$ to 16$_4$ are illustrated for blocks 1 to 4, respectively, while, in-block signal propagation circuits (DR) for blocks 5 to 16 are omitted. A confluence buffer (C) 18$_1$ receives SFQ pulses output from the two in-block signal propagation circuits (DR) 16$_1$ and 16$_2$ and outputs them to a latch circuit (DL) 14$_1$.

In a clock period (T2) of the second stage, the latch circuit (DL) 14$_1$ outputs the SFQ pulses to a confluence buffer (C) 17$_1$ through a passive transmission line (PTL) 12$_1$. The confluence buffer (C) 17$_1$ receives SFQ pulses in the blocks 3 and 4 from a latch circuit (DL) 14$_2$ through a passive transmission line (PTL) 12$_2$ and hence corresponds to the four blocks 1 to 4. Likewise, a confluence buffer (C) 17$_2$ receives SFQ pulses corresponding to the non-illustrated blocks 5 to 8. This also applies to a circuit corresponding to the non-illustrated blocks 9 to 16.

Further, in the second stage, there is a confluence buffer (C) 27$_1$ adapted to receive SFQ pulses from the confluence buffers (C) 17$_1$ and 17$_2$ corresponding to the blocks 1 to 8 through passive transmission lines (PTL) 22$_1$ and 22$_2$, respectively. The confluence buffer (C) 27$_1$ outputs the received SFQ pulses to a latch circuit (DL) 24$_1$. This also applies to a circuit corresponding to the blocks 9 to 16 which outputs SFQ pulses to a non-illustrated latch circuit (DL) 24$_2$.

In a clock period (T3) of the third stage, a confluence buffer (C) 37$_1$ receives the SFQ pulses from the latch circuits (DL) 24$_1$ and 24$_2$ through passive transmission lines (PTL) 32$_1$ and 32$_2$ (not shown), respectively, and outputs them to a latch circuit (DL) 34.

The operation of the circuit of the eighth embodiment as described above is the same as that of the seventh embodiment and hence the same effect can be achieved as in the seventh embodiment. Further, in the eighth embodiment, since the interblock signal propagation circuit is configured in the binary tree, equilength wiring is provided for all the in-block signal propagation circuits. Therefore, there is an effect that SFQ pulses output from the in-block signal propagation circuits at any positions can be propagated at substantially the same time instant. Consequently, there is also an effect that the high-speed pipeline operation is enabled even in a sense line with larger-scale block configuration.

In the eighth embodiment, the three-stage pipeline is configured by inserting the latch circuits (DL) at the proper positions in the interblock signal propagation circuit of the binary tree structure. However, a two-stage pipeline or a four or more stage pipeline may be configured if necessary. On the other hand, when the circuit size is small, it is possible to achieve normal operation with no pipeline, without inserting the latch circuits (DL).

Ninth Embodiment

Figure 9:
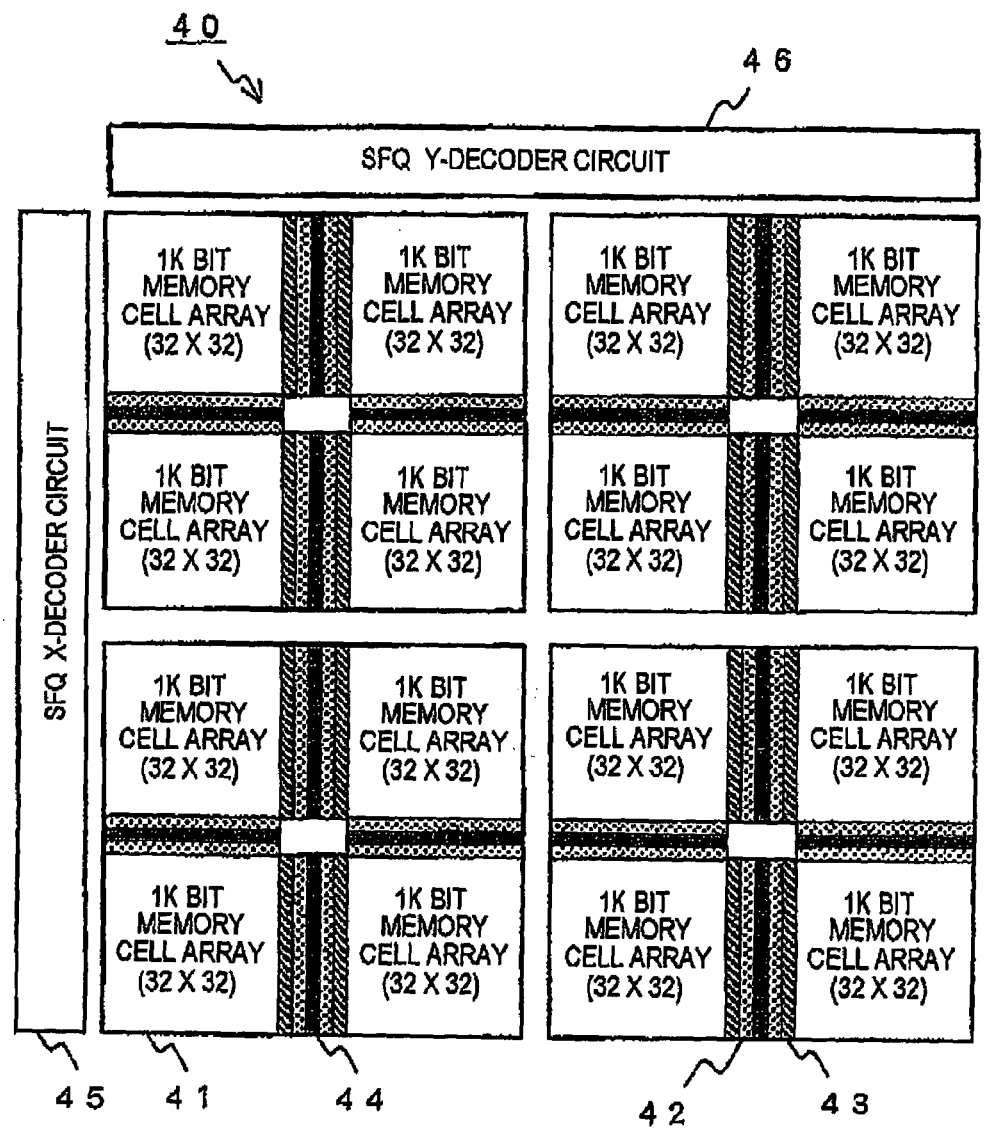
FIG. 9 is a block configuration diagram for explaining the structure of a superconducting RAM according to a ninth embodiment of this invention and is an explanatory diagram showing the structure of the superconducting RAM having a 16 kbit storage capacity.
Figure 10:
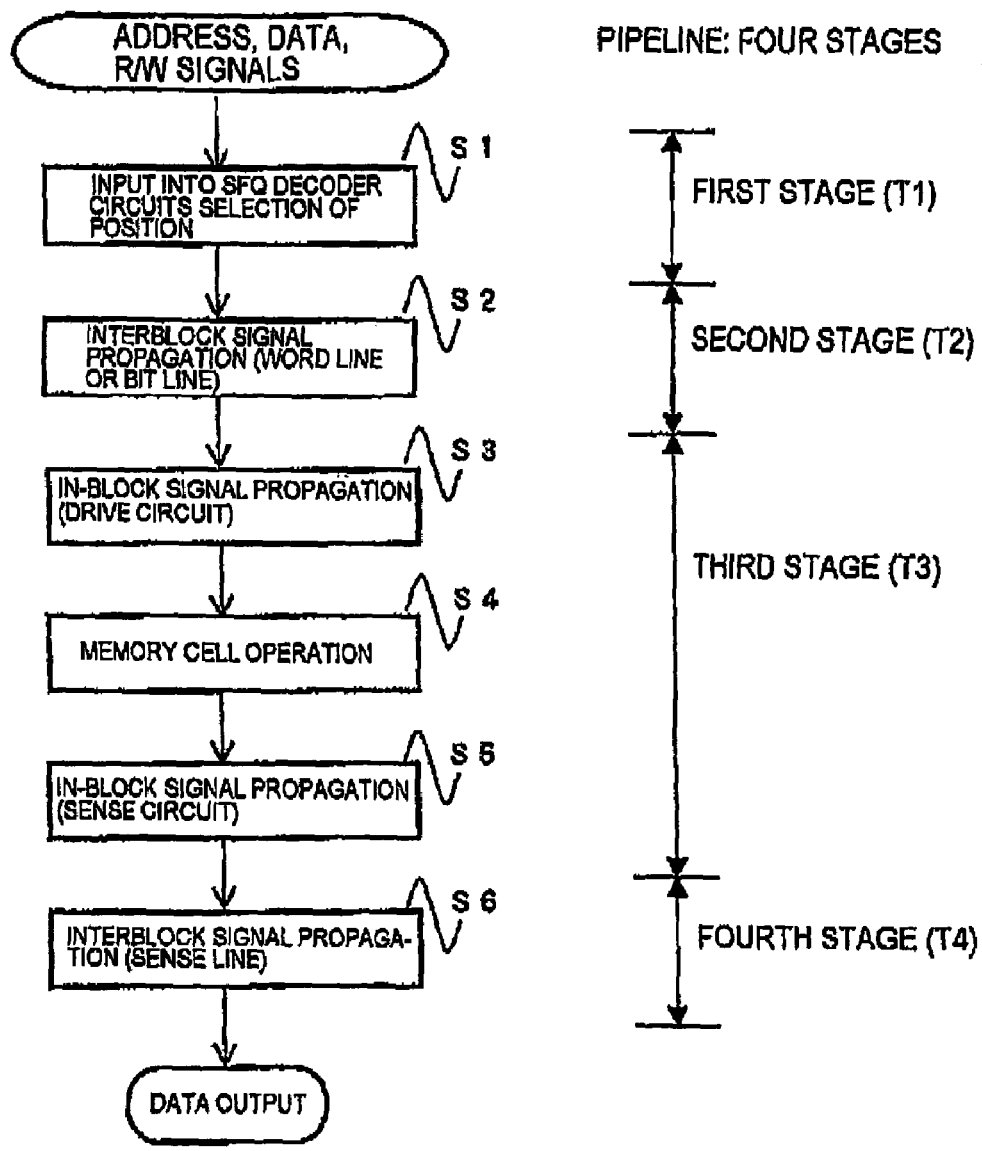
FIG. 10 is an explanatory diagram showing an outline of a signal propagation path and a pipeline structure for explaining the circuit operation in the structure of the superconducting RAM shown in FIG. 9.

Referring to FIGS. 9 and 10, description will be made about a ninth embodiment of this invention.

FIG. 9 is a block diagram showing the structure of a superconducting RAM 40 according to the ninth embodiment of this invention. The ninth embodiment is an embodiment where the superconducting RAM 40 having a 16 kbit storage capacity is configured by the structure of the word line or the bit line according to the foregoing second embodiment and the structure of the sense line according to the foregoing seventh embodiment in the superconducting RAM.

At first, the circuit structure and function according to the ninth embodiment will be described.

The superconducting RAM 40 in the ninth embodiment comprises 32-row 32-column 1 kbit memory cell array blocks 41 arranged in 4 lines and 4 columns, drive circuits 42 and sense circuits 43 adapted to carry out in-block signal propagation, line circuits 44 including splitters, confluence buffers, and latch circuits for interblock signal propagation, and two decoder circuits 45 and 46 for a row (X) direction and a column (Y) direction each formed by SFQ devices.

Although not shown in FIG. 9, row (X)-direction and column (Y)-direction passive transmission lines (PTL) are connected through the line circuits 44 including the splitters, the confluence buffers, and the latch circuits so that row (X)-direction word lines and sense lines and column (Y)-direction bit lines are configured, respectively. Further, all the components are set to operate with a DC power supply.

Now, referring to FIG. 10, the operation of the ninth embodiment will be briefly described. FIG. 10 shows a signal propagation path and a pipeline structure of the superconducting RAM of the ninth embodiment.

In a clock period (T1) of the first stage, input signals (SFQ pulses) such as an address signal, a data signal, and a read/write (R/W) signal are input into the SFQ decoder circuits 45 and 46 and selection is made of a position designated by the address signal in the row (X) and column (Y) directions (step S1 in FIG. 10).

In a clock period (T2) of the second stage, as interblock signal propagation, SFQ pulses output from the decoder circuits 45 and 46 are propagated to a word line or a bit line relating to the selected row and column and held by a latch circuit disposed immediately preceding an in-block signal propagation circuit (DR) (step S2 in FIG. 10).

In a clock period (T3) of the third stage, a drive circuit of the in-block signal propagation circuit (DR) operates to carry out signal propagation for writing or reading data with respect to a selected memory cell (step S3 in FIG. 10) and the memory cell carries out a corresponding operation (step S4 in FIG. 10). In the case of a read operation, simultaneously at this time, a sense circuit of the in-block signal propagation circuit (DR) propagates data read from the selected memory cell, so that the data is held in a latch circuit connected to the sense circuit (step S5 in FIG. 10).

In a clock period (T4) of the fourth stage, the data signal held in the latch circuit is output so as to be propagated to an output end by interblock signal propagation of the sense line (step S6 in FIG. 10).

In this manner, in the ninth embodiment, the 16 kbit superconducting RAM is configured with the four-stage pipeline.

In the ninth embodiment, the number of drive circuits and sense circuits relating to in-block signal propagation increases due to the division of the memory cell array, but, since the decoder circuits are not divided, the number of elements of the decoder circuits does not increase. Therefore, as compared with the case where the division is carried out including the decoder circuits like in the conventional technique, there is an effect that the number of elements decreases and hence the layout area and the power consumption can be reduced.

In the ninth embodiment, aiming at 10 GHz clock operation, each divided block is formed as the 32-row 32-column 1 kbit memory cell array. However, the size of each block can be optionally set. For example, if the size of each block is set to 16 rows and 16 columns, although the number of circuits relating to in-block signal propagation following the division increases, higher-speed operation close to 20 GHz is enabled. On the other hand, if the size of each block is set to 64 rows and 64 columns, although the number of circuits relating to in-block signal propagation following the division decreases, the clock frequency is confined to 5 GHz or so.

As described above, according to the ninth embodiment, it is possible to realize the 16 kbit superconducting RAM operable with a DC power supply and at ultra-high speed and ultra-low power consumption.

Tenth Embodiment

Figure 11:
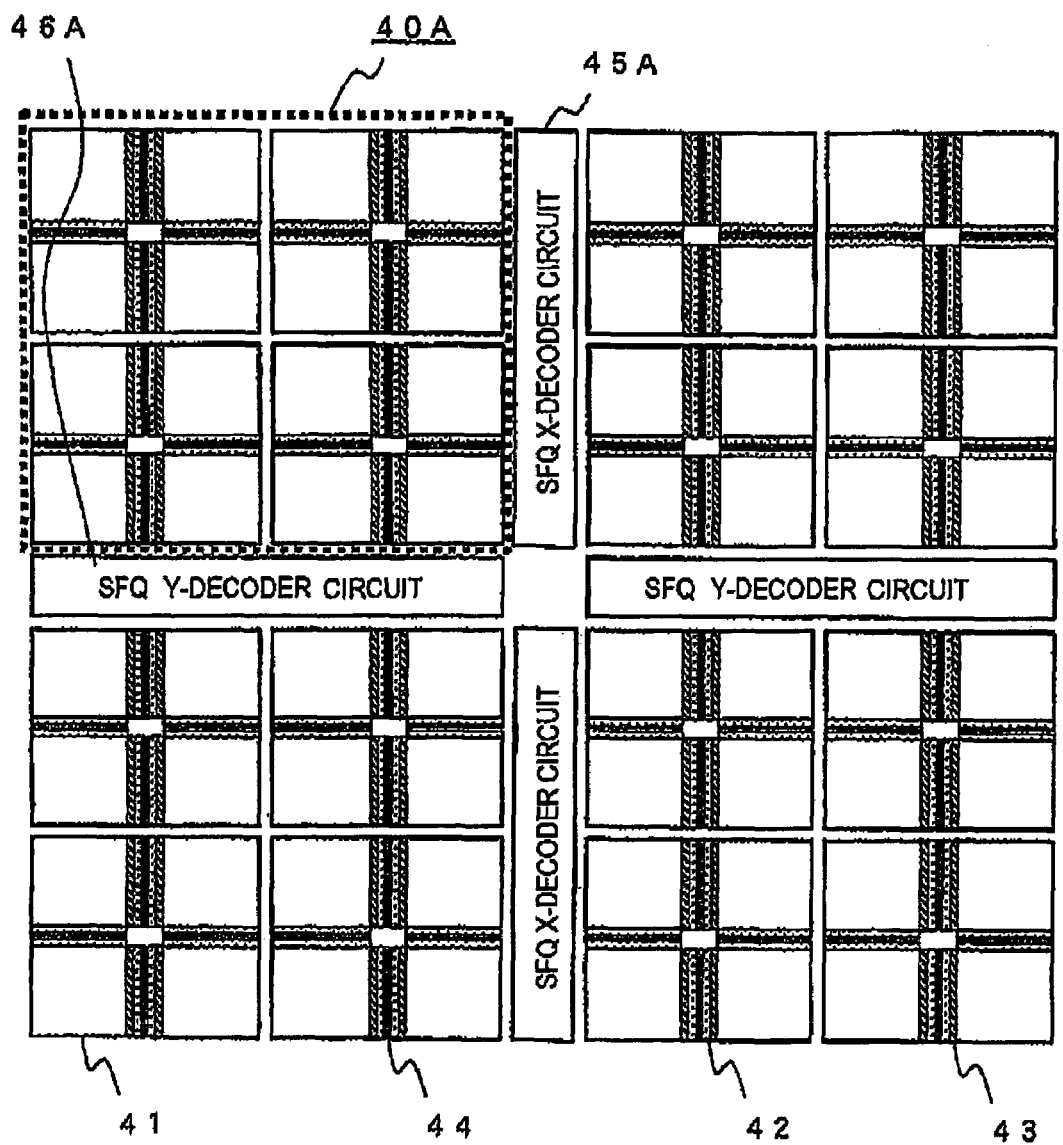
FIG. 11 is a block configuration diagram for explaining the structure of a superconducting RAM according to a tenth embodiment of this invention and is an explanatory diagram showing the structure of the superconducting RAM having a 64 kbit storage capacity.

Referring to FIG. 11, description will be made about a tenth embodiment of this invention.

FIG. 11 is a block diagram showing the structure of a superconducting RAM according to the tenth embodiment of this invention. In the tenth embodiment, four superconducting RAMs 40A each being the same as the 16 kbit superconducting RAM 40 shown in the foregoing ninth embodiment are disposed and decoder circuits are disposed at center portions in lateral and vertical directions, respectively, and shared by the adjacent 16 kbit blocks. Accordingly, the superconducting RAM having a 64 kbit storage capacity is configured.

The tenth embodiment is entirely the same, in terms of the circuit operation, as a structure in which four 16 kbit superconducting RAMs 40 of the ninth embodiment are arranged in parallel, and hence, even if the circuit scale is increased four times, it can be operated in the same four-stage pipeline and at the same clock frequency as in the ninth embodiment. Therefore, there is an effect that the same effect is obtained as in the ninth embodiment and further it is possible to configure the 64 kbit superconducting RAM which is four times in storage capacity. In addition, there is also an effect that, by disposing the decoder circuits at the center portions in the lateral and vertical directions, respectively, and sharing them by the adjacent 16 kbit blocks, the number of decoder circuits can be reduced as compared with the case where four 16 kbit superconducting RAMs are simply arranged in parallel.

Eleventh Embodiment

Figure 12:
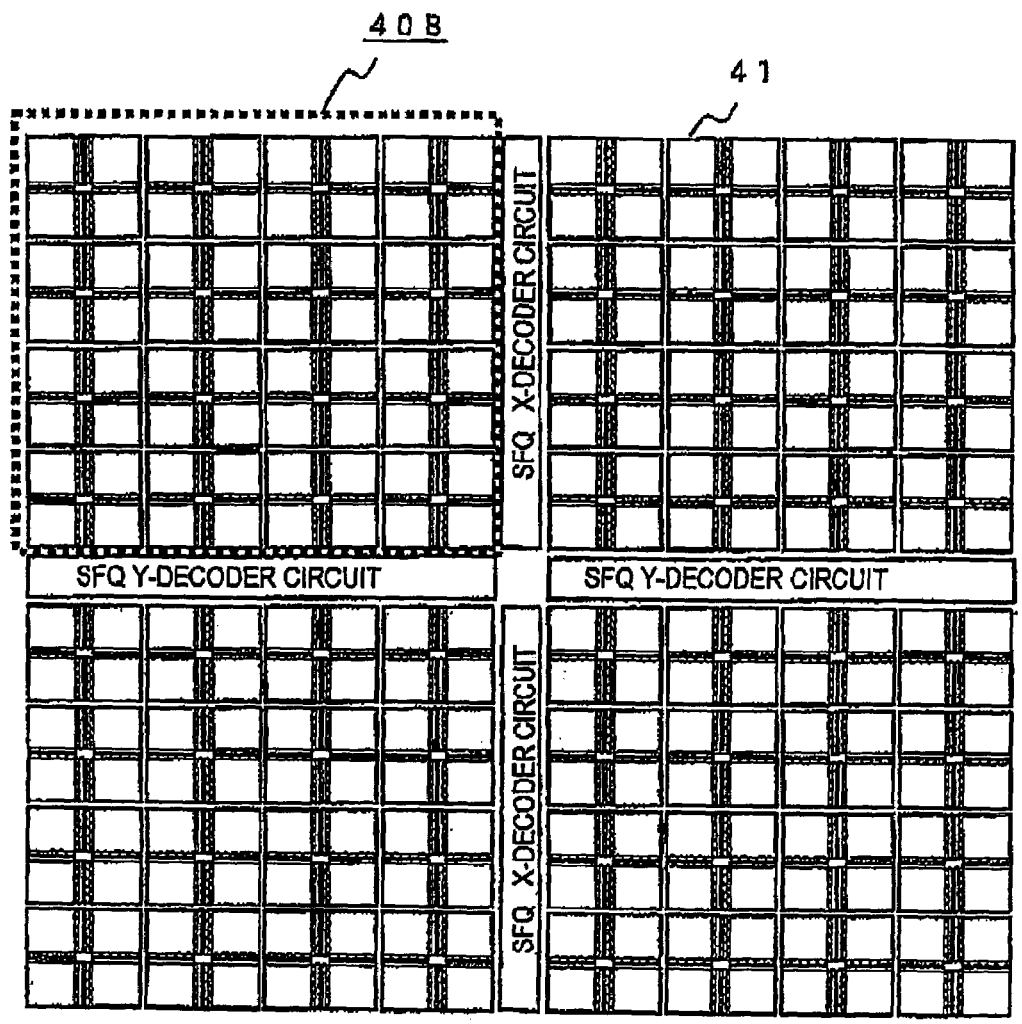
FIG. 12 is a block configuration diagram for explaining the structure of a superconducting RAM according to an eleventh embodiment of this invention and is an explanatory diagram showing the structure of the superconducting RAM having a 256 kbit storage capacity.

Referring to FIG. 12, description will be made about an eleventh embodiment of this invention.

FIG. 12 is a block configuration diagram showing the structure of a superconducting RAM according to the eleventh embodiment of this invention. The eleventh embodiment is an embodiment where the superconducting RAM having a 256 kbit storage capacity is configured by the structure of the word line or the bit line according to the foregoing fifth embodiment and the structure of the sense line according to the foregoing eighth embodiment.

At first, the circuit structure and function of the eleventh embodiment will be described.

In the eleventh embodiment, at first, based on the ninth embodiment, 32-row 32-column 1 kbit memory cell array blocks 41 are arranged in 8 lines and 8 columns, thereby configuring a 64 kbit superconducting RAM 40B comprising drive circuits and sense circuits for in-block signal propagation, splitters, confluence buffers, and latch circuits for interblock signal propagation, and two decoder circuits for a row (X) direction and a column (Y) direction each formed by SFQ devices. Then, based on the tenth embodiment, four 64 kbit superconducting RAMs 40B are arranged and decoder circuits are arranged at center portions in lateral and vertical directions, respectively, and shared by the adjacent 64 kbit blocks. As a result, it is possible to configure a superconducting RAM having a 256 kbit storage capacity.

Since the circuit operation in the eleventh embodiment is the same as those in the ninth and tenth embodiments and the size of the minimum divided block is also the 32-row 32-column 1 kbit memory cell array 41, it can be operated at the same clock frequency of 10 GHz and the same effect is also obtained. However, since the circuit scale is increased, i.e. the number of divided blocks is increased, interblock signal propagation takes time. In view of this, as shown by a pipeline structure in FIG. 13, two-stage pipeline periods are set for interblock signal propagation. Therefore, the pipeline of the entire 256 kbit superconducting RAM has six stages.

Figure 13:
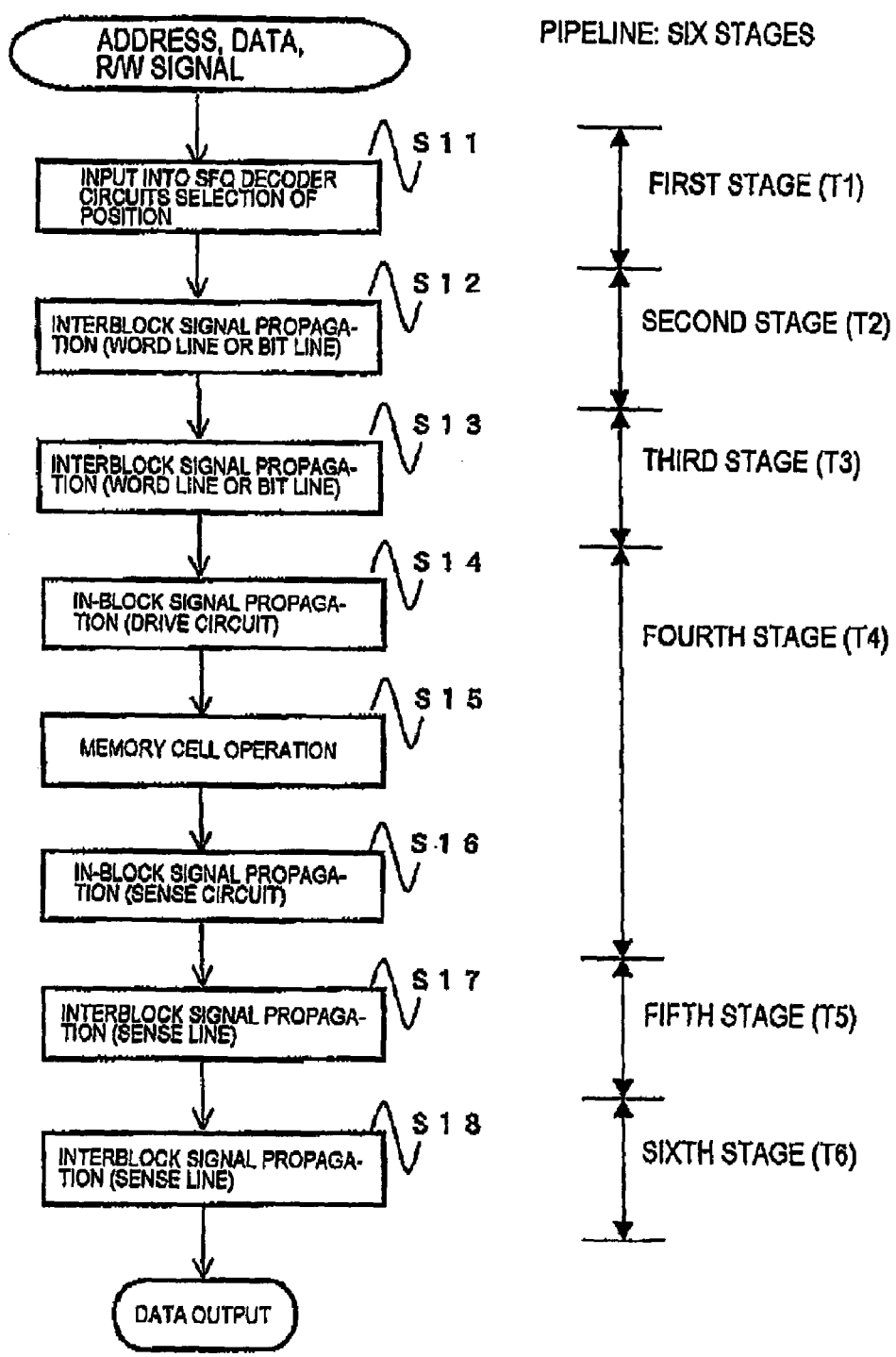
FIG. 13 is an explanatory diagram showing an outline of a signal propagation path and a pipeline structure for explaining the circuit operation in the structure of the superconducting RAM shown in FIG. 12.

FIG. 13 shows the signal propagation path and the pipeline structure of the superconducting RAM in the eleventh embodiment.

In a clock period (T1) of the first stage, input signals (SFQ pulses) such as an address signal, a data signal, and a read/write (R/W) signal are input into the SFQ decoder circuits and selection is made of a position designated by the address signal in the row (X) and column (Y) directions (step S11 in FIG. 13).

In a clock period (T2) of the second stage, as interblock signal propagation, SFQ pulses output from the decoder circuits are propagated to a former part of a word line or a bit line relating to the selected row and column and held by a latch circuit disposed midway in the word line or the bit line (step S12 in FIG. 13).

In a clock period (T3) of the third stage, as interblock signal propagation, the SFQ pulses held by the latch circuit are propagated to a latter part of the word line or the bit line and held by a latch circuit disposed immediately preceding an in-block signal propagation circuit (DR) (step S13 in FIG. 13).

In a clock period (T4) of the fourth stage, a drive circuit of the in-block signal propagation circuit (DR) operates to carry out signal propagation for writing or reading data with respect to a selected memory cell (step S14 in FIG. 13) and the memory cell carries out a corresponding operation (step S15 in FIG. 13). In the case of a read operation, simultaneously at this time, a sense circuit of the in-block signal propagation circuit (DR) propagates data read from the selected memory cell, so that the data is held in a latch circuit connected to the sense circuit (step S16 in FIG. 13).

In a clock period (T5) of the fifth stage, as interblock signal propagation, the data signal held in the latch circuit is output so as to be propagated to a former part of a sense line and is held by a latch circuit disposed midway in the sense line (step S17 in FIG. 13).

In a clock period (T6) of the sixth stage, as interblock signal propagation, the data signal held in the latch circuit disposed midway in the sense line is output so as to be propagated to an output end through a latter part of the sense line (step S18 in FIG. 13).

As described above, according to the configuration of the word line, bit line, and sense line of the superconducting RAM of this invention, there is an effect that even when the large-scale superconducting RAM is configured, if the size of the memory cell array as the minimum division unit is set constant, the large-scale superconducting RAM can be configured while maintaining, for example, an ultra-high speed clock frequency of 10 GHz. In this case, since the time required for interblock signal propagation increases as the number of divided blocks increases, the ultra-high speed clock operation of 10 GHz is ensured by increasing the number of pipeline stages used for the interblock signal propagation.

Now, specific embodiments of superconducting drive circuits of this invention will be described with reference to the drawings.

Twelfth Embodiment

Figure 14:
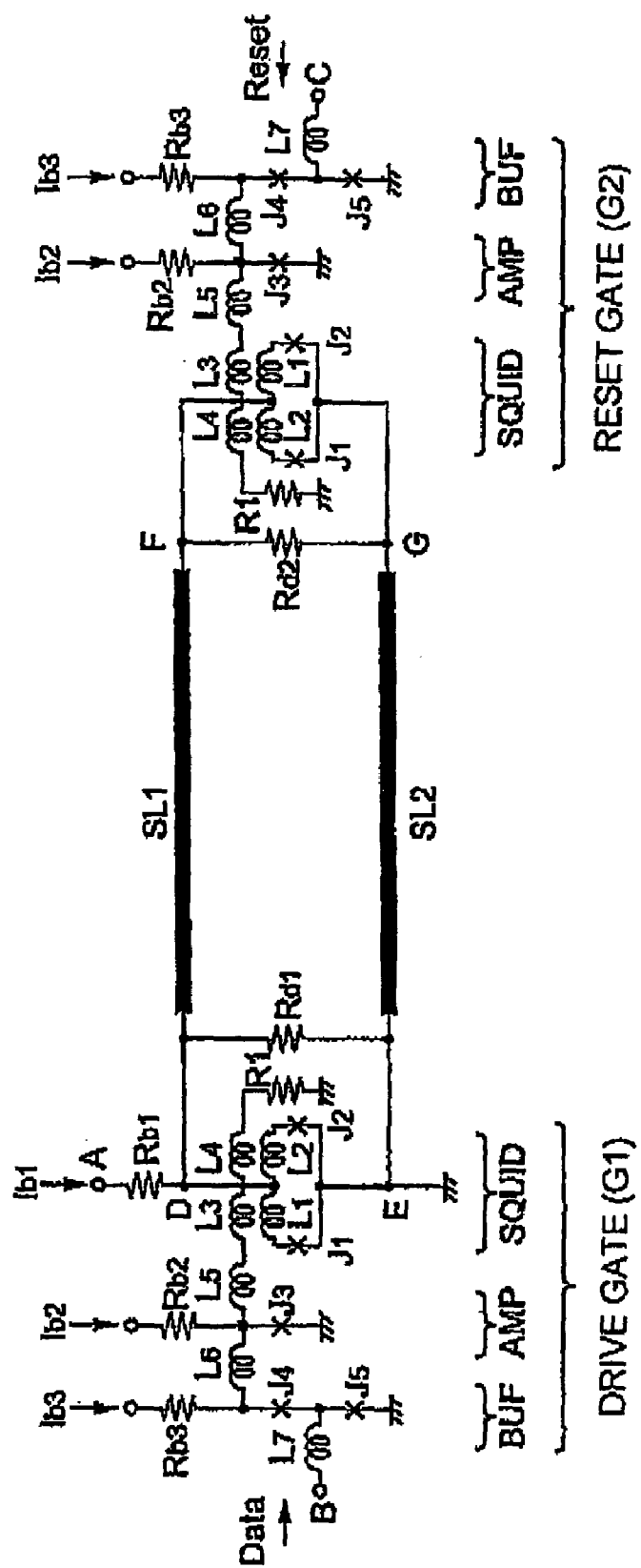
FIG. 14 is an equivalent circuit diagram for explaining a superconducting drive circuit according to a twelfth embodiment of this invention.

FIG. 14 is an equivalent circuit diagram showing a superconducting drive circuit (first example) according to a twelfth embodiment of this invention. At first, the structure and function of this superconducting drive circuit will be described.

The superconducting drive circuit according to the twelfth embodiment comprises a drive gate (G1), a reset gate (G2), superconducting striplines (SL1) and (SL2), a damping resistance ($R_{d1}$), a damping resistance ($R_{d2}$), and a bias resistance ($R_{b1}$). The drive gate (G1) and the damping resistance ($R_{d1}$) are connected between a signal output end (D) and a bias current output end (E). The reset gate (G2) and the damping resistance ($R_{d2}$) are connected between a connection end (F) and a connection end (G). The superconducting stripline (SL1) is connected between the signal output end (D) and the connection end (F), and the superconducting stripline (SL2) is connected between the bias current output end (E) and the connection end (G). The bias current output end (E) is grounded and supplied with a DC bias current of a predetermined value through the bias resistance ($R_{b1}$) connected to a bias current input end (A). The superconducting stripline (SL1), a magnetic coupling quantum interference gate (SQUID) of the reset gate (G2), and the superconducting stripline (SL2) constitute a loop circuit that serves as a driven line.

Figure 15:
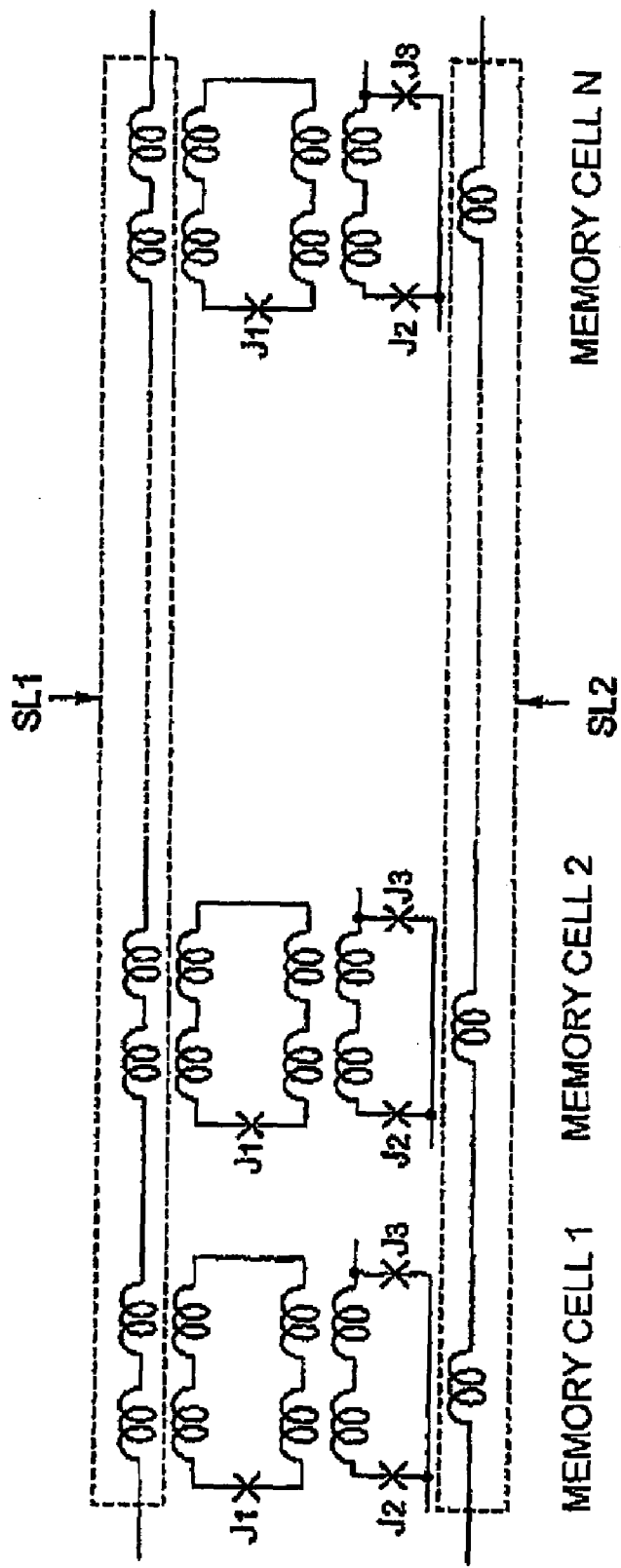
FIG. 15 is an equivalent circuit diagram in the case where superconducting striplines (SL1, SL2) in the superconducting drive circuit shown in FIG. 14 are formed by portions of a memory cell array.

The superconducting striplines (SL1, SL2) are schematically shown in FIG. 14 but, more specifically, are formed by portions of a memory cell array as shown in FIG. 15. In FIG. 15, the superconducting stripline (SL1) is a control wire disposed so as to be magnetically coupled to a superconducting loop including a Josephson junction ($J_1$) and corresponds to a word line that drives the memory cell array. The superconducting stripline (SL2) corresponds to a return line of this control wire.

The drive gate (G1) and the reset gate (G2) have the same circuit structure. This circuit comprises an amplifying gate (AMP) that produces at least two flux quanta in response to input of a single flux quantum (SFQ pulse), a buffer gate (BUF) for preventing the produced flux quantum from flowing back to the input side, and a magnetic coupling quantum interference gate (SQUID) that temporarily switches to the voltage state by the flux quantum output from the amplifying gate (AMP).

The magnetic coupling quantum interference gate (SQUID) comprises a superconducting loop formed by two Josephson junctions ($J_1$, $J_2$) each having a McCumber coefficient of 50 or more and inductances ($L_1$, $L_2$), and a control wire (inductances ($L_3$, $L_4$)) disposed so as to be magnetically coupled to the superconducting loop. The amplifying gate (AMP) comprises a Josephson junction ($J_3$) having a McCumber coefficient of approximately 5 to 10 and a bias resistance ($R_{b2}$). The buffer gate (BUF) comprises two Josephson junctions ($J_4$, $J_5$) each having a McCumber coefficient of approximately 1 and a bias resistance ($R_{b3}$). DC bias currents of predetermined values are supplied to the amplifying gate (AMP) and the buffer gate (BUF) through the bias resistance ($R_{b2}$) and the bias resistance ($R_{b3}$), respectively. $R_1$ is a load resistance of the amplifying gate (AMP) and also serves to adjust the characteristic of the amplifying gate (AMP) that produces a plurality of SFQ pulses.

Figure 16:
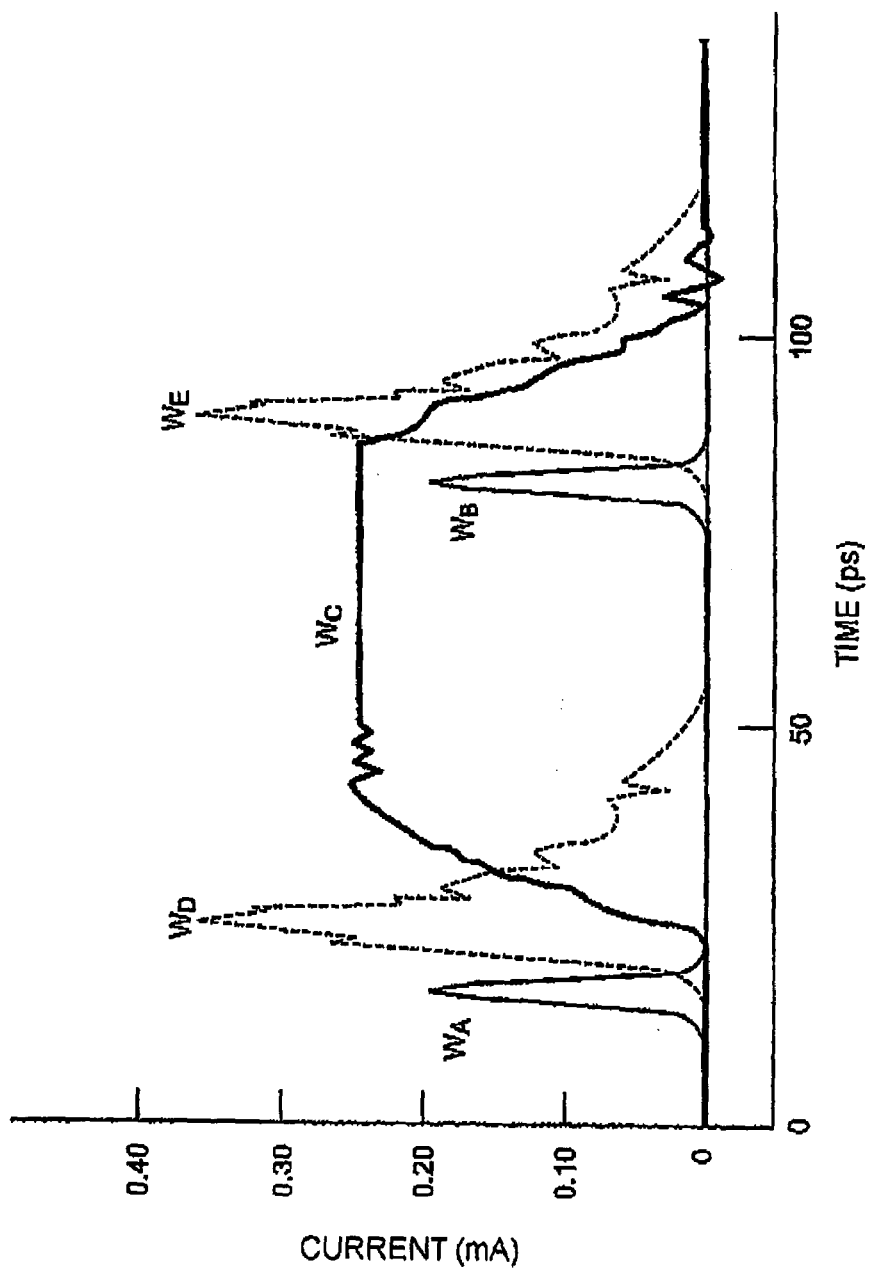
FIG. 16 is a schematic diagram of operation waveforms for explaining the operation of the superconducting drive circuit shown in FIG. 14.

FIG. 16 is a schematic diagram of operation waveforms of the superconducting drive circuit according to the twelfth embodiment. Based on the operation waveforms, the circuit operation of the twelfth embodiment will be described. In FIG. 16, the axis of ordinates represents a current value (mA), while the axis of abscissas represents a time (ps). Operation waveforms $W_A$ and $W_B$ indicated by thin solid lines are an SFQ pulse waveform input at a data signal input end (B) of the drive gate (G1) and an SFQ pulse waveform input at a reset signal input end (C) of the reset gate (G2), respectively. Operation waveforms $W_D$ and $W_E$ indicated by broken lines are a current waveform (a plurality of SFQ pulses are combined to form a waveform like a single mountain) that flows in the control wire of the magnetic coupling quantum interference gate (SQUID) of the drive gate (G1) and a current waveform that flows in the control wire of the magnetic coupling quantum interference gate (SQUID) of the reset gate (G2), respectively. An operation waveform $W_C$ indicated by a thick solid line is a current waveform that flows in the loop circuit being the driven line.

An SFQ pulse (waveform of $W_A$ in FIG. 16) input at the data signal input end (B) of the drive gate (G1) is input to the Josephson junction ($J_5$) of the buffer gate (BUF) through an inductance ($L_7$) and hence the Josephson junction ($J_5$) temporarily switches to the voltage state. As a result, the SFQ pulse is input to the Josephson junction ($J_3$) of the amplifying gate (AMP) through the Josephson junction ($J_4$) and an inductance ($L_6$). In this event, since the McCumber coefficient of the Josephson junction ($J_3$) is set to approximately 5 to 10, it produces a plurality of SFQ pulses. The plurality of SFQ pulses (waveform of $W_D$ in FIG. 16) produced at the amplifying gate (AMP) are injected into the control wire (inductances ($L_3$, $L_4$)) of the magnetic coupling quantum interference gate (SQUID) through an inductance ($L_5$), so that the magnetic coupling quantum interference gate (SQUID) switches to the voltage state. As a result, the DC bias current flowing to ground through the magnetic coupling quantum interference gate (SQUID) starts to flow to the superconducting stripline (SL1) (rise region of current waveform of $W_C$ in FIG. 16). This current flows to ground through the magnetic coupling quantum interference gate (SQUID) of the reset gate (G2) and the return superconducting stripline (SL2) (flat region of waveform of $W_C$ in FIG. 16).

Through the foregoing operation, it is possible to cause the constant current to flow in the loop circuit being the driven line by the input of the SFQ pulse. Since the loop circuit being the driven line maintains the superconducting state unless the reset gate (G2) switches to the voltage state, the magnetic coupling quantum interference gate (SQUID) of the drive gate (G1) is automatically reset to the superconducting state at the time instant when it starts to feed the bias current to the loop circuit being the driven line. Then, when an SFQ pulse (waveform of $W_B$ in FIG. 16) is input at the reset signal input end (C) of the reset gate (G2), a plurality of SFQ pulses (waveform of $W_E$ in FIG. 16) are produced at the amplifying gate (AMP) of the reset gate (G2) through the same operation as described above, so that the magnetic coupling quantum interference gate (SQUID) of the reset gate (G2) switches to the voltage state. As a result, the current flowing in the loop circuit being the driven line is reduced to zero (fall region of current waveform of $W_C$ in FIG. 16) and starts to flow to ground through the magnetic coupling quantum interference gate (SQUID) of the drive gate (G1) again. The magnetic coupling quantum interference gate (SQUID) of the reset gate (G2) is automatically reset to the superconducting state at the time instant when it reduces the current flowing in the loop circuit to zero and returns it to the drive gate (G1). The damping resistance ($R_{d1}$) is a resistance for adjusting a damping condition when the drive gate (G1) switches to the voltage state and, by adjusting this resistance value, it is possible to cause a desired output current to flow in the loop circuit being the driven line. The damping resistance ($R_{d2}$) is a resistance for adjusting a damping condition when the reset gate (G2) switches to the voltage state and, by adjusting this resistance value, the current flowing in the loop circuit being the driven line can be reduced to zero.

Through the foregoing operation, it is possible to realize the superconducting drive circuit operable with a DC power supply, which operates by input of an SFQ pulse to output a predetermined level signal.

In FIG. 14, specific circuit constants can be set, for example, as follows:

$J_1$=0.16 mA, $J_2$=0.16 mA, $J_3$=0.25 mA, $J_4$=0.18 mA, $J_5$=0.25 mA, $L_1$=2.6 pH, $L_2$=2.6 pH, $L_3$=4 pH, $L_4$=4 pH, $L_5$=0.5 pH, $L_6$=1 pH, $L_7$=2 pH, $M_1$=2 pH, $M_2$=2 pH, $R_{d1}$=75 Ω, $R_{d2}$=75 Ω, $R_1$=0.5 Ω, $I_{b1}$=0.2 mA, $I_{b2}$=0.2 mA, and $I_{b3}$=0.15 mA.

Herein, all the Josephson junctions are each assumed to be an Nb/AlO$_x$/Nb junction with critical current density $J_C$=10 kA/cm$^2$ and junction characteristic index $V_m$=10 mV. The Josephson junctions $J_1$ and $J_2$ are set to operate with McCumber coefficient $\beta$=182, the Josephson junction $J_3$ with McCumber coefficient $\beta$=10, and the Josephson junctions $J_4$ and $J_5$ with McCumber coefficient $\beta$=1. $M_1$ is a mutual inductance between the inductance $L_1$ and the inductance $L_3$, and $M_2$ is a mutual inductance between the inductance $L_2$ and the inductance $L_4$. In the twelfth embodiment, it is assumed that the superconducting stripline being the driven line is the control wire or the return line of the memory cell array shown in FIG. 15. The characteristic impedance $Z_0$ of the control wire or the return line in this case is not exactly constant, but is assumed to be $Z_0$=25 Ω as an average value.

As described above, according to the twelfth embodiment, there is an effect that it is possible to realize the superconducting drive circuit operable with a DC power supply, which operates by input of a single flux quantum (SFQ) pulse as a data signal and a reset signal to thereby output a predetermined level signal.

In the twelfth embodiment, the driven line is assumed to be the control wire or the return line of the memory cell array. However, the same effect can be achieved with respect to a line of an optional structure as long as it is a superconducting line not including a resistance in series. Further, in the twelfth embodiment, the characteristic impedance of the superconducting stripline (SL1) and that of the superconducting stripline (SL2) are equally set to 25 Ω. However, even if the characteristic impedances differ from each other, the same effect can be easily obtained by adjusting the values of the damping resistances.

In the twelfth embodiment, the magnetic coupling quantum interference gate (SQUID) composed of two Josephson junctions is used. However, use may be made of a magnetic coupling quantum interference gate (SQUID) composed of three Josephson junctions.

Further, in the twelfth embodiment, the reset gate (G2) is connected between the superconducting stripline (SL1) and the superconducting stripline (SL2). However, the same effect can be achieved by disposing the reset gate (G2) at an optional position in the superconducting stripline (SL1) or at an optional position in the superconducting stripline (SL2).

Further, in the twelfth embodiment, the drive gate (G1) and the reset gate (G2) are each formed by the amplifying gate (AMP), the buffer gate (BUF), and the magnetic coupling quantum interference gate (SQUID). However, if an SFQ circuit in the preceding stage of the superconducting drive circuit of this invention has a structure that allows a backflow of SFQ pulses, the same effect can be achieved even when the drive gate (G1) and the reset gate (G2) are each formed only by the amplifying gate (AMP) and the magnetic coupling quantum interference gate (SQUID).

Thirteenth Embodiment

Figure 17:
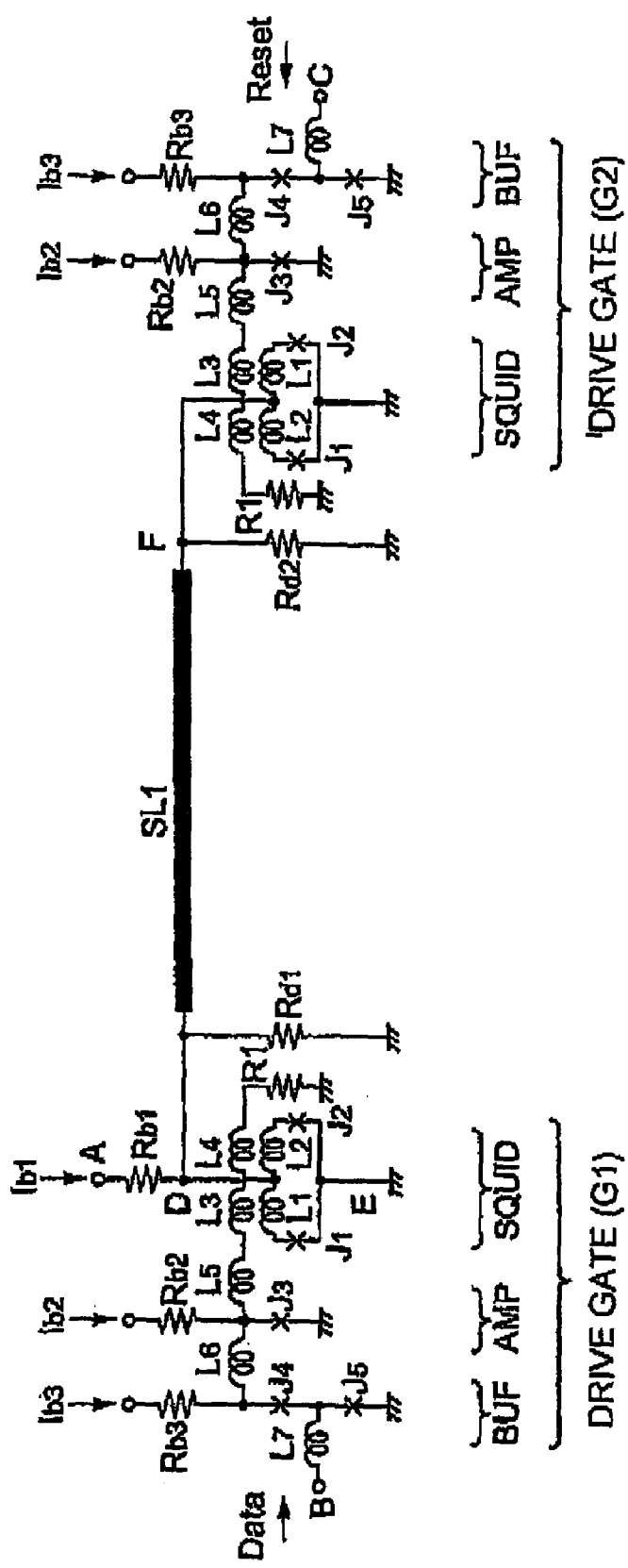
FIG. 17 is an equivalent circuit diagram for explaining a superconducting drive circuit according to a thirteenth embodiment of this invention.

FIG. 17 is an equivalent circuit diagram showing a superconducting drive circuit (second example) according to a thirteenth embodiment of this invention. The thirteenth embodiment is characterized in that there is no superconducting stripline (SL2) being the return line in the structure of the twelfth embodiment and the connection end (G) of the reset gate (G2) is grounded. The same components as those shown in FIG. 14 are assigned the same reference numerals or symbols.

The operation of the circuit of the thirteenth embodiment is the same as that of the twelfth embodiment and hence the same effect can be achieved as in the twelfth embodiment. Further, since there is no superconducting stripline (SL2) serving as the return line, there is also an effect that the inductance of the entire driven line is reduced so that high-speed operation is enabled as compared with the twelfth embodiment.

Fourteenth Embodiment

Figure 18:
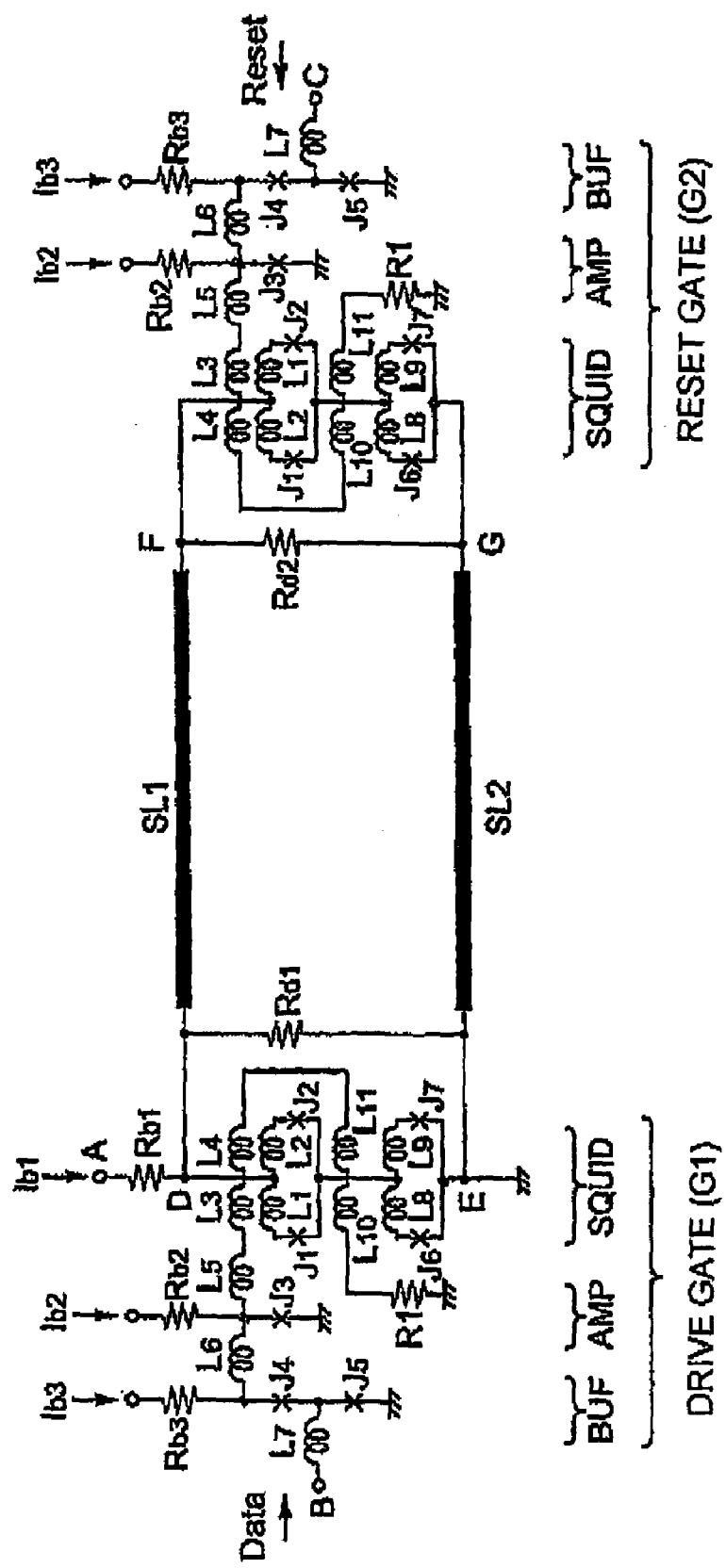
FIG. 18 is an equivalent circuit diagram for explaining a superconducting drive circuit according to a fourteenth embodiment of this invention.

FIG. 18 is an equivalent circuit diagram showing a superconducting drive circuit (third example) according to a fourteenth embodiment of this invention. The fourteenth embodiment is characterized in that the magnetic coupling quantum interference gate (SQUID) of each of the drive gate (G1) and the reset gate (G2) in the structure of the twelfth embodiment comprises two serially connected superconducting quantum interference devices. The other structure is the same as that of the twelfth embodiment and the same components are assigned the same reference numerals or symbols. In the fourteenth embodiment, it is assumed that the characteristic impedance $Z_0$ of each superconducting stripline being a driven line is 50 Ω, which is twice that in the twelfth embodiment.

As described in "SUMMARY OF THE INVENTION", when the characteristic impedance $Z_0$ of a driven line is greater than an internal impedance $R_j$ of a drive gate and a reset gate, it is not possible to match the characteristic impedance of the driven line. When it is not possible to set a proper damping resistance so as to match the characteristic impedance of the driven line, there may be a case where an output current of a required value is not obtained so that a malfunction occurs. Further, since an output signal cannot be raised or dropped in a short time, high-speed operation of the drive circuit is not enabled. In view of this, in the fourteenth embodiment, the two superconducting quantum interference devices are connected in series to increase the internal resistance twice, thereby matching the driven line having the characteristic impedance of 50 Ω.

In FIG. 18, specific circuit constants can be set, for example, as follows:

$J_1$=0.16 mA, $J_2$=0.16 mA, $J_3$=0.25 mA, $J_4$=0.18 mA, $J_5$=0.25 mA, $J_6$=0.16 mA, $J_7$=0.16 mA, $L_1$=2.6 pH, $L_2$=2.6 pH, $L_3$=4 pH, $L_4$=4 pH, $L_5$=0.5 pH, $L_6$=1 pH, $L_7$=2 pH, $L_8$=2.6 pH, $L_9$=2.6 pH, $L_{10}$=4 pH, $L_{11}$=4 pH, $M_1$=2 pH, $M_2$=2 pH, $M_3$=2 pH, $M_4$=2 pH, $R_{d1}$=150 Ω, $R_{d2}$=150 Ω, $R_1$=0.5 Ω, $I_{b1}$=0.2 mA, $I_{b2}$=0.2 mA, and $I_{b3}$=0.15 mA.

Herein, all the Josephson junctions are each assumed to be an Nb/AlO$_x$/Nb junction with critical current density $J_C$=10 kA/cm$^2$ and junction characteristic index $V_m$=10 mV. The Josephson junctions $J_1$, $J_2$, $J_6$, and $J_7$ are set to operate with McCumber coefficient $\beta=182$, the Josephson junction $J_3$ with McCumber coefficient $\beta=10$, and the Josephson junctions $J_4$ and $J_5$ with McCumber coefficient $\beta=1$. $M_1$ is a mutual inductance between the inductance $L_1$ and the inductance $L_3$, $M_2$ is a mutual inductance between the inductance $L_2$ and the inductance $L_4$, $M_3$ is a mutual inductance between the inductance $L_8$ and the inductance $L_{10}$, and $M_4$ is a mutual inductance between the inductance $L_9$ and the inductance $L_{11}$. As described above, the foregoing circuit constants are set assuming that the characteristic impedance $Z_0$ of the superconducting striplines (SL1, SL2) being the driven lines is 50 $\Omega$.

The operation of the circuit of the fourteenth embodiment is the same as that of the twelfth embodiment and hence the same effect can be achieved as in the twelfth embodiment. Further, there is also an effect that it is possible to match the driven line having the characteristic impedance greater than that of the twelfth embodiment.

In the fourteenth embodiment, the magnetic coupling quantum interference gate (SQUID) of each of the drive gate (G1) and the reset gate (G2) is formed by the two serially connected superconducting quantum interference devices. However, the same effect can be achieved even by connecting in series more superconducting quantum interference devices depending on a required output current value or a characteristic impedance value of a driven line.

Further, in the fourteenth embodiment, the magnetic coupling quantum interference gate (SQUID) of each of the drive gate (G1) and the reset gate (G2) in the structure of the twelfth embodiment is formed by the two serially connected superconducting quantum interference devices. However, the same effect can be achieved by employing the foregoing structure in the structure of the thirteenth embodiment.

Fifteenth Embodiment

Figure 19:
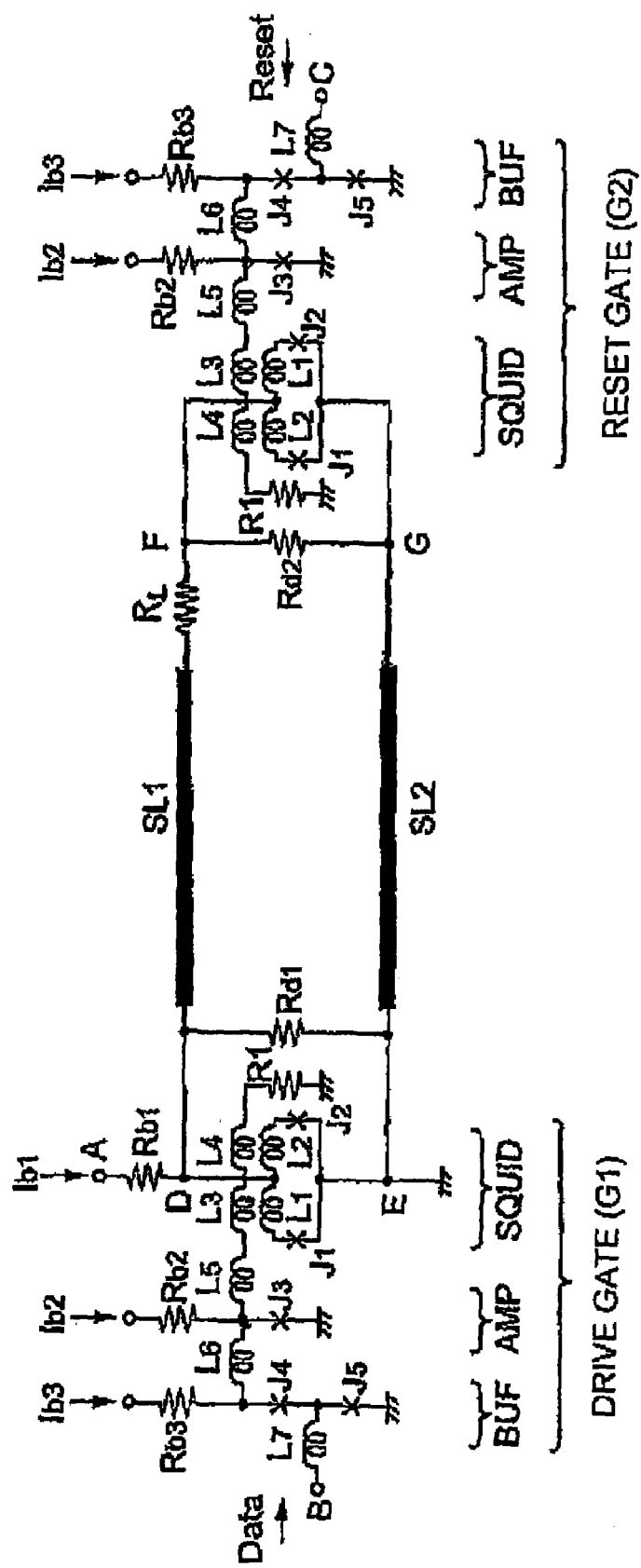
FIG. 19 is an equivalent circuit diagram for explaining a superconducting drive circuit according to a fifteenth embodiment of this invention.

FIG. 19 is an equivalent circuit diagram showing a superconducting drive circuit (fourth example) according to a fifteenth embodiment of this invention. The fifteenth embodiment is characterized in that a small value resistance $R_L$ is inserted between the superconducting stripline (SL1) being the driven line and the connection point F in the structure of the twelfth embodiment. The other structure is the same as that of the twelfth embodiment and the same components are assigned the same reference numerals or symbols.

In the fifteenth embodiment, given that the total inductance of the superconducting striplines (SL1, SL2) being the driven lines is 200 pH, when operating the superconducting drive circuit according to this invention at a clock frequency of 10 GHz (period T=100 ps), $R_L$ may be set to 0.2 $\Omega$ or so as a sufficiently small value as compared with L/T=2 $\Omega$. Accordingly, a reduction in output current flowing in the driven line can be almost ignored.

The operation of the circuit of the fifteenth embodiment is the same as that of the twelfth embodiment and hence the same effect can be achieved as in the twelfth embodiment. Further, there is also an effect that magnetic flux trapped in a superconducting loop being the driven line can be removed by the small value resistance $R_L$ inserted in the driven line.

In the fifteenth embodiment, the small value resistance $R_L$ is inserted between the superconducting stripline (SL1) being the driven line and the connection point F in the structure of the twelfth embodiment. However, the same effect can be achieved even by inserting the resistance $R_L$ at an optional position in the driven line formed by the superconducting stripline (SL1), the reset gate (G2), and the superconducting stripline (SL2).

Further, in the fifteenth embodiment, the small value resistance $R_L$ is inserted between the superconducting stripline (SL1) being the driven line and the connection point F in the structure of the twelfth embodiment. However, the same effect can be achieved by employing the foregoing structure in the structure of the thirteenth embodiment.

Sixteenth Embodiment

Figure 20:
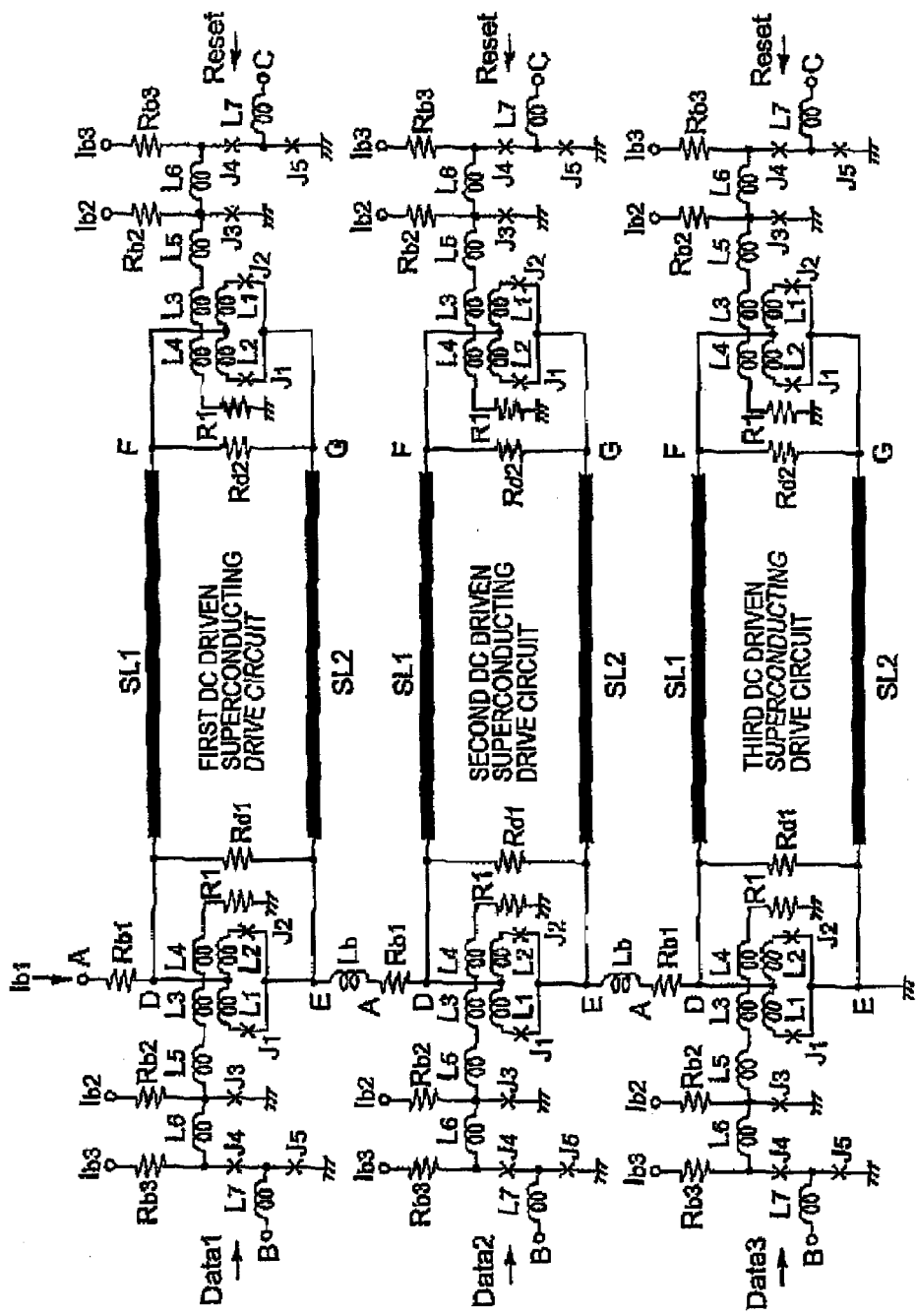
FIG. 20 is an equivalent circuit diagram for explaining a superconducting drive circuit according to a sixteenth embodiment of this invention.

FIG. 20 is an equivalent circuit diagram showing a superconducting drive circuit (fifth example) according to a sixteenth embodiment of this invention. The sixteenth embodiment is an example where there are arranged three superconducting drive circuits each having the structure of the twelfth embodiment. That is, the sixteenth embodiment comprises the first superconducting drive circuit, the second superconducting drive circuit, and the third superconducting drive circuit. A bias current output end (E) of the first superconducting drive circuit and a bias current input end (A) of the second superconducting drive circuit are connected to each other through an inductance ($L_b$). Further, a bias current output end (E) of the second superconducting drive circuit and a bias current input end (A) of the third superconducting drive circuit are connected to each other through an inductance ($L_b$), a DC power supply is connected to a bias current input end (A) of the first superconducting drive circuit, and a bias current output end (E) of the third superconducting drive circuit is grounded.

By inserting the inductance of a proper value in a DC bias line between the adjacent superconducting drive circuits, it is possible to reduce an influence exerted on the adjacent superconducting drive circuit when one superconducting drive circuit switches to the voltage state. There is an effect that this can increase the operation margin of the entire circuit.

In the sixteenth embodiment, given that the total inductance of superconducting striplines SL1 and SL2, being driven lines, of each superconducting drive circuit is 200 pH, the influence exerted on the adjacent superconducting drive circuit can be reduced by half when the inductance $L_b$ inserted in the bias line is set to 200 pH or more.

Also in the sixteenth embodiment, the operation of each superconducting drive circuit is the same as that of the twelfth embodiment and hence the same effect can be achieved as in the twelfth embodiment. Further, there is also an effect that the plurality of superconducting drive circuits can be configured according to the sixteenth embodiment.

Since the bias current is supplied to the plurality of superconducting drive circuits in series in the sixteenth embodiment, there is an effect that the value of the bias current does not increase although the structure includes the plurality of drive circuits.

Further, there is an effect that the influence to the adjacent drive circuit can be reduced by inserting the inductance of a proper value in the bias current line. Consequently, there is also an effect that the power consumption can be lowered by reducing bias resistances $R_b$.

In the sixteenth embodiment, there are arranged three superconducting drive circuits each having the structure of the twelfth embodiment. However, the same effect can be achieved by arranging three superconducting drive circuits each having the structure of the fourteenth embodiment.

Further, in the sixteenth embodiment, there are arranged three superconducting drive circuits. However, the same effect can be achieved by arranging two superconducting drive circuits or four or more superconducting drive circuits.

Seventeenth Embodiment

Figure 21:
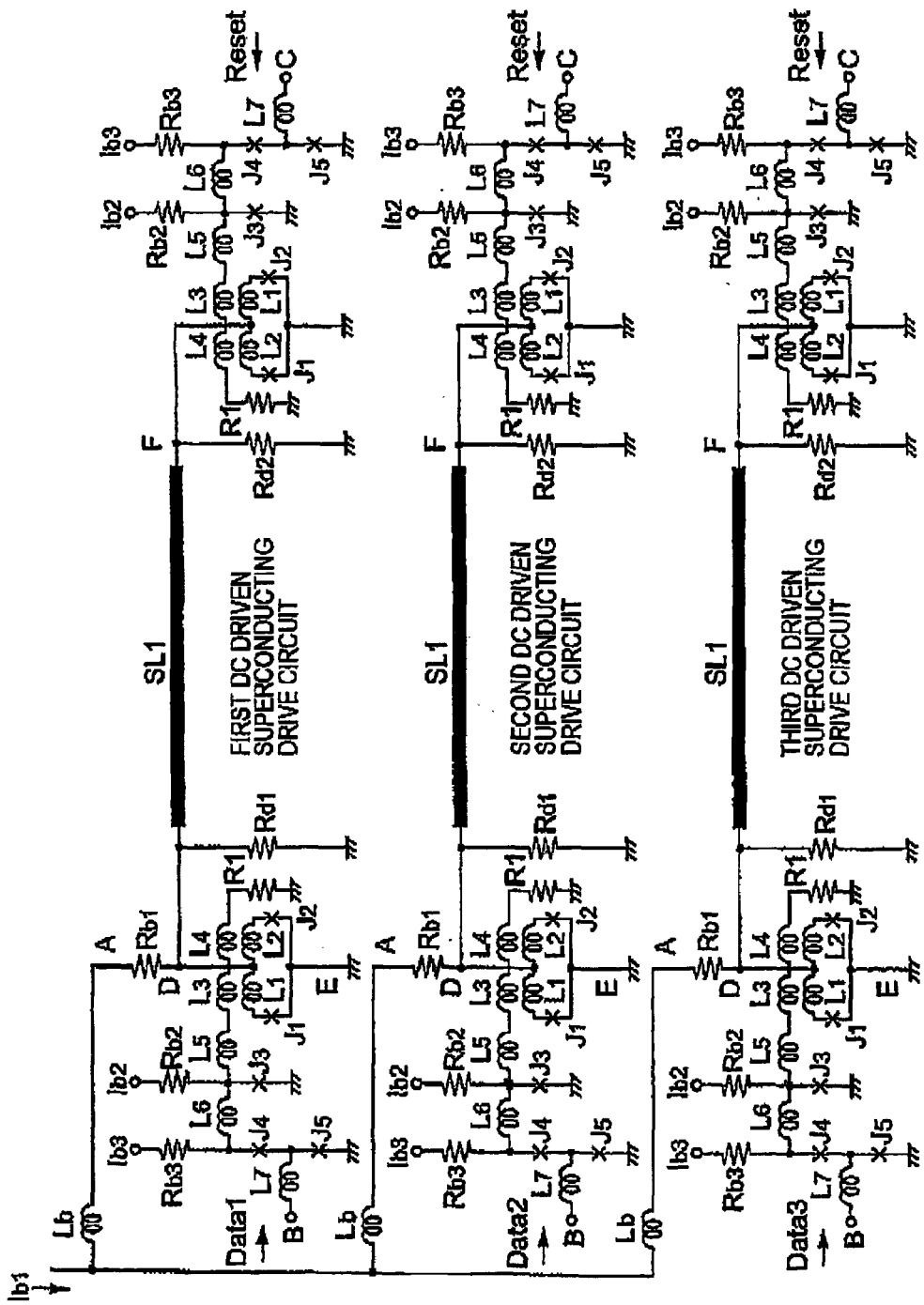
FIG. 21 is an equivalent circuit diagram for explaining a superconducting drive circuit according to a seventeenth embodiment of this invention.

FIG. 21 is an equivalent circuit diagram showing a superconducting drive circuit (sixth example) according to a seventeenth embodiment of this invention. The seventeenth embodiment is an example where there are arranged three superconducting drive circuits each having the structure of the thirteenth embodiment. Bias current input ends of the respective superconducting drive circuits are connected to a single DC power supply in parallel through inductances ($L_b$), respectively.

By inserting the inductance of a proper value between each of the bias current input ends (A) of the superconducting drive circuits and the DC power supply, it is possible to reduce an influence exerted on the adjacent superconducting drive circuit when one superconducting drive circuit switches to the voltage state. There is an effect that this can increase the operation margin of the entire circuit. Since the bias current input ends (A) of the superconducting drive circuits are connected in parallel through the inductances ($L_b$) in the seventeenth embodiment, there is an effect that the influence exerted on the adjacent superconducting drive circuit can be further reduced as compared with the sixteenth embodiment.

In the seventeenth embodiment, given that the total inductance of a superconducting stripline SL1, being a driven line, of each superconducting drive circuit is 100 pH, the influence exerted on the adjacent superconducting drive circuit can be largely reduced even when the inductance $L_b$ inserted in the bias line is 50 pH or so.

Also in the seventeenth embodiment, the operation of each superconducting drive circuit is the same as that of the thirteenth embodiment and hence the same effect can be achieved as in the thirteenth embodiment. Further, there is also an effect that the plurality of superconducting drive circuits can be configured according to the seventeenth embodiment.

There is an effect that the influence to the adjacent drive circuit can be largely reduced by inserting the inductance ($L_b$) of a proper value in the bias current line. Consequently, there is also an effect that the power consumption can be largely lowered by largely reducing bias resistances $R_b$.

Further, in the seventeenth embodiment, there are arranged three superconducting drive circuits. However, the same effect can be achieved by arranging two superconducting drive circuits or four or more superconducting drive circuits.

Now, specific embodiments of superconducting sense circuits according to this invention will be described with reference to the drawings.

This invention has accomplished the object of providing a superconducting sense circuit operable with a DC power supply, which requires no complicated timing sequence, has a large bias-current operation margin, and can obtain a single flux quantum (SFQ) pulse output, by forming the superconducting sense circuit by a sense line information detecting portion comprising a sense line of an RAM, a bias resistance, a load resistance, and a load inductance, and an SFQ circuit which bases its operation on a single flux quantum (SFQ).

Eighteenth Embodiment

Figure 22:
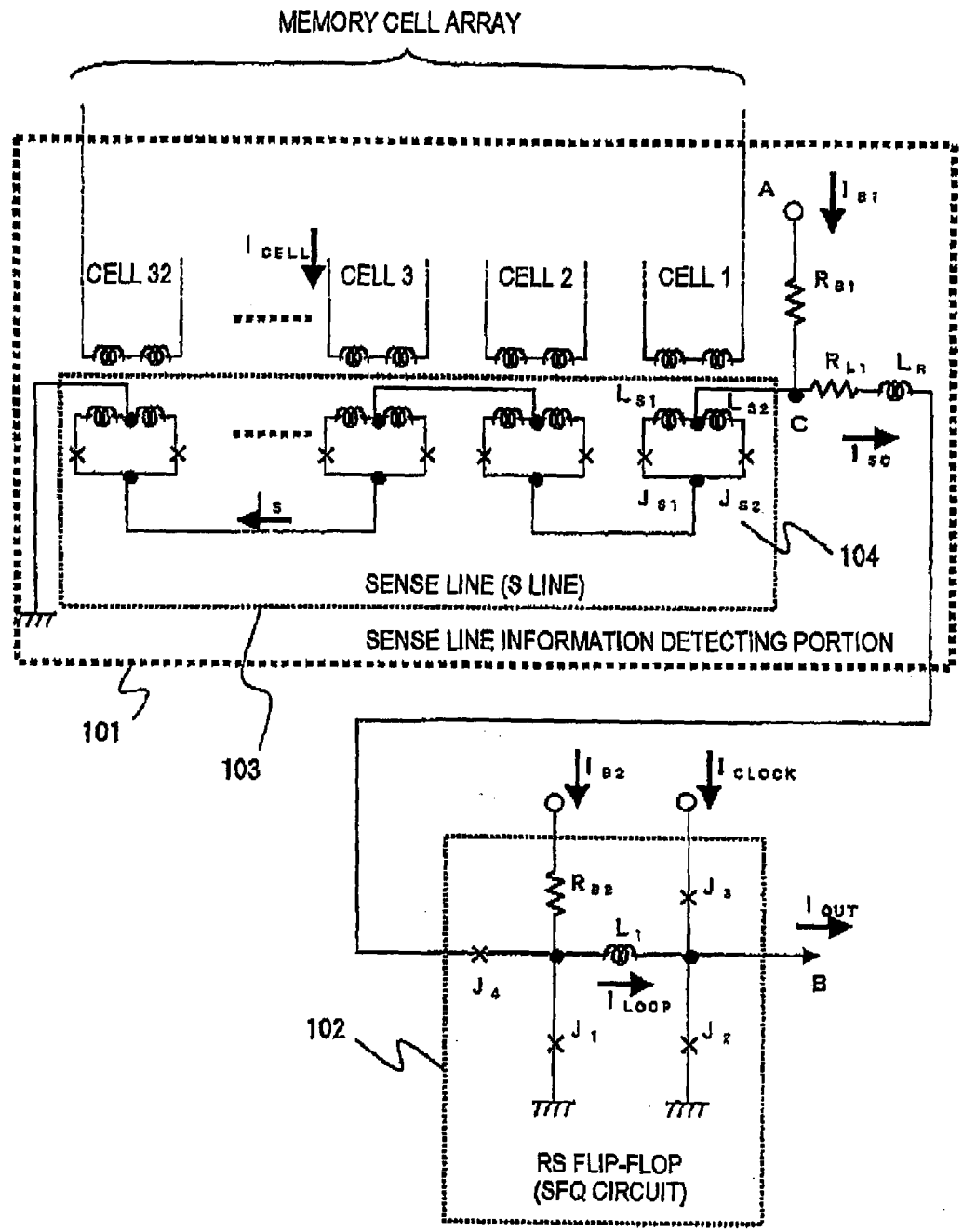
FIG. 22 is an explanatory diagram showing a superconducting sense circuit according to an eighteenth embodiment of this invention in the form of an equivalent circuit.
Figure 23:
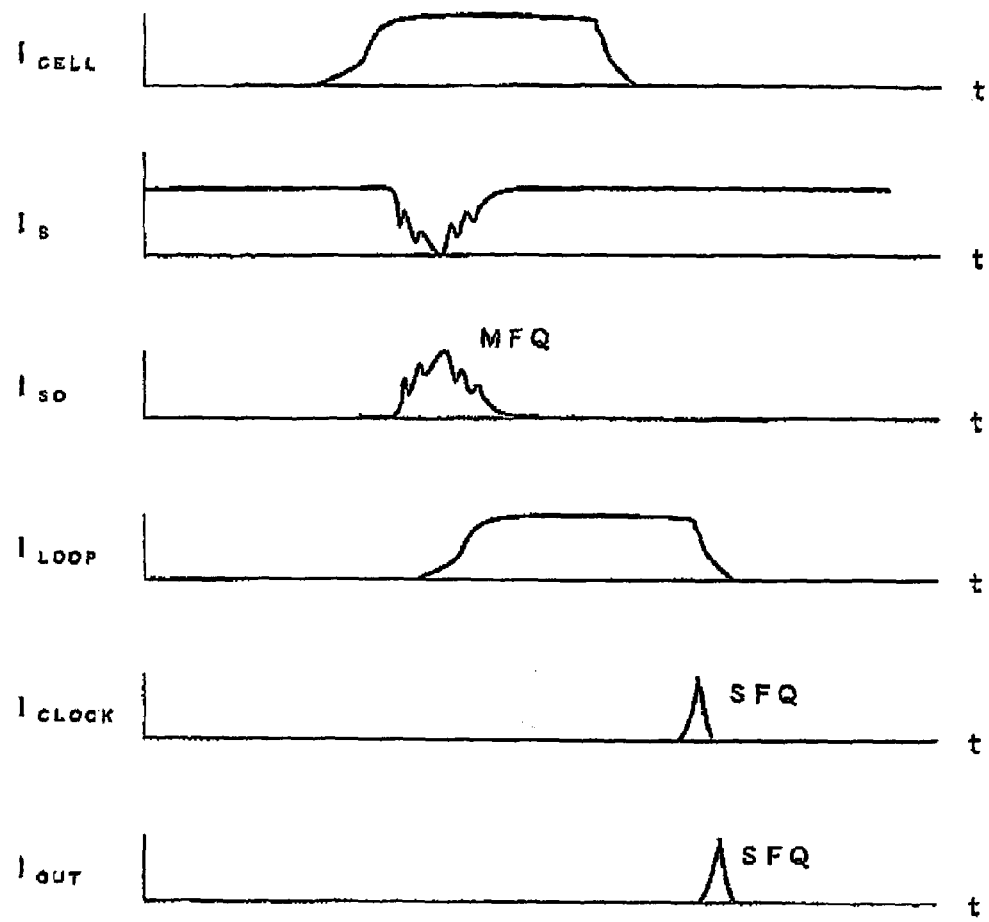
FIG. 23 is an explanatory diagram showing the operation of the superconducting sense circuit shown in FIG. 22 in terms of waveforms.

Referring to FIGS. 22 and 23, description will be made about a superconducting sense circuit (first example) according to an eighteenth embodiment of this invention.

FIG. 22 is an explanatory diagram showing the superconducting sense circuit according to the eighteenth embodiment in the form of an equivalent circuit.

At first, the structure and function of this circuit will be described.

The eighteenth embodiment is configured such that a sense line information detecting portion 101 connected to a memory cell array in a superconducting RAM outputs information to the outside through an RS flip-flop 102 being an SFQ circuit which bases its operation on a single flux quantum (SFQ). The sense line information detecting portion 101 comprises a sense line (hereinafter referred to as an "S line") 103 where sense gates of memory cells are connected in series, a bias resistance $R_{B1}$, a load resistance $R_{L1}$, and a load inductance $L_R$.

One end of the S line 103 is grounded and its other end is connected to a connection point C. One end of the bias resistance $R_{B1}$ is connected to a direct current supply end A and its other end is connected to the connection point C. The load resistance $R_{L1}$ and the load inductance $L_R$ are connected between the connection point C and a signal input end of the RS flip-flop 102. A signal output end of the RS flip-flop 102 is connected to an output end B.

While, in the eighteenth embodiment, the RS flip-flop 102 is used as the SFQ circuit which bases its operation on a single flux quantum (SFQ), the circuit structure and operation thereof is described in detail, for example, in the foregoing Non-Patent Document 7.

Further, in the eighteenth embodiment, the sense line 103 has the structure where read gates (sense gates) 104 of 32 memory cells are connected in series, and its average characteristic impedance is set to 20 Ω. The superconducting memory cell is, in general, formed by a superconducting loop including a write gate, and the read gate (sense gate) 104, wherein writing or holding of information is carried out by the superconducting loop including the write gate and reading of information held by the superconducting loop is carried out by the read gate (sense gate) 104. In order to read the information of the superconducting loop without destruction, the read gate (sense gate) 104 is, in general, formed by a quantum interference device magnetically coupled to the superconducting loop.

In the eighteenth embodiment, the read gate is formed by a magnetic coupling two-junction quantum interference device (2J-SQUID) for which part of the superconducting loop serves as a control wire. Since various memory cell structures can be considered, FIG. 22 only shows portions of the superconducting loops and the read gates (sense gates) 104 each formed by the magnetic coupling two-junction quantum interference device (2J-SQUID).

In the two-junction quantum interference device (2J-SQUID) of the read gate (sense gate) 104, serial connection between a Josephson junction $J_{S1}$ on the ground side and an inductance $L_{S1}$ on the bias resistance $R_{B1}$ side and serial connection between a Josephson junction $J_{S2}$ on the ground side and an inductance $L_{S2}$ on the bias resistance $R_{B1}$ side are connected in parallel. The Josephson junctions $J_{S1}$ and $J_{S2}$ are set to operate in an underdamped state with a McCumber coefficient of "50" or more. On the other hand, all the Josephson junctions $J_1$ to $J_4$ of the RS flip-flop 102 are set to operate in an overdamped state with a McCumber coefficient of approximately "1".

FIG. 23 is a schematic diagram of operation waveforms of the superconducting sense circuit in the eighteenth embodiment. Referring to FIG. 23 along with FIG. 22, description will be made about the circuit operation of the eighteenth embodiment based on the operation waveforms.

In FIG. 23, the axis of ordinates represents a current value, while the axis of abscissas represents a time. FIG. 23 shows, from top to bottom, a waveform of a current $I_{CELL}$ that flows in a wire magnetically coupled to the read gate (2J-SQUID) of the memory cell, a waveform of a current $I_S$ that flows in the sense line (S line) 103, a waveform of a current $I_{SO}$ that flows in the load inductance $L_R$, a waveform of a current $I_{LOOP}$ that flows in an inductance $L_1$ of the RS flip-flop 102, a waveform of a current $I_{CLOCK}$ input to a clock signal input end of the RS flip-flop 102, and a waveform of a current $I_{OUT}$ output to the signal output end B of the RS flip-flop 102.

In the superconducting sense circuit in the eighteenth embodiment, as an initial state, a DC bias current of a predetermined value supplied from the direct current supply end A flows to ground through the bias resistance $R_{B1}$ and the sense line (S line) 103.

When the selected memory cell of the memory cell array holds "1" by a read operation of the memory cell array, the current $I_{CELL}$ flows in the control wire magnetically coupled to the read gate of the selected memory cell in the waveform shown in FIG. 23. Accordingly, the read gate of the selected memory cell switches to the voltage state. In this event, as loads of the read gate, there are the inductances $L_{SX}$ of the S line, the load resistance $R_{L1}$, and the load inductance $L_R$. However, by properly setting these values, it is possible to operate the read gate in a self-reset mode. Therefore, the current $I_{SO}$ that flows in the inductance $L_R$ on the output side of the S line forms the waveform, as shown in FIG. 23, called MFQ synthesized by a plurality of SFQ pulses. In response to this waveform, the current $I_S$ flowing in the S line once drops like the waveform inverse to the foregoing MFQ waveform as shown in FIG. 23, but is immediately restored.

Then, when the MFQ pulse is input into the RS flip-flop 102 through the load inductance $L_R$, the Josephson junction $J_1$ of the RS flip-flop 102 temporarily switches to the voltage state so that information "1" is held in a superconducting loop formed by the Josephson junctions $J_1$ and $J_2$ and the inductance $L_1$. This corresponds to the state where a current having the waveform shown in FIG. 23 as the current $I_{LOOP}$ flows in the inductance $L_1$.

The RS flip-flop 102 is configured such that information is held at a time instant when one SFQ pulse is input as described above and, even when a plurality of SFQ pulses (MFQ pulse) are input, the second and subsequent pulses are excluded by the Josephson junction J4. Therefore, even if the MFQ pulse is input as described above, no problem arises. In this state, when an SFQ pulse having the waveform shown in FIG. 23 as the clock signal $I_{CLOCK}$ is input to the clock signal input end of the RS flip-flop 102, the Josephson junction $J_2$ temporarily switches to the voltage state so that the current $I_{LOOP}$ flowing in the superconducting loop of the RS flip-flop 102 drops to zero and the initial state is restored, and simultaneously, the current $I_{OUT}$ in the form of an SFQ pulse having the waveform shown in FIG. 23 is output to the output end B so that information "1" is output.

On the other hand, when the selected memory cell of the memory cell array holds "0", since no current flows in the control wire magnetically coupled to the read gate of the selected memory cell, the read gate does not switch to the voltage state so that there is no input signal to the RS flip-flop 102. Therefore, no current flows to the superconducting loop formed by the Josephson junctions $J_1$ and $J_2$ and the inductance $L_1$ of the RS flip-flop 102 and hence information "0" is held. In this state, when an SFQ pulse is input as the clock signal to the clock signal input end of the RS flip-flop 102, the Josephson junction $J_3$ temporarily switches to the voltage state while the Josephson junction $J_2$ does not switch to the voltage state this time, and hence, no SFQ pulse is output to the output end B so that information "0" is output.

Through the foregoing operation, it is possible to realize the superconducting sense circuit operable with a DC power supply, which can read information held by the selected memory cell of the memory cell array into the sense line (S line), temporarily hold this information in the RS flip-flop, and then read it as an SFQ pulse in response to input of the next clock signal.

In FIG. 22, specific circuit constants can be set, for example, as follows:

$J_{S1}$=0.125 mA, $J_{S2}$=0.125 mA, $J_1$=0.25 mA, $J_2$=0.20 mA, $J_3$=0.18 mA, $J_4$=0.15 mA, $L_1$=9 pH, $L_R$=10 pH, $L_{S1}$=2 pH, $L_{S2}$=2 pH, $R_{L1}$=1 Ω, $I_{B1}$=0.19 mA, and $I_{B2}$=0.18 mA.

Herein, all the Josephson junctions are each assumed to be an "Nb/AlO$_x$/Nb" junction with critical current density $J_C$=10 kA/cm² and junction characteristic index $V_m$=10 mV. All the Josephson junctions of the sense line are set to operate with McCumber coefficient β=182 and all the Josephson junctions of the RS flip-flop 102 with McCumber coefficient β=1.

Although the McCumber coefficient β is as large as approximately several tens of thousands to several hundreds in an Nb/AlO$_x$/Nb junction with a critical current density of approximately "2.5 kA/cm² to 10 kA/cm²", a Josephson junction with a McCumber coefficient of "1" can be easily realized by connecting a resistance of a required value in parallel to the Josephson junction.

Using the foregoing circuit constants, the normal operation has been confirmed at a clock frequency of 10 GHz by simulation.

As described above, in the eighteenth embodiment, it is possible to realize the superconducting sense circuit operable with a DC power supply, which has the function of reading information held by the selected memory cell of the memory cell array into the sense line, temporarily holding this information in the RS flip-flop, and, in response to input of the next clock signal, outputting an SFQ pulse corresponding to information "1" and outputting no SFQ pulse corresponding to information "0".

According to the eighteenth embodiment, there is an effect that information can be easily read from the sense line as compared with the conventional sense circuit and, further, by holding the read information in the RS flip-flop having a wide operation margin, it is possible to realize the sense circuit having a wide operation margin as a whole. Further, there is also an effect that the circuit operation does not require a complicated timing sequence and, in addition, since this circuit operates in a two-stage pipeline where information of the memory cell is read by the sense line and held by the RS flip-flop during the first clock period and the held information is output in the next clock period, high-speed operation is enabled.

Further, in the eighteenth embodiment, all the Josephson junctions of the sense line are formed by junctions having a McCumber coefficient of "50" or more. However, when the average characteristic impedance of the sense line is low (10 Ω or less), they may be formed by junctions having a McCumber coefficient of approximately "1". In this case, since the internal resistance when the two-junction quantum interference device (2J-SQUID) of the sense line temporarily switches to the voltage state and the characteristic impedance of the line substantially match each other, an SFQ pulse produced by switching of the two-junction quantum interference device (2J-SQUID) is propagated in the transmission line at ultra-high speed without attenuation of current amplitude. Therefore, there is an effect that although the current $I_{SO}$, which is an output from the sense line and flows in the inductance $L_R$, becomes an SFQ pulse, it is possible to realize a superconducting sense circuit having the same function and enabling higher-speed operation by properly adjusting values of the load resistance $R_{L1}$ and the load inductance $L_R$.

In the eighteenth embodiment, the read gates (sense gates) of 32 memory cells are connected to the sense line in series and the average characteristic impedance of the sense line is set to 20 Ω. However, the number of serially connected read gates or the characteristic impedance may take an optional value. However, since the operation speed of the circuit changes according to the number of serially connected read gates or the value of the characteristic impedance, it is necessary to set the clock frequency depending on this operation speed.

In the eighteenth embodiment, as the read gate of the memory cell of the sense line, the magnetic coupling quantum interference gate (SQUID) formed by two Josephson junctions is used. However, the same effect can be achieved by using a magnetic coupling quantum interference gate (SQUID) formed by three Josephson junctions.

In the eighteenth embodiment, the RS flip-flop is used as the SFQ circuit which bases its operation on a single flux quantum (SFQ). However, other than that, use can be made of an optional SFQ circuit as long as it is an SFQ circuit that holds an output signal from the sense line and, in response to the next clock signal, outputs an SFQ pulse depending on the held information. For example, the same effect can be achieved using an RSFQ inverter instead of the RS flip-flop. In this case, there is also an effect that an inverted output of an output signal from the sense line is obtained at an output end of the inverter.

Nineteenth Embodiment

Figure 24:
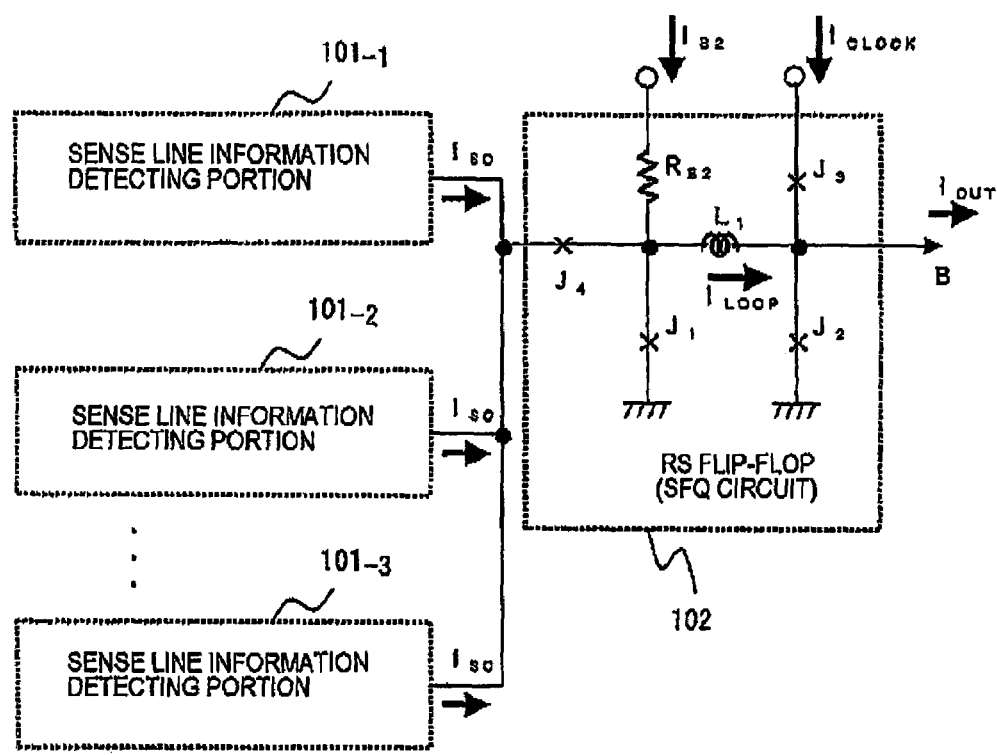
FIG. 24 is an explanatory diagram showing a superconducting sense circuit according to a nineteenth embodiment of this invention in the form of an equivalent circuit.

FIG. 24 is an explanatory diagram showing a superconducting sense circuit (second example) according to a nineteenth embodiment of this invention in the form of an equivalent circuit.

The nineteenth embodiment will be described with reference to FIG. 24.

The nineteenth embodiment comprises a plurality of sense line information detecting portions $101_{-1}, 101_{-2}, 101_{-3} \ldots$ and an SFQ circuit in the form of an RS flip-flop 102.

The sense line information detecting portion $101_{-X}$ has the same structure as that of the sense line information detecting portion 101 shown in FIG. 22. That is, as shown in FIG. 22, the sense line information detecting portion $101_{-X}$ comprises a sense line 103 where sense gates of memory cells of a superconducting RAM are connected in series, a bias resistance $R_{B1}$, a load resistance $R_{L1}$, and a load inductance $L_R$. One end of the sense line 103 is grounded and its other end is connected to a connection point C. One end of the bias resistance $R_{B1}$ is connected to a direct current supply end A and its other end is connected to the connection point C. The load resistance $R_{L1}$ and the load inductance $L_R$ are connected in series between the connection point C and a signal input end of the RS flip-flop 102.

It is configured that output signals from the plurality of sense line information detecting portions $101_{-1}, 101_{-2}, 101_{-3} \ldots$ are input to the data signal input end of the RS flip-flop in parallel.

Normally, in an RAM, information of a selected single memory cell in a memory cell array is read and hence it never happens that sense lines of a plurality of sense line information detecting portions are simultaneously selected. Therefore, as in the nineteenth embodiment, the SFQ circuit (RS flip-flop) serving to hold detected information can be shared by the plurality of sense line information detecting portions.

In the operation of the superconducting sense circuit according to the nineteenth embodiment, selection is made of a memory cell included in a sense line of one of the plurality of sense line information detecting portions $101_{-1}, 101_{-2}, 101_{-3} \ldots$ and information of the memory cell is output from the selected sense line. Other than that, the operation of the constituent circuits is the same as that of the eighteenth embodiment. Circuit constants in FIG. 24 may be set to the same values as those in the eighteenth embodiment.

In the nineteenth embodiment, since outputs from the plurality of sense line information detecting portions are received by the single RS flip-flop, there is an effect that, as compared with the case where there are arranged a plurality of circuits each having the structure of the eighteenth embodiment, the number of RS flip-flops can be reduced by sharing the RS flip-flop. Since this results in reduction of the layout area and reduction in the number of elements, there is an effect that the power consumption can also be reduced.

Now, embodiments of device structures of superconducting RAMs according to this invention will be described with reference to the drawings.

Twentieth Embodiment

Figure 25:
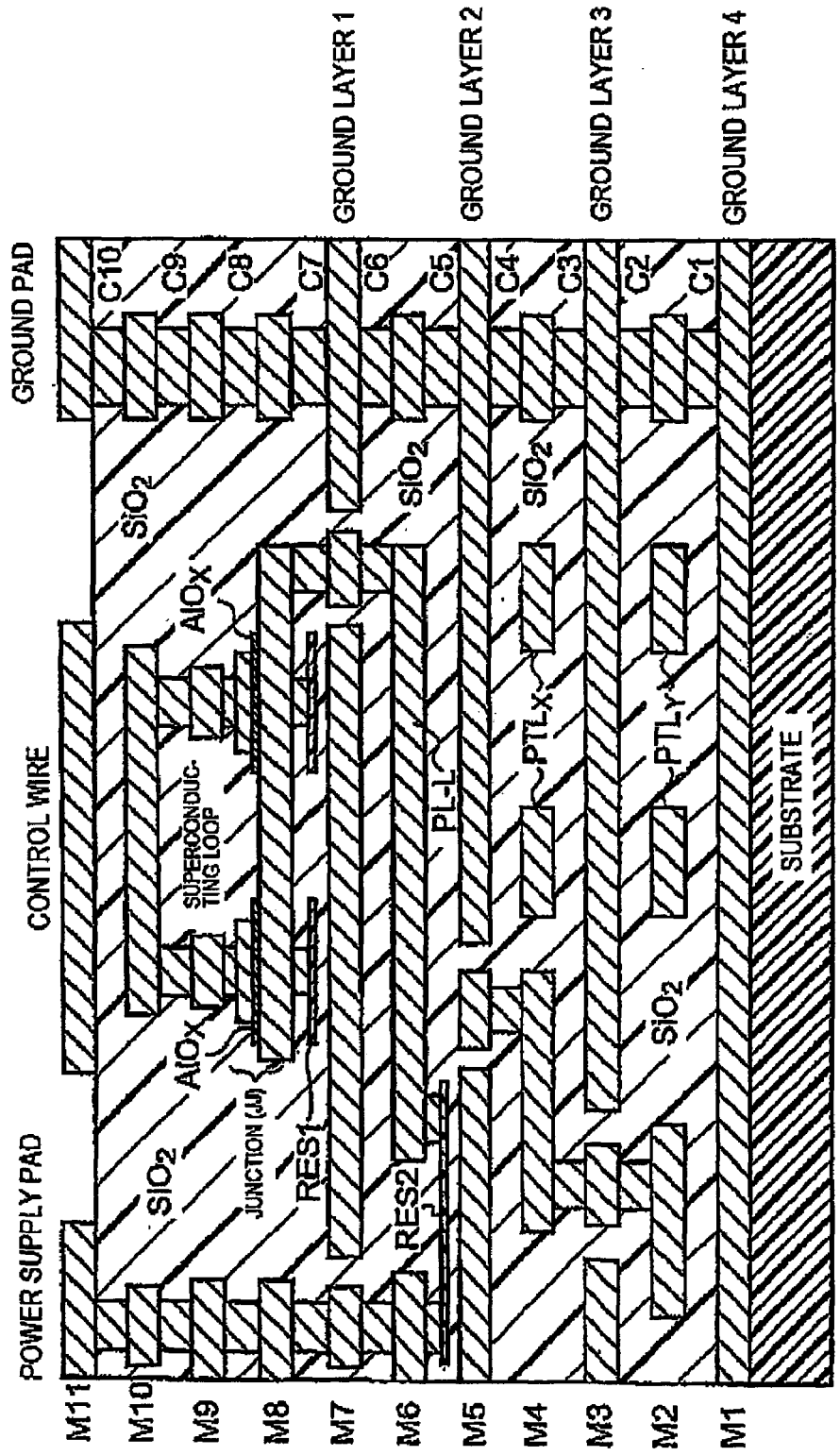
FIG. 25 is a schematic sectional view for explaining a device structure of a superconducting random access memory according to a twentieth embodiment of this invention.

FIG. 25 is a schematic sectional view showing a device structure of a superconducting RAM (first example) according to a twentieth embodiment of this invention.

The twentieth embodiment comprises, on an oxidized silicon substrate, eleven Nb superconducting layers (M1 to M11), two resistance layers (RES1, RES2), a Josephson junction portion (JJ), interlayer contacts (C1 to C10), and an $SiO_2$ interlayer insulating layer.

The Josephson junction portion (JJ) is formed by three $Nb/AlO_x/Nb$ layers, wherein the lower Nb superconducting layer of this junction portion is the M8 layer.

All the Nb superconducting layers except the uppermost M11 layer are planarized by the $SiO_2$ interlayer insulating layer.

In the twentieth embodiment, the M7 layer serves as a first superconducting ground layer and, over this superconducting ground layer, there are formed a superconducting loop composed of the M8, M9, and M10 layers and the Josephson junction portion (JJ), and a control wire (M11) disposed so as to be magnetically coupled to the superconducting loop.

In this manner, in order to obtain a large inductance per unit length, the superconducting loop is formed in a direction perpendicular to the substrate surface.

In order to increase magnetic coupling (mutual inductance) between the control wire formed by the M11 layer and the superconducting loop, it is necessary to increase an interval between an upper wiring portion (M10) and a lower wiring portion (M8) of the superconducting loop. In view of this, in the twentieth embodiment, the M9 layer is inserted to increase this interval.

Under the first superconducting ground layer (M7), there is formed a power supply line inductance forming layer (PL-L) formed by the M6 layer.

A DC bias current supplied from a power supply pad is supplied to the Josephson junction portion (JJ) through the second resistance (RES2) and an inductance formed by the power supply line inductance forming layer (PL-L). There is an effect that it is possible to efficiently form an inductance of a required magnitude in the direct current supply line by the use of the power supply line inductance forming layer (PL-L) disposed under the first superconducting ground layer (M7).

Further, under the first superconducting ground layer (M7), there are formed a first superconducting passive transmission line ($PTL_X$) composed of the M4, M3, and M5 layers and a second superconducting passive transmission line ($PTL_Y$) composed of the M2, M1, and M3 layers.

Since the wiring layers ($PTL_X$, $PTL_Y$) for high-speed signal propagation, which are separate layers from the superconducting loop and the control wire being the basic components of a memory cell, are formed under the first superconducting ground layer (M7), there is an effect of enabling a reduction in layout area of memory cells.

In the twentieth embodiment, the DC power supply line inductance forming layer (PL-L) is formed by the M6 layer between the first superconducting ground layer (M7) and the first and second superconducting passive transmission lines ($PTL_X$, $PTL_Y$). That is, since the power supply line inductance forming layer (PL-L) is sandwiched between the first superconducting ground layer (M7) and the second superconducting ground layer (M5) being the component of the superconducting passive transmission line ($PTL_X$), it is possible to efficiently shield a magnetic field generated by the DC bias current in the vicinity of the power supply line inductance forming layer (PL-L). Accordingly, circuits disposed over the first superconducting ground layer (M7), such as the superconducting loop including the Josephson junction portion (JJ), and circuits disposed under the second superconducting ground layer (M5), such as the superconducting passive transmission lines ($PTL_X$, $PTL_Y$), are hardly affected by the magnetic field produced by the DC bias current, and hence, there is an effect that a reduction in operation margin of the circuit due to influence of the magnetic field otherwise caused can be prevented.

The twentieth embodiment is configured such that the superconducting layers and the resistance layers are formed in multilayers. Since, in general, an Nb/AlO$_X$/Nb junction is subjected to degradation in characteristic at a temperature of 200° C. or more, a higher-temperature process cannot be employed in device fabrication. However, in the twentieth embodiment, the Josephson junction portion (JJ) has not yet been formed at the time of formation of the superconducting layers (M1 to M7), the resistance layers (RES1, RES2), the contacts (C1 to C7), and the $SiO_2$ interlayer insulating layer therebetween, which are located under the Josephson junction portion (JJ). Therefore, there is an effect that it is possible to employ the high-temperature manufacturing process for forming these wiring layers and so on. For example, the $SiO_2$ interlayer insulating layer is formed by sputtering being a low-temperature process when it is formed after forming the Josephson junction portion as in the conventional technique. However, in the case of forming the $SiO_2$ interlayer insulating layer before forming the Josephson junction portion as in the twentieth embodiment, the $SiO_2$ interlayer insulating layer can also be formed by plasma CVD being a high-temperature process at approximately 400° C. An $SiO_2$ film formed by plasma CVD is excellent in covering a stepped portion so that excellent insulating properties can be obtained.

As described above, according to the twentieth embodiment, there is an effect that it is possible to realize the device structure of the ultra-high speed, large-scale superconducting RAM, wherein most of the wiring layers can be formed by the high-temperature process, miniaturization of the memory cells is enabled, the inductance can be efficiently formed in the DC bias current supply line, and the influence of the magnetic field produced by the bias current can be prevented.

Twenty-First Embodiment

Figure 26:
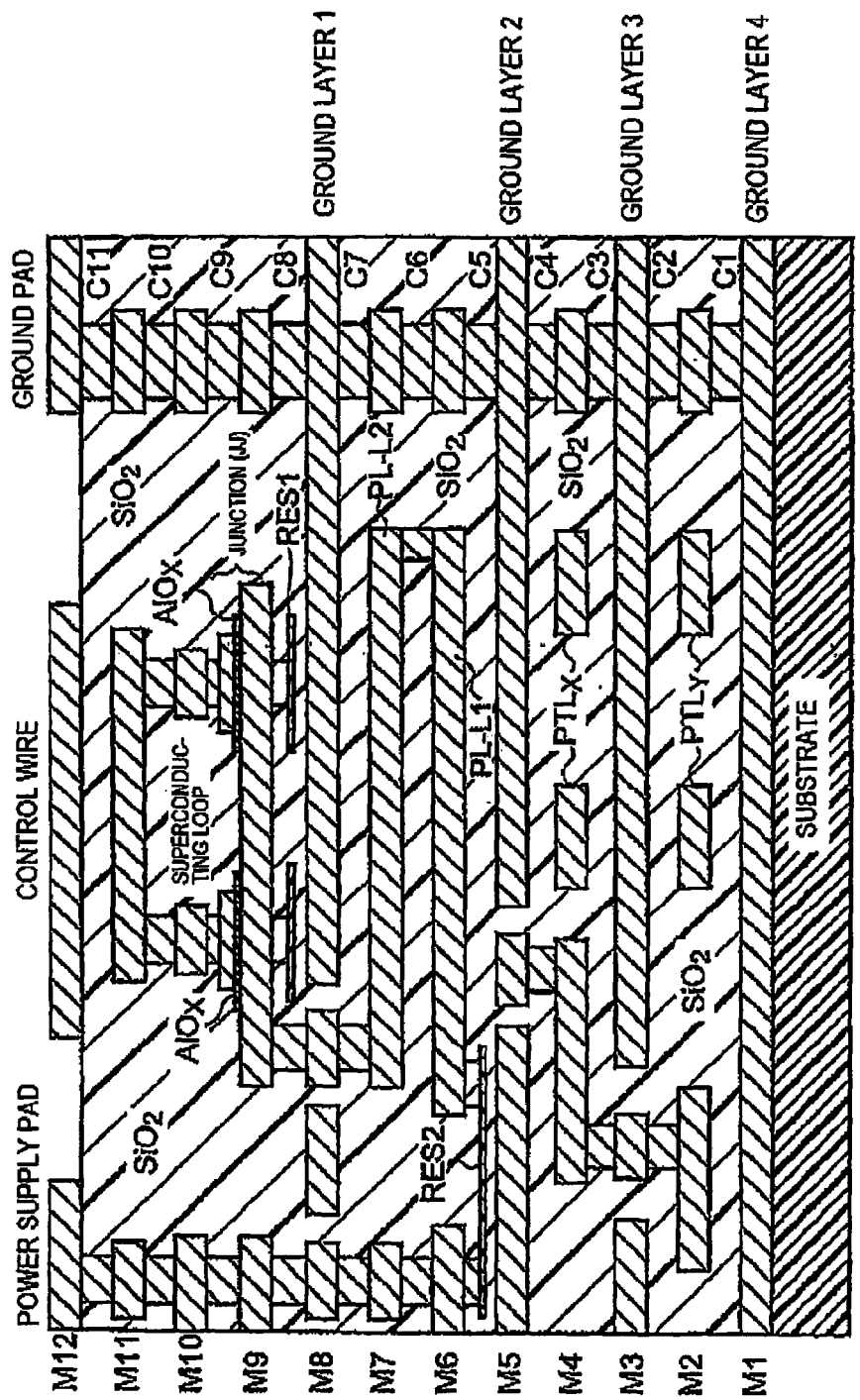
FIG. 26 is a schematic sectional view for explaining a device structure of a superconducting random access memory according to a twenty-first embodiment of this invention.

FIG. 26 is a schematic sectional view showing a device structure of a superconducting RAM (second example) according to a twenty-first embodiment of this invention.

The twenty-first embodiment differs from the twentieth embodiment shown in FIG. 25 in that power supply line inductance forming layers (PL-L1, PL-L2) disposed under a first superconducting ground layer are formed by two Nb superconducting layers (M6 and M7). Since the other structure is the same as that of the twentieth embodiment, explanation thereof is omitted.

Also in the twenty-first embodiment, the same effect is obtained as in the twentieth embodiment. Further, in the twenty-first embodiment, since the power supply line inductance forming layers are formed by the two Nb superconducting layers, there is an effect that it is possible to efficiently form an inductance of a greater value as compared with the twentieth embodiment. In an SFQ circuit, it is theoretically possible to carry out distribution of a bias current only through an inductance with a bias resistance being reduced to zero. In this case, it is necessary to form a fairly large inductance for ensuring the operation margin, which can be easily realized by the device structure of the twenty-first embodiment.

Twenty-Second Embodiment

Figure 27:
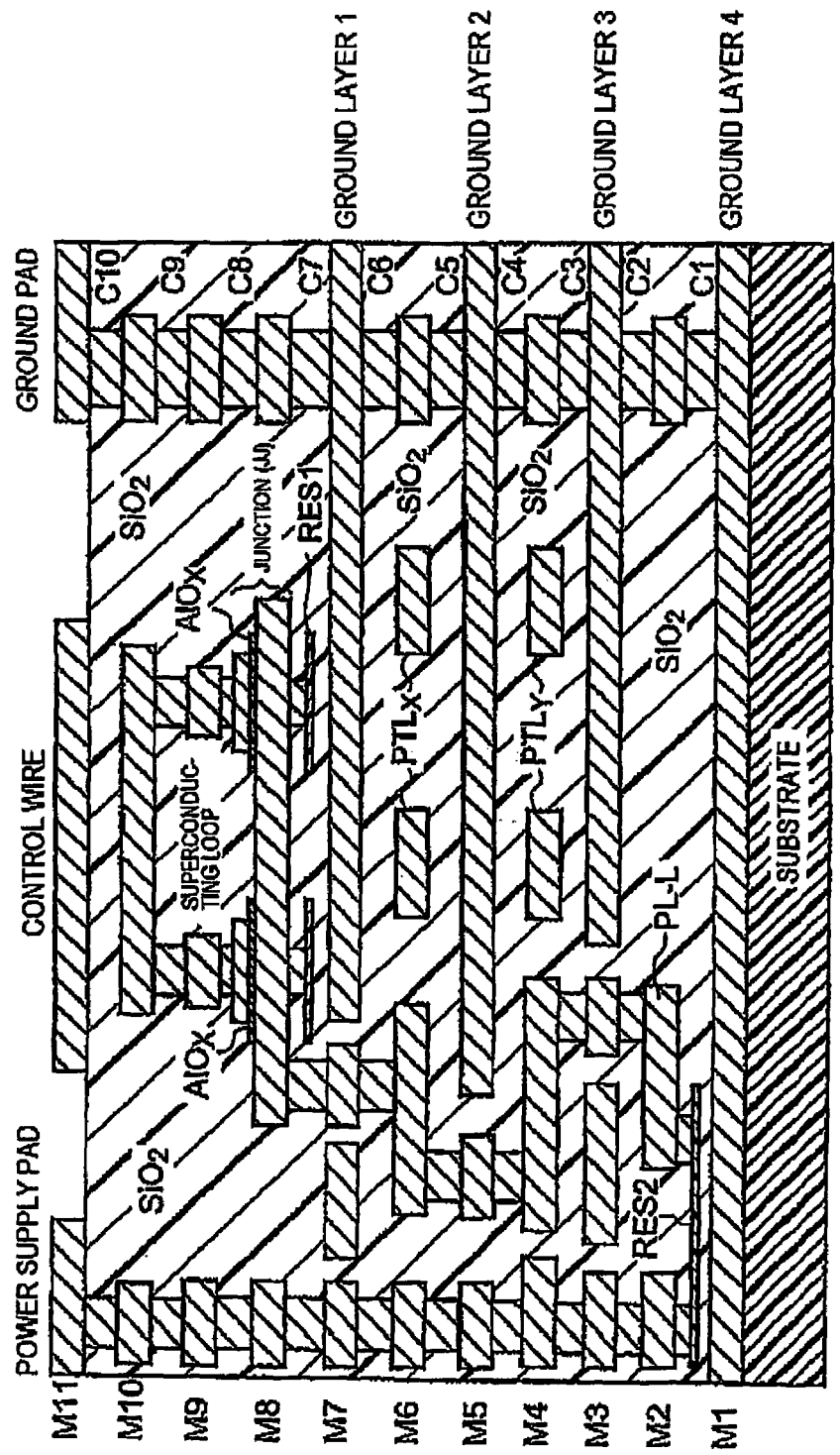
FIG. 27 is a schematic sectional view for explaining a device structure of a superconducting random access memory according to a twenty-second embodiment of this invention.

FIG. 27 is a schematic sectional view showing a device structure of a superconducting RAM (third example) according to a twenty-second embodiment of this invention.

The twenty-second embodiment is configured such that a power supply line inductance forming layer (PL-L) and a second resistance layer (RES2), and first and second superconducting passive transmission lines ($PTL_X$, $PTL_Y$) disposed under a first superconducting ground layer (M7) are reversed in vertical order as compared with the twentieth embodiment. That is, it differs from the twentieth embodiment shown in FIG. 25 in that the first and second superconducting passive transmission lines ($PTL_X$, $PTL_Y$) are disposed under the first superconducting ground layer (M7) and, under them, the power supply line inductance forming layer (PL-L) and the second resistance layer (RES2) are disposed. Since the other structure is the same as that of the twentieth embodiment, explanation thereof is omitted.

Also in the twenty-second embodiment, the same effect is obtained as in the twentieth embodiment. Further, in the twenty-second embodiment, the power supply line inductance forming layer (PL-L) and the second resistance layer (RES2) used as a bias resistance are formed at a lowermost position immediately above the substrate. When carrying out cooling by the use of a cold head of a refrigerator, the device structure is cooled through the substrate. Therefore, according to the twenty-second embodiment where the second resistance layer (RES2) occupying most of the power consumption is disposed closest to the substrate, there is an effect that high freezing efficiency can be achieved.

Twenty-Third Embodiment

Figure 28:
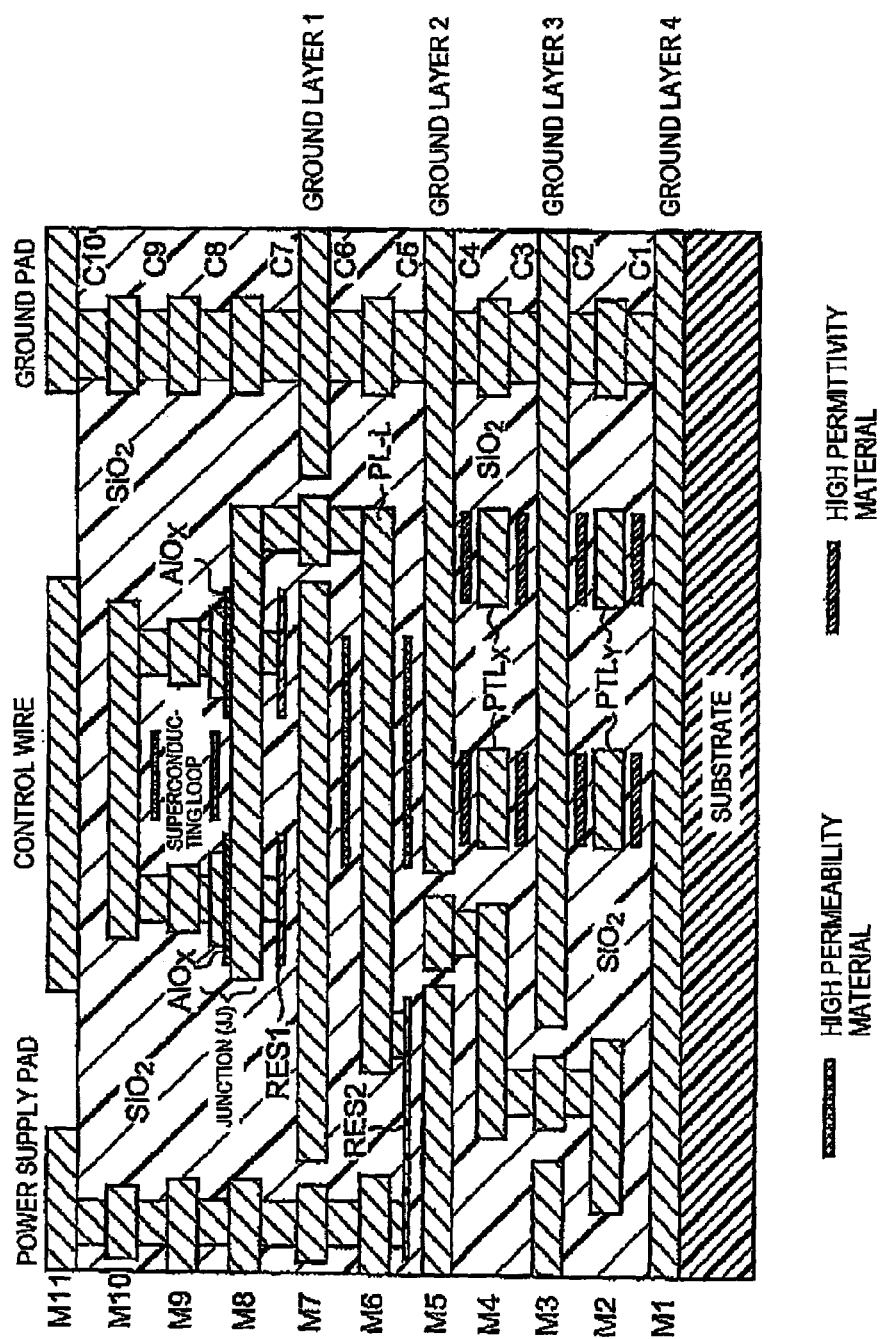
FIG. 28 is a schematic sectional view for explaining a device structure of a superconducting random access memory according to a twenty-third embodiment of this invention.

FIG. 28 is a schematic sectional view showing a device structure of a superconducting RAM (fourth example) according to a twenty-third embodiment of this invention.

The twenty-third embodiment differs from the twentieth embodiment in that, in the device structure of the twentieth embodiment, patterns made of Permalloy being a high permeability material are inserted in the $SiO_2$ interlayer insulating layer within the superconducting loop over the first superconducting ground layer (M7) and in the insulating layer adjacent to the power supply line inductance forming layer (PL-L), respectively. Further, the twenty-third embodiment differs from the twentieth embodiment in that, in the device structure of the twentieth embodiment, patterns made of hafnium oxide ($HfO_2$) being a high permittivity material are inserted in the insulating layer of the superconducting passive transmission lines ($PTL_X$, $PTL_Y$) under the first superconducting ground layer (M7), respectively. Since the other structure is the same as that of the twentieth embodiment, explanation thereof is omitted.

Twenty-third embodiment has the same effect as that of the twentieth embodiment. Further, by inserting the patterns made of the high permeability material in the interlayer insulating layer within the superconducting loop and in the insulating layer adjacent to the power supply line inductance forming layer (PL-L), it is possible to increase the inductance per unit length of the superconducting loop and the power supply line. Therefore, there is an effect that the layout area of the superconducting loop and the power supply line can be further reduced.

Further, in the twenty-third embodiment, by inserting the patterns made of the high permittivity material in the insulating layer of the superconducting passive transmission lines ($PTL_X$, $PTL_Y$), the capacitance per unit length of the superconducting passive transmission lines can be increased. Therefore, there is an effect that the layout area of the superconducting passive transmission lines can be further reduced.

In the twenty-third embodiment, Permalloy is used as the high permeability material. However, the same effect can also be achieved using, instead of Permalloy, a high-permeability soft-magnetic material such as μMetal.

Further, in the twenty-third embodiment, hafnium oxide ($HfO_2$) is used as the high permittivity material. However, the same effect can also be achieved using, instead of hafnium oxide, a high-k material used as a semiconductor gate oxide film, such as an Nb anodic oxide film ($Nb_2O_5$) or an aluminum oxide film ($Al_2O_3$).

Twenty-Fourth Embodiment

Figure 29:
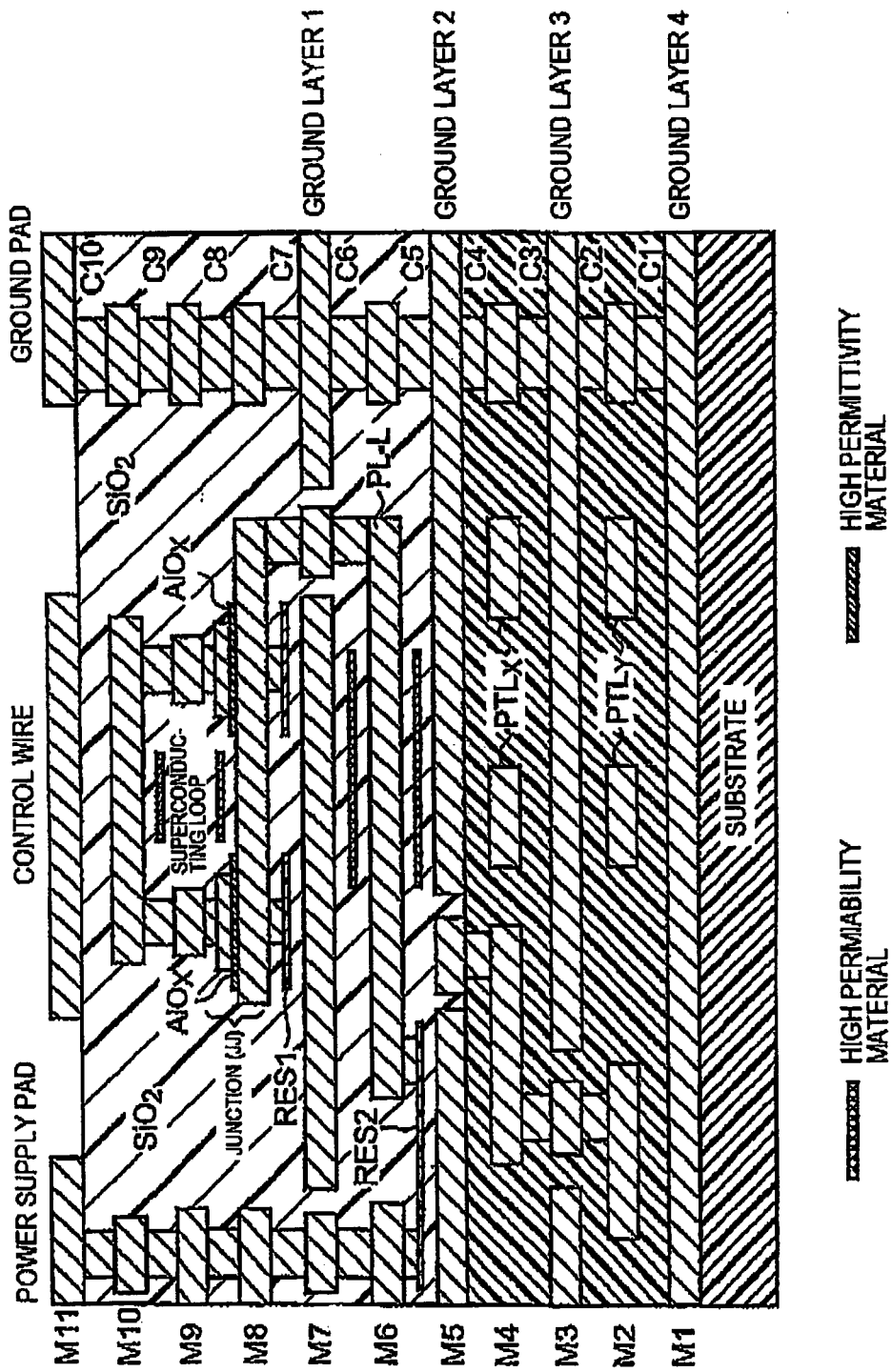
FIG. 29 is a schematic sectional view for explaining a device structure of a superconducting random access memory according to a twenty-fourth embodiment of this invention.

FIG. 29 is a schematic sectional view showing a device structure of a superconducting RAM (fifth example) according to a twenty-fourth embodiment of this invention.

In the twenty-third embodiment shown in FIG. 28, the patterns made of the high permittivity material are inserted in the insulating layer being the component of the superconducting passive transmission lines ($PTL_X$, $PTL_Y$). However, the twenty-fourth embodiment differs from the twenty-third embodiment in that the insulating layer being the component of the superconducting passive transmission lines ($PTL_X$, $PTL_Y$) is entirely formed of the high permittivity material. Since the other structure is the same as that of the twenty-third embodiment, explanation thereof is omitted.

Also in the twenty-fourth embodiment, the same effect is obtained as in the twenty-third embodiment. Further, since there is no need to form the patterns of the high permittivity material, there is an effect that the manufacturing process is simplified as compared with the twenty-third embodiment.

Twenty-Fifth Embodiment

Figure 30:
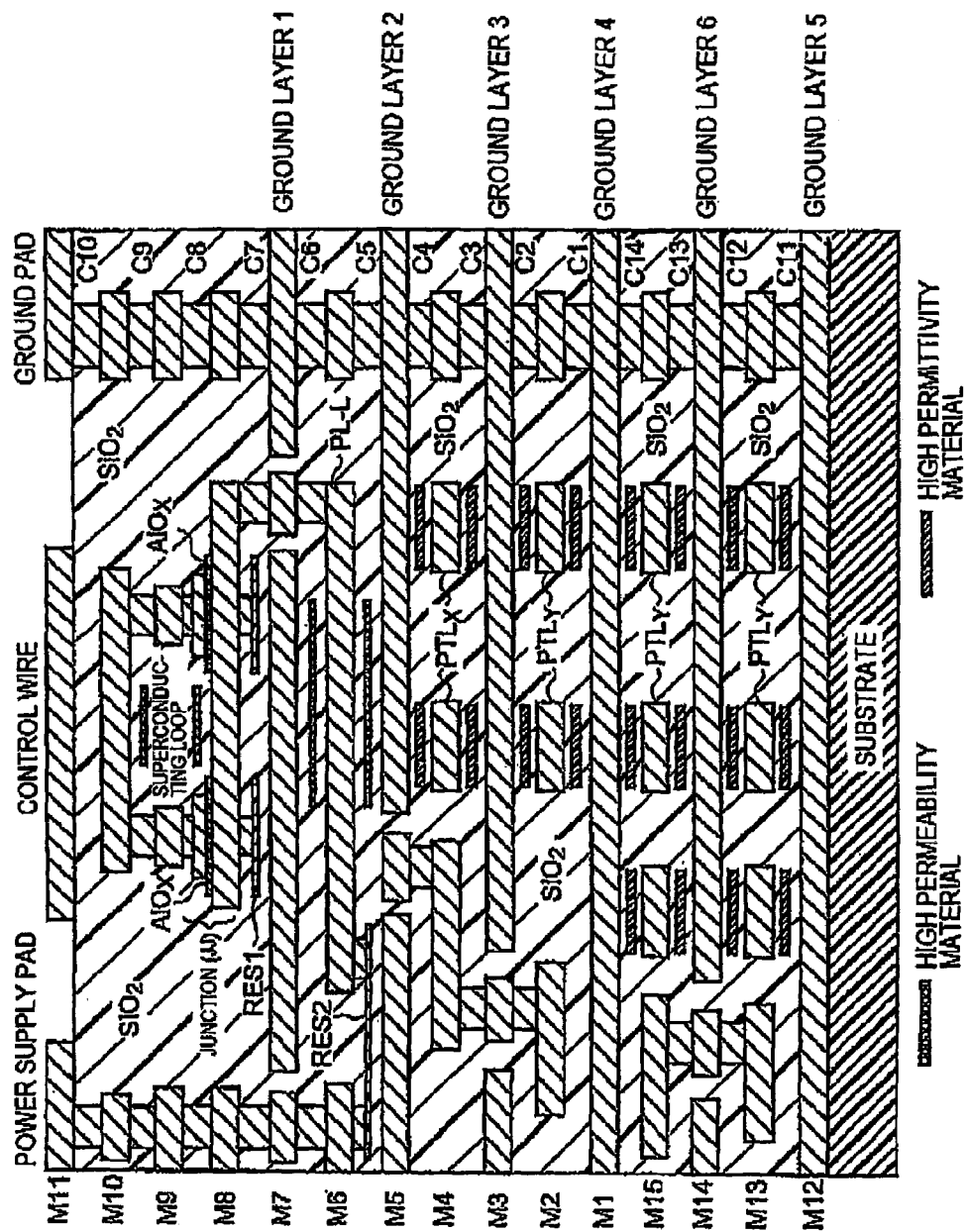
FIG. 30 is a schematic sectional view for explaining a device structure of a superconducting random access memory according to a twenty-fifth embodiment of this invention.
Figure 31:
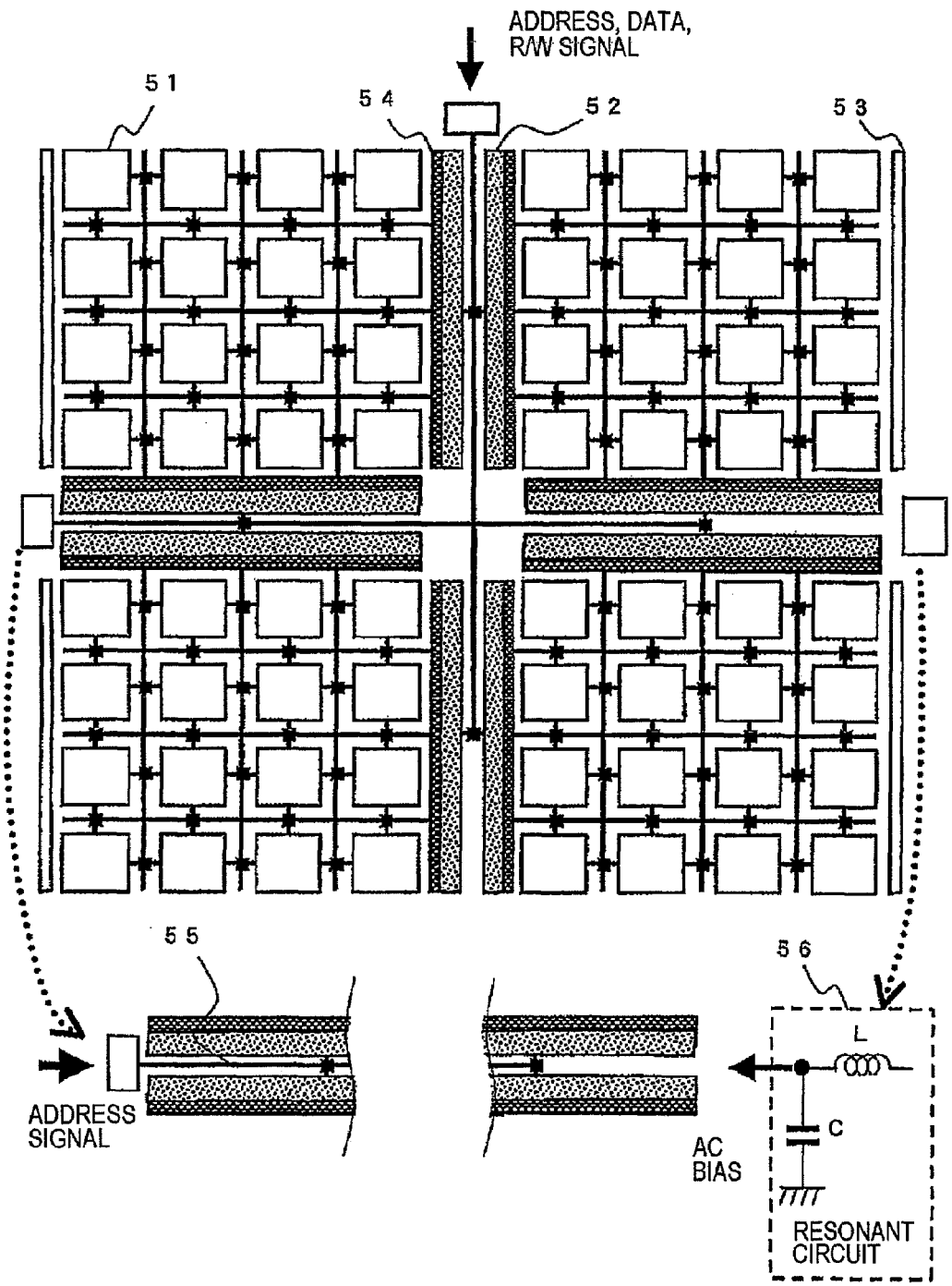
FIG. 31 is an explanatory diagram showing one example of block configuration for explaining a conventional superconducting RAM.
Figure 32:
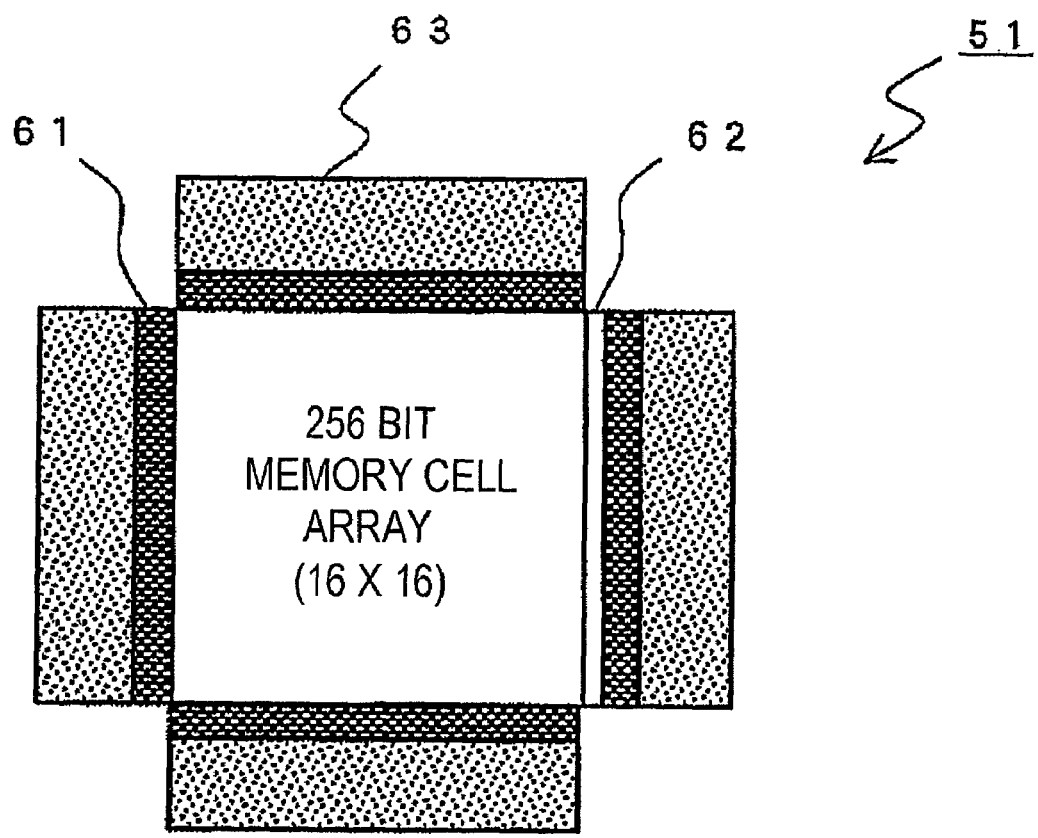
FIG. 32 is an explanatory diagram showing one example of a memory cell array portion in FIG. 31.
Figure 33:
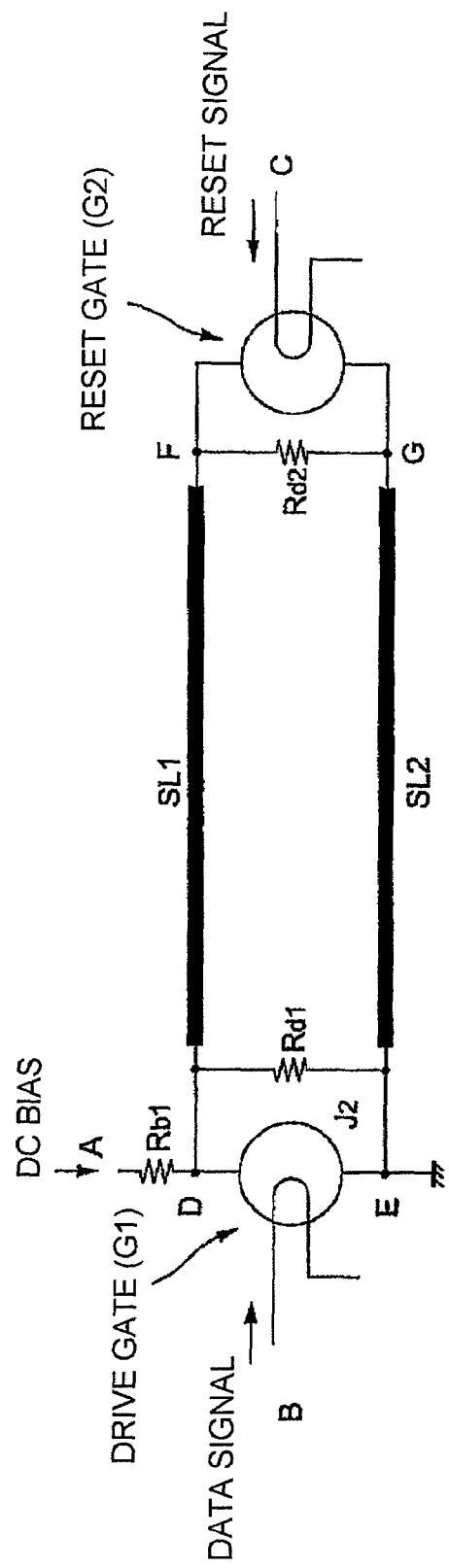
FIG. 33 is an equivalent circuit diagram for explaining a conventional superconducting drive circuit.
Figure 34:
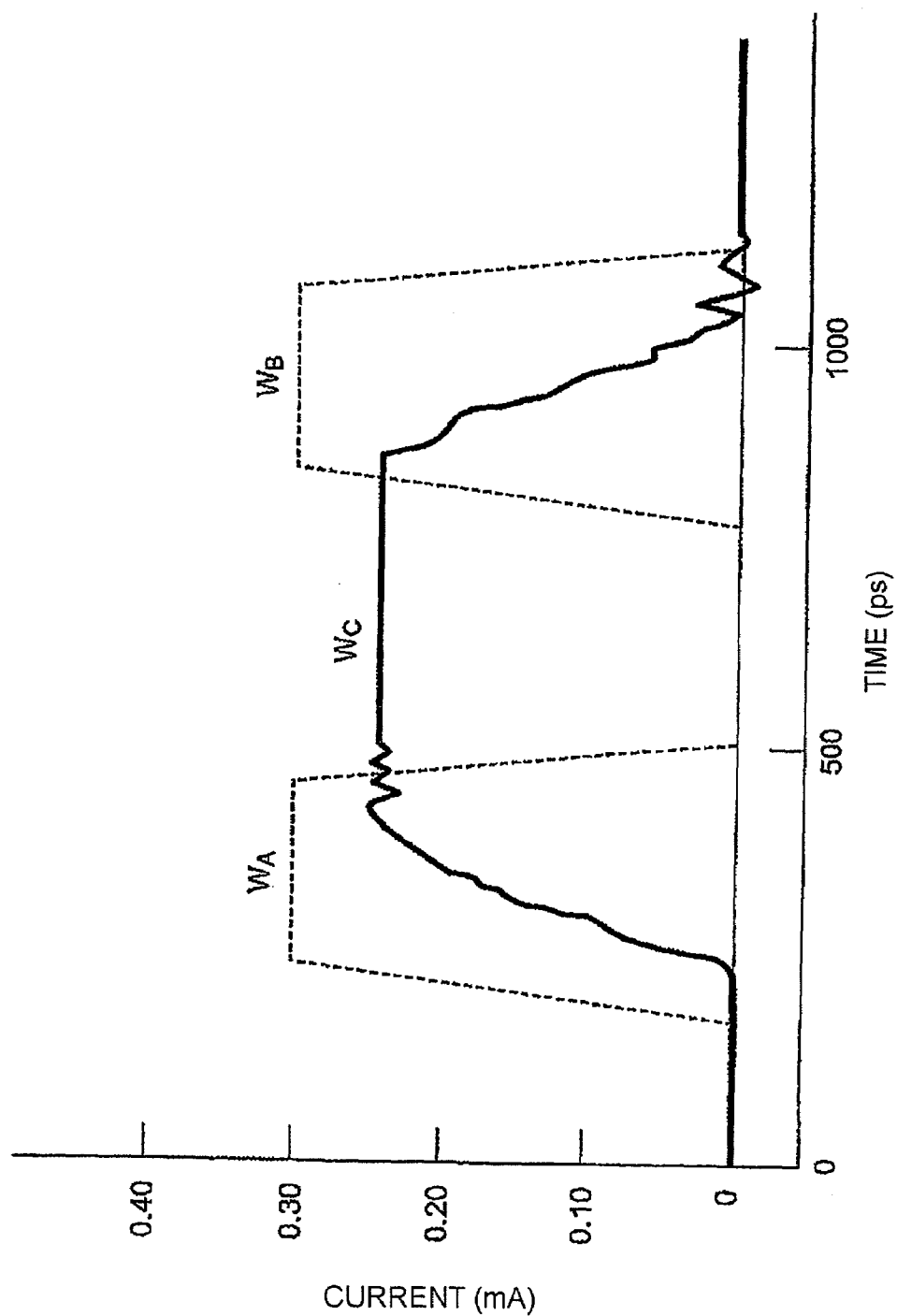
FIG. 34 is a schematic diagram of operation waveforms for explaining the conventional superconducting drive circuit.
Figure 35:
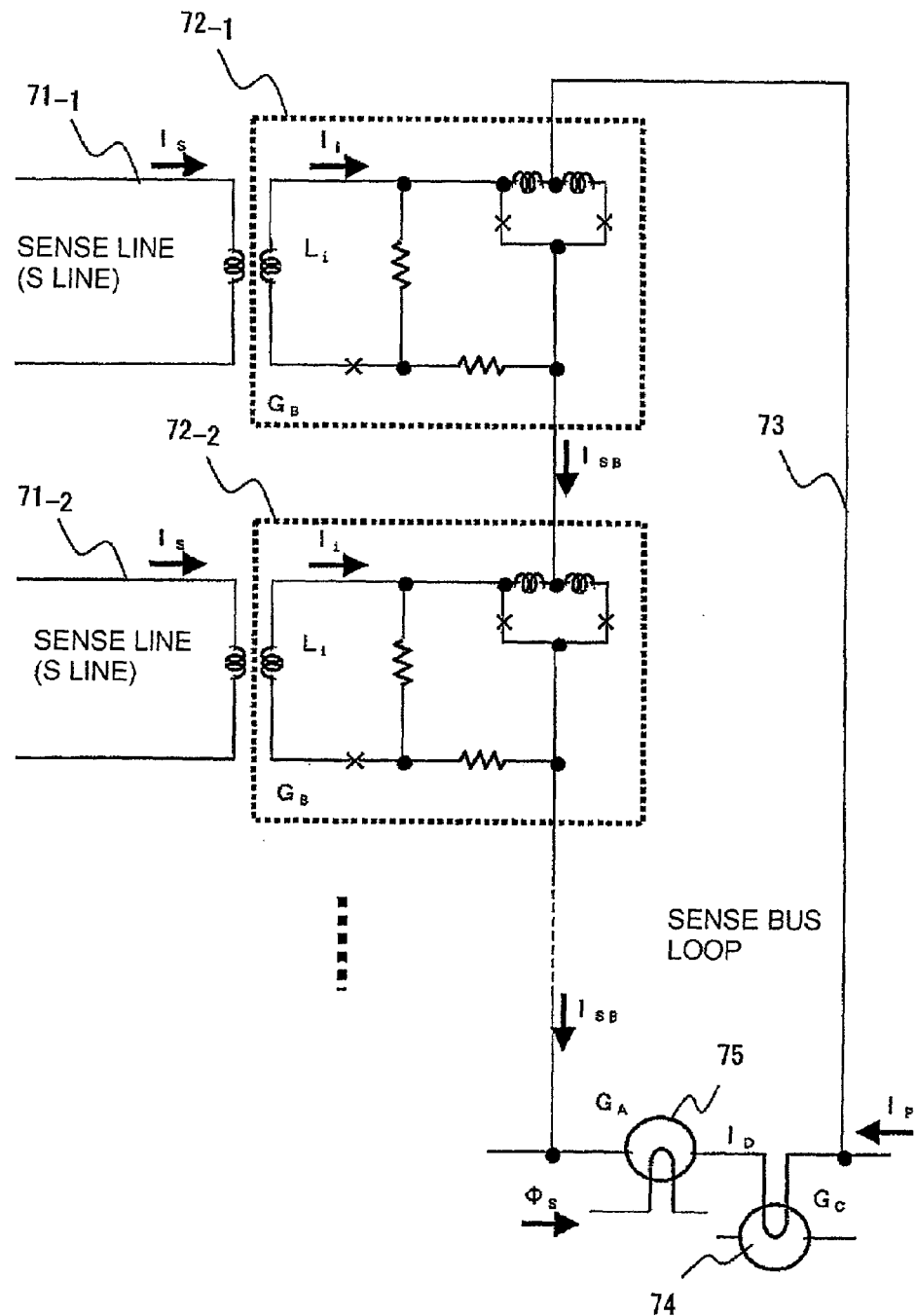
FIG. 35 is an explanatory diagram showing a conventional sense-bus superconducting sense circuit in the form of an equivalent circuit.
Figure 36:
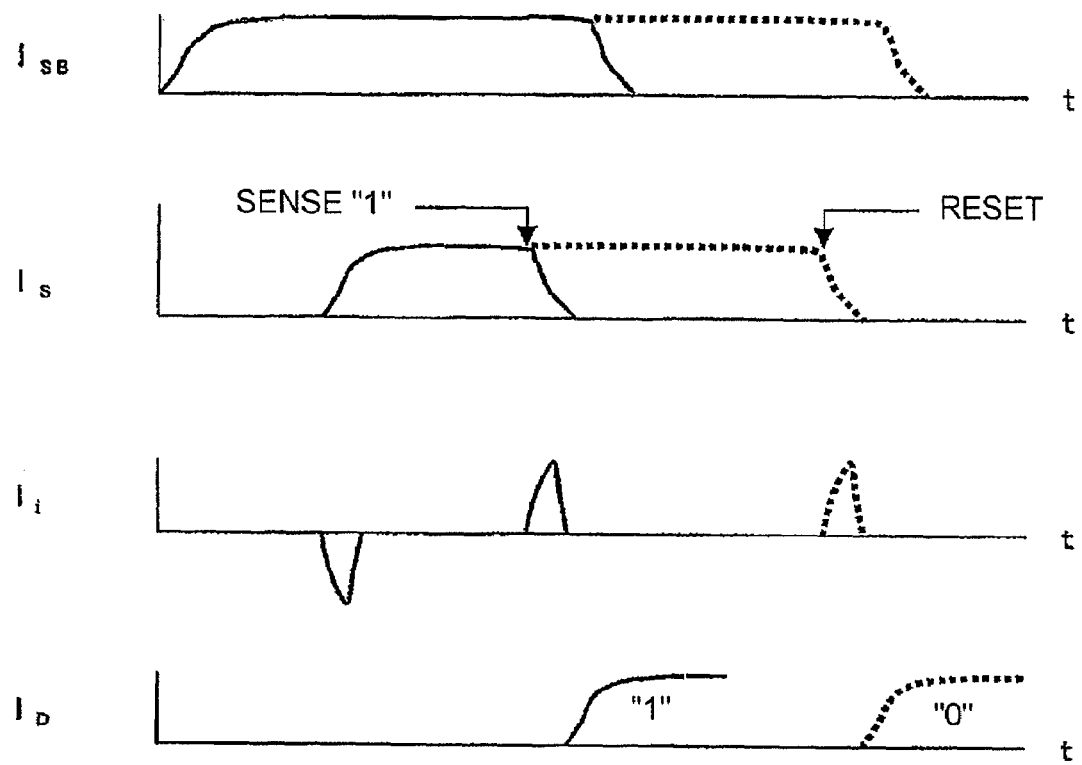
FIG. 36 is an explanatory diagram showing the operation of the circuit in FIG. 35 in terms of waveforms.
Figure 37:
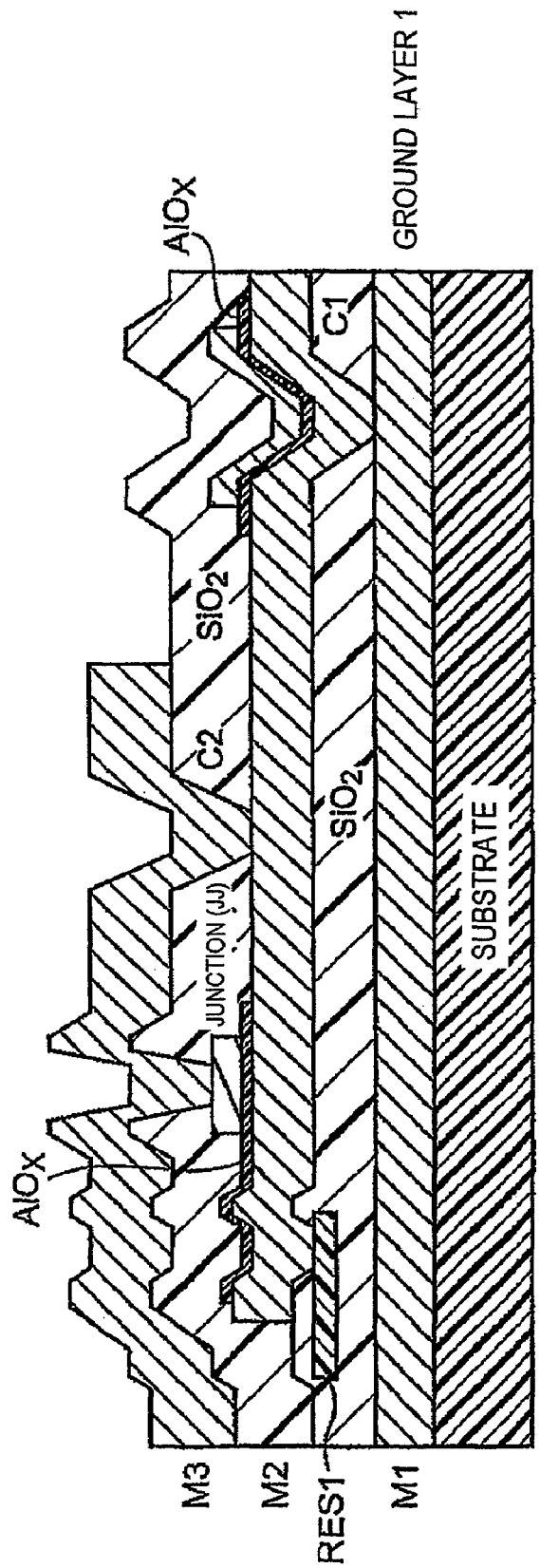
FIG. 37 is a schematic sectional view for explaining a device structure of a conventional superconducting random access memory.

FIG. 30 is a schematic sectional view showing a device structure of a superconducting RAM (sixth example) according to a twenty-fifth embodiment of this invention.

The twenty-fifth embodiment differs from the twenty-third embodiment shown in FIG. 28 in that, under the lower-part two superconducting passive transmission lines ($PTL_X$, $PTL_Y$), two superconducting passive transmission lines ($PTL_X$, $PTL_Y$) are further inserted. Since the other structure is the same as that of the twenty-third embodiment, explanation thereof is omitted.

In the structure of a large-scale superconducting RAM, it is expected that parallel signal wiring is carried out for high-speed signal propagation. This normally results in an increase in memory cell area. However, by increasing the number of superconducting passive transmission line layers as in the twenty-fifth embodiment, there is an effect that a large-scale superconducting RAM can be configured without increasing the memory cell area.

In the twenty-fifth embodiment, two superconducting passive transmission line layers are added so as to provide four superconducting passive transmission line layers in total. However, it is possible to increase the number of layers according to necessity.

INDUSTRIAL APPLICABILITY

While this invention has been described in terms of various embodiments, it is readily understood that this invention is not limited thereto and various modifications can be made within the technical scope as defined in the appended claims.

For example, in this invention, drive lines such as a word line and a bit line, and a sense line for accessing a memory cell array of a superconducting RAM are each divided into a plurality of blocks, a signal propagation circuit (DR) in each block is formed by a level-logic drive circuit and sense circuit each with high load drive capability, and, for long-distance signal propagation between the blocks, a pipeline formed by single flux quantum (SFQ) devices and capable of high-speed operation is introduced, thereby enabling the operation at ultra-high speed and low power consumption even in the large-scale superconducting RAM. However, this invention is not limited to the structure of the superconducting RAM, but is applicable to the whole range of large-scale superconducting circuits that require the operation at ultra-high speed and low power consumption.

A superconducting drive circuit of this invention is applicable to a superconducting circuit required to drive a superconducting line having a large load inductance, not limited to a word line or a bit line of a memory cell array.

A device structure of a superconducting RAM of this invention is not limited to the device structure of the superconducting RAM, but is also applicable to other SFQ circuit devices.

What is claimed is:

1. A method of configuring a word line or a bit line adapted to drive a memory cell array, said method comprising:
dividing said word line or bit line into a plurality of blocks;
using a level-logic superconducting drive circuit with high drive capability for signal propagation in each of said blocks that directly drives a memory cell; and
using a superconducting passive transmission line (PTL) for signal propagation between said plurality of blocks, said superconducting passive transmission line being capable of high-speed signal propagation using a single flux quantum (SFQ).

2. The method according to claim 1, wherein said word line or bit line is configured by connecting said superconducting passive transmission lines (PTL) in series through a splitter formed by a single flux quantum (SFQ) device.

3. The method according to claim 1, wherein said word line or bit line is configured by arranging the superconducting passive transmission lines (PTL) in a binary tree structure through a splitter formed by a single flux quantum (SFQ) device.

4. The method according to claim 2 or 3, further comprising providing at least one latch circuit midway in connection between said superconducting passive transmission lines (PTL) and, by holding information by said latch circuit, carrying out the signal propagation between the plurality of blocks in a pipeline of at least two stages, thereby enabling high-speed operation.

5. A superconducting drive circuit for use in the method according to claim 1, said superconducting drive circuit comprising a drive gate having a bias current input end, a bias current output end, a data signal input end, and a signal output end, a reset gate having a current input end, a current output end, and a reset signal input end, a first driven line formed by a superconducting stripline, and a second driven line formed by a superconducting stripline, wherein one end of said first driven line is connected to said signal output end of said drive gate, the other end of said first driven line is connected to said current input end of said reset gate, one end of said second driven line is connected to said current output end of said reset gate, and the other end of said second driven line is connected to said bias current output end of said drive gate, and wherein, in response to input of a first single flux quantum (SFQ) pulse to said data signal input end of said drive gate in the state where a direct current of a predetermined value is input to said bias current input end of said drive gate, said drive gate temporarily switches to a voltage state so that the current is injected into a loop line formed by said first driven line, said reset gate, and said second driven line, and, in response to input of a second single flux quantum (SFQ) pulse to said reset signal input end of said reset gate, the current flowing in said loop line is reduced to zero.

6. A superconducting drive circuit comprising a plurality of superconducting drive circuits each according to claim 5, wherein a bias current output end of one of the adjacent two superconducting drive circuits and a bias current input end of the other superconducting drive circuit are connected to each other through a bias resistance of a predetermined value and an inductance of a predetermined value, thereby forming a serially connected bias current line, and one end of said serially connected bias current line is connected to a DC power supply while the other end thereof is grounded.

7. A superconducting drive circuit for use in the method according to claim 1, said superconducting drive circuit comprising a drive gate having a bias current input end, a bias current output end, a data signal input end, and a signal output end, a reset gate having a current input end, a current output end, and a reset signal input end, and a driven line formed by a superconducting stripline, wherein one end of said driven line is connected to said signal output end of said drive gate, the other end of said driven line is connected to said current input end of said reset gate, said current output end of said reset gate is grounded, and said bias current output end of said drive gate is grounded, and wherein, in response to input of a first single flux quantum (SFQ) pulse to said data signal input end of said drive gate in the state where a direct current of a predetermined value is input to said bias current input end of said drive gate, said drive gate temporarily switches to a voltage state so that the current is injected into a loop line formed by said driven line and said reset gate, and, in response to input of a second single flux quantum (SFQ) pulse to said reset signal input end of said reset gate, the current flowing in said loop line is reduced to zero.

8. A superconducting drive circuit comprising a plurality of superconducting drive circuits each according to claim 7, wherein bias current input ends of said superconducting drive circuits are connected to a DC power supply each through a bias resistance of a predetermined value and an inductance of a preselected value, and bias current output ends of said superconducting drive circuits are grounded.

9. The superconducting drive circuit according to claim 5 or 7, wherein each of said drive gate and said reset gate comprises an amplifying gate (AMP) that produces at least two flux quantum in response to the input of the single flux quantum (SFQ) pulse, and a magnetic coupling quantum interference gate (SQUID) that temporarily switches to the voltage state due to the flux quantum produced by said amplifying gate (AMP).

10. The superconducting drive circuit according to claim 9, wherein said amplifying gate (AMP) comprises a Josephson junction having a McCumber coefficient of approximately 5 to 10 and said magnetic coupling quantum interference gate (SQUID) comprises a Josephson junction having a McCumber coefficient of 50 or more.

11. The superconducting drive circuit according to claim 9, wherein said magnetic coupling quantum interference gate (SQUID) is formed by a superconducting quantum interference device comprising a superconducting loop having at least two Josephson junctions and an inductance and an input signal wire disposed so as to be magnetically coupled to said superconducting loop.

12. The superconducting drive circuit according to claim 9, wherein said magnetic coupling quantum interference gate (SQUID) is formed by two or more superconducting quantum interference devices each comprising a superconducting loop having at least two Josephson junctions and an inductance and an input signal wire disposed so as to be magnetically coupled to said superconducting loop, and bias current supply ends of said superconducting quantum interference devices are connected in series.

13. The superconducting drive circuit according to claim 5 or 7, wherein each of said drive gate and said reset gate comprises an amplifying gate (AMP) that produces at least two flux quantum in response to the input of the single flux quantum (SFQ) pulse, a buffer gate (BUF) for preventing a backflow of the produced flux quantum to an input side, and a magnetic coupling quantum interference gate (SQUID) that temporarily switches to the voltage state due to the flux quantum output from said amplifying gate (AMP).

14. The superconducting drive circuit according to claim 13, wherein said amplifying gate (AMP) comprises a Josephson junction having a McCumber coefficient of approximately 5 to 10 and said magnetic coupling quantum interference gate (SQUID) comprises a Josephson junction having a McCumber coefficient of 50 or more.

15. The superconducting drive circuit according to claim 13, wherein said magnetic coupling quantum interference gate (SQUID) is formed by a superconducting quantum interference device comprising a superconducting loop having at least two Josephson junctions and an inductance and an input signal wire disposed so as to be magnetically coupled to said superconducting loop.

16. The superconducting drive circuit according to claim 13, wherein said magnetic coupling quantum interference gate (SQUID) is formed by two or more superconducting quantum interference devices each comprising a superconducting loop having at least two Josephson junctions and an inductance and an input signal wire disposed so as to be magnetically coupled to said superconducting loop, and bias current supply ends of said superconducting quantum interference devices are connected in series.

17. The superconducting drive circuit according to claim 5 or 7, wherein said superconducting stripline is a word line or a bit line that drives a memory cell array of a superconducting random access memory.

18. The superconducting drive circuit according to claim 5 or 7, further comprising a first damping resistance connected in parallel to said drive gate and a second damping resistance connected in parallel to said reset gate.

19. The superconducting drive circuit according to claim 18, wherein a value Rd of said first and second damping resistances is derived by $Rd=Z0/(1-Z0/Rj)$, where Z0 represents a characteristic impedance of said driven line and Rj an internal resistance when said drive gate and said reset gate switch to the voltage state.

20. The superconducting drive circuit according to claim 5 or 7, further comprising a resistance RL included midway in said superconducting stripline, wherein, given that an inductance of said superconducting stripline is L, a time constant L/RL is sufficiently greater than an operation period T of said superconducting drive circuit.

21. A method of configuring a sense line adapted to detect information from a memory cell array, said method comprising:
dividing said sense line into a plurality of blocks;
using a level-logic superconducting sense circuit with high drive capability for signal propagation in each of said blocks that directly detects information from a memory cell; and
using a superconducting passive transmission line (PTL) for signal propagation between the plurality of blocks, said superconducting passive transmission line being capable of high-speed signal propagation using a single flux quantum (SFQ).

22. The method according to claim 21, wherein said sense line is configured by connecting said superconducting passive transmission lines (PTL) in series through a confluence buffer formed by a single flux quantum (SFQ) device.

23. The method according to claim 21, wherein said sense line is configured by arranging said superconducting passive transmission lines (PTL) in a binary tree structure through a confluence buffer formed by a single flux quantum (SFQ) device.

24. The method according to claim 22 or 23, further comprising providing at least one latch circuit midway in connection between said superconducting passive transmission lines (PTL) and, by holding information by said latch circuit, carrying out the signal propagation between the plurality of blocks in a pipeline of at least two stages, thereby enabling high-speed operation.

25. A superconducting sense circuit for use in the method according to claim 21, said superconducting sense circuit comprising a sense line of a random access memory, a bias resistance, a load resistance, a load inductance, and an SFQ circuit which bases its operation on a single flux quantum (SFQ),
wherein one end of said sense line is grounded and its other end is connected to a first connection point, and one end of said bias resistance is connected to a direct current supply terminal and its other end is connected to said first connection point, and
wherein said load resistance and said load inductance are connected in series between said first connection point and a data signal input end of said SFQ circuit.

26. A superconducting sense circuit for use in the method according to claim 21, said superconducting sense circuit comprising a plurality of sense line information detecting portions and a single SFQ circuit which bases its operation on a single flux quantum (SFQ),
wherein each of said sense line information detecting portions comprises a sense line of a random access memory, a bias resistance, a load resistance, and a load inductance, and
wherein one end of said sense line is grounded and its other end is connected to a first connection point, one end of said bias resistance is connected to a direct current supply terminal and its other end is connected to said first connection point, said load resistance and said load inductance are connected in series between said first connection point and an output end of said sense line information detecting portion, and further, the output ends of said plurality of sense line information detecting portions are connected to a data signal input end of said SFQ circuit.

27. The superconducting sense circuit according to claim 25 or 26, wherein said SFQ circuit has the data signal input end, a clock signal input end, and a signal output end, holds information in response to input of a data signal to the data signal input end, and comprises an output portion which, in response to input of a clock signal to the clock signal input end thereafter, outputs a single flux quantum (SFQ) pulse to the signal output end depending on a value of the data signal.

28. The superconducting sense circuit according to claim 25 or 26, wherein said sense line has a structure in which a read gate of at least one of memory cells in the random access memory is connected in series.

29. The superconducting sense circuit according to claim 25 or 26, wherein all the Josephson junctions possessed by said sense line are set to operate in an underdamped state with a McCumber coefficient of 50 or more and all the Josephson junctions possessed by said SFQ circuit are set to operate in an overdamped state with a McCumber coefficient of approximately 1.

30. The superconducting sense circuit according to claim 25 or 26, wherein all the Josephson junctions possessed by said sense line and said SFQ circuit are set to operate in an overdamped state with a McCumber coefficient of approximately 1.

31. A method of configuring a superconducting random access memory, said method comprising:
configuring a word line or a bit line, adapted to drive a memory cell array, by
dividing said word line or bit line into a plurality of blocks;
using a level-logic superconducting drive circuit with high drive capability for signal propagation in each of said blocks that directly drives a memory cell; and
using a superconducting passive transmission line (PTL) for signal propagation between said plurality of blocks, said superconducting passive transmission line being capable of high-speed signal propagation using a single flux Quantum (SFQ);

configuring a sense line, adapted to detect information from said memory cell array, by dividing said sense line into a plurality of blocks;

using a level-logic superconducting sense circuit with high drive capability for signal propagation in each of said blocks that directly detects information from a memory cell; and using a superconducting passive transmission line (PTL) for signal propagation between the plurality of blocks, said superconducting passive transmission line being capable of high-speed signal propagation using a single flux quantum (SFQ); and configuring a decoder circuit by a single flux quantum (SFQ) device.

32. A device structure of a superconducting random access memory, wherein, in the method according to claim 31, said superconducting drive circuit and superconducting sense circuit used for signal propagation in each block and said memory cell array are disposed over a first superconducting ground plane, and said superconducting passive transmission line (PTL) used for signal propagation between the blocks is disposed under said first superconducting ground plane.

33. The device structure according to claim 32, wherein said memory cell array comprises a plurality of superconducting loops including Josephson junctions, a plurality of superconducting wiring layers, and a first resistance layer which are disposed over said first superconducting ground plane, and said superconducting passive transmission line (PTL) comprises a plurality of superconducting wiring layers, a plurality of superconducting ground planes, and a second resistance layer which are disposed under said first superconducting ground plane.

34. The device structure according to claim 32, wherein a plurality of superconducting passive transmission lines (PTL) of a stripline structure are formed in layers by a plurality of superconducting wiring layers and a plurality of superconducting ground planes which are disposed under said first superconducting ground plane.

35. The device structure according to claim 32, wherein a direct current is supplied to a circuit including a Josephson junction through a power supply line inductance forming layer formed by at least one of superconducting wiring layers and a second resistance layer which are disposed under said first superconducting ground plane.

36. The device structure according to claim 32, wherein a high permeability material such as Permalloy is included in an insulating layer between a plurality of superconducting wiring layers disposed over said first superconducting ground plane and in an insulating layer adjacent to a power supply line inductance forming layer disposed under said first superconducting ground plane.

37. The device structure according to claim 32, wherein a high permittivity material is included in an insulating layer between superconducting layers forming said superconducting passive transmission line (PTL).

38. The device structure according to claim 32, wherein an insulating layer adjacent to a superconducting layer forming said superconducting passive transmission line (PTL) is formed of a high permittivity material.

* * * * *